United States Patent
Kitamura et al.

(10) Patent No.: US 10,312,447 B2
(45) Date of Patent: Jun. 4, 2019

(54) ORGANIC SEMICONDUCTOR ELEMENT, MANUFACTURING METHOD THEREOF, COMPOUND, ORGANIC SEMICONDUCTOR COMPOSITION, ORGANIC SEMICONDUCTOR FILM, AND MANUFACTURING METHOD THEREOF

(71) Applicant: FUJIFILM CORPORATION, Minato-ku, Tokyo (JP)

(72) Inventors: Tetsu Kitamura, Kanagawa (JP); Yosuke Yamamoto, Kanagawa (JP); Fumiko Tamakuni, Kanagawa (JP); Yuta Shigenoi, Kanagawa (JP); Takashi Goto, Kanagawa (JP); Tetsuya Watanabe, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 50 days.

(21) Appl. No.: 15/696,194

(22) Filed: Sep. 6, 2017

(65) Prior Publication Data
US 2018/0006229 A1    Jan. 4, 2018

Related U.S. Application Data

(63) Continuation of application No. PCT/JP2016/058256, filed on Mar. 16, 2016.

(30) Foreign Application Priority Data

Mar. 16, 2015  (JP) .................. 2015-051881

(51) Int. Cl.
*H01L 51/00*    (2006.01)
*C08L 65/00*    (2006.01)
(Continued)

(52) U.S. Cl.
CPC ........ *H01L 51/0036* (2013.01); *C08G 61/126* (2013.01); *C08L 65/00* (2013.01);
(Continued)

(58) Field of Classification Search
CPC ............. H01L 51/0036; H01L 51/0043; H01L 51/0035; H01L 29/786; H01L 51/05;
(Continued)

(56) References Cited

U.S. PATENT DOCUMENTS

2010/0006154 A1    1/2010  Kitazawa et al.
2010/0233846 A1    9/2010  Ohe et al.
(Continued)

FOREIGN PATENT DOCUMENTS

EP    1932865 A2    6/2008
EP    3106484 A1    12/2016
(Continued)

OTHER PUBLICATIONS

International Search Report issued in International Application No. PCT/JP2016/058256 dated Jun. 14, 2016.
(Continued)

*Primary Examiner* — Kyoung Lee
(74) *Attorney, Agent, or Firm* — SOLARIS Intellectual Property Group, PLLC

(57) ABSTRACT

Objects of the present invention are to provide an organic semiconductor element in which carrier mobility is high, variation of mobility is suppressed, and temporal stability under high temperature and high humidity is excellent, and a manufacturing method thereof, to provide a novel compound suitable for an organic semiconductor, and to provide an organic semiconductor film in which mobility is high, variation of mobility is suppressed, and temporal stability under high temperature and high humidity is excellent, a manufacturing method thereof, and an organic semiconduc-
(Continued)

tor composition that can suitably form the organic semiconductor film.

The organic semiconductor element according to the present invention is an organic semiconductor layer containing a compound having a constitutional repeating unit represented by Formula 1 and having a molecular weight of 2,000 or greater.

$$-\!\!\!\!+\!\!D\text{-}A\!\!+\!\!\!\!- \qquad (1)$$

18 Claims, 1 Drawing Sheet

(51) Int. Cl.
 *H01L 29/786* (2006.01)
 *H01L 51/05* (2006.01)
 *C08G 61/12* (2006.01)
 *C09D 165/00* (2006.01)
(52) U.S. Cl.
 CPC .......... *C09D 165/00* (2013.01); *H01L 29/786* (2013.01); *H01L 51/0035* (2013.01); *H01L 51/0043* (2013.01); *H01L 51/05* (2013.01); *C08G 2261/124* (2013.01); *C08G 2261/1412* (2013.01); *C08G 2261/1424* (2013.01); *C08G 2261/314* (2013.01); *C08G 2261/3222* (2013.01); *C08G 2261/3223* (2013.01); *C08G 2261/3225* (2013.01); *C08G 2261/3241* (2013.01); *C08G 2261/3243* (2013.01); *C08G 2261/3245* (2013.01); *C08G 2261/3246* (2013.01); *C08G 2261/334* (2013.01); *C08G 2261/344* (2013.01); *C08G 2261/414* (2013.01); *C08G 2261/512* (2013.01); *C08G 2261/514* (2013.01); *C08G 2261/59* (2013.01); *C08G 2261/592* (2013.01); *H01L 51/0003* (2013.01); *H01L 51/052* (2013.01); *H01L 51/0545* (2013.01); *H01L 51/0566* (2013.01)
(58) Field of Classification Search
 CPC ............. H01L 51/0545; H01L 51/0003; H01L 51/052; H01L 51/0566; C08G 61/126; C08G 2261/3241; C08G 2261/344; C08G 2261/512; C08G 2261/124; C08G 2261/1412; C08G 2261/1424; C08G 2261/3245; C08G 2261/3222; C08G 2261/3223; C08G 2261/3225; C08G 2261/334; C08G 2261/3243; C08G 2261/3246; C08G 2261/414; C08G 2261/514; C08G 2261/59; C08G 2261/592; C08G 2261/314; C09D 165/00; C08L 65/00
 See application file for complete search history.

(56) References Cited

U.S. PATENT DOCUMENTS

| | | | |
|---|---|---|---|
| 2011/0004004 | A1* | 1/2011 | Hao ............... C07D 487/04 548/453 |
| 2011/0121273 | A1 | 5/2011 | Jo et al. |
| 2017/0069845 | A1 | 3/2017 | Wakamiya et al. |

FOREIGN PATENT DOCUMENTS

| | | |
|---|---|---|
| JP | 2007-335840 A | 12/2007 |
| JP | 2008-153667 A | 7/2008 |
| JP | 2009-177136 A | 8/2009 |
| JP | 2010-527327 A | 8/2010 |
| JP | 2015-38955 A | 2/2015 |
| KR | 2014-0077850 A | 6/2014 |
| WO | 2008/044585 A1 | 4/2008 |
| WO | 2009/139339 A1 | 11/2009 |
| WO | 2015/029910 A1 | 3/2015 |
| WO | 2015/122321 A2 | 8/2015 |

OTHER PUBLICATIONS

Written Opinion of the ISA issued in International Application No. PCT/JP2016/058256 dated Jun. 14, 2016.
Extended European Search Report dated Mar. 26, 2018, issued in corresponding EP Patent Application No. 16764998.7.

\* cited by examiner

ORGANIC SEMICONDUCTOR ELEMENT, MANUFACTURING METHOD THEREOF, COMPOUND, ORGANIC SEMICONDUCTOR COMPOSITION, ORGANIC SEMICONDUCTOR FILM, AND MANUFACTURING METHOD THEREOF

CROSS-REFERENCE TO RELATED APPLICATION

This application is a continuation application of International Application No. PCT/JP2016/058256, filed Mar. 16, 2016, the disclosure of which is incorporated herein by reference in its entirety. Further, this application claims priority from Japanese Patent Application No. 2015-051881, filed Mar. 16, 2015, the disclosure of which is incorporated herein by reference in its entirety.

BACKGROUND OF THE INVENTION

1. Field of the Invention

The present invention relates to an organic semiconductor element, a manufacturing method thereof, a compound, an organic semiconductor composition, an organic semiconductor film, and a manufacturing method thereof.

2. Description of the Related Art

An organic transistor having an organic semiconductor film (organic semiconductor layer) is used in a field effect transistor (FET) used in a liquid crystal display or an organic electroluminescence (EL) display, Radio Frequency Identifier (RFID, RF tag), and the like, because lightening of weight, cost reduction, and flexibilization can be achieved.

As the organic semiconductor in the related art, those disclosed in JP2010-527327A and JP2008-153667A are known.

SUMMARY OF THE INVENTION

An object to be achieved by the present invention is to provide an organic semiconductor element in which carrier mobility (hereinafter, referred to as "mobility", and the fact that carrier mobility is high is referred to as "high mobility") is high, variation of mobility is suppressed, and temporal stability under high temperature and high humidity is excellent, and a manufacturing method thereof.

Another object to be achieved by the present invention is to provide a novel compound which is suitable for an organic semiconductor.

Still another object to be achieved by the present invention is to provide an organic semiconductor film in which carrier mobility is high, variation of mobility is suppressed, and temporal stability under high temperature and high humidity is excellent, a manufacturing method thereof, and an organic semiconductor composition that can suitably form the organic semiconductor film.

The object of the present invention is solved by the means described in <1>, <9>, <13>, <15>, or <17> to <20> below. <2> to <8>, <10> to <12>, <14>, and <16> which are preferable embodiments are also described below.

<1> An organic semiconductor element comprising:
an organic semiconductor layer containing a compound having a constitutional repeating unit represented by Formula 1 and having a molecular weight of 2,000 or greater,

(1)

in Formula 1, A represents an electron acceptor unit including a partial structure having at least one of a sp2 nitrogen atom, a carbonyl group, or a thiocarbonyl group in a ring structure, D represents an electron donor unit including a divalent aromatic heterocyclic group having at least one of an N atom, an O atom, an S atom, or an Se atom in a ring structure, or a divalent aromatic hydrocarbon group consisting of a fused ring structure having two or more rings as a partial structure, and D and/or A has at least one monovalent group represented by Formula 1-1,

*-L-O-R  (1-1)

in Formula 1-1, L represents a linear or branched alkylene group having m carbon atoms, R represents an alkyl group not having a substituent and having n carbon atoms, $6 \leq m+n \leq 50$, and * represents a bonding site to another structure.

<2> The organic semiconductor element according to <1>,
in which a monovalent group represented by Formula 1-1 is a monovalent group represented by Formula 1-2 or 1-3,

in Formulae 1-2, 1-3, m represents an integer of 1 or greater, R represents an alkyl group not having a substituent and having n carbon atoms, $R_a$ represents an alkyl group not having a substituent and having a carbon atoms, $R_b$ represents an alkyl group not having a substituent and having b carbon atoms, $6 \leq m+n \leq 50$ or $6 \leq m+a+b \leq 50$, and * represents a bonding site to another structure.

<3> The organic semiconductor element according to <1> or <2>, in which, in Formula 1, A has at least one structure selected from the group consisting of structures represented by Formulae A-1 to A-12, as a partial structure,

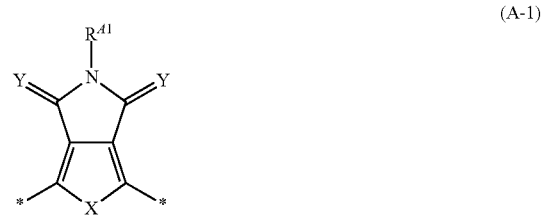

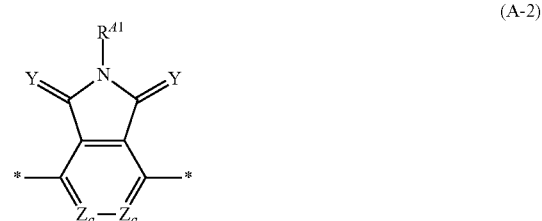

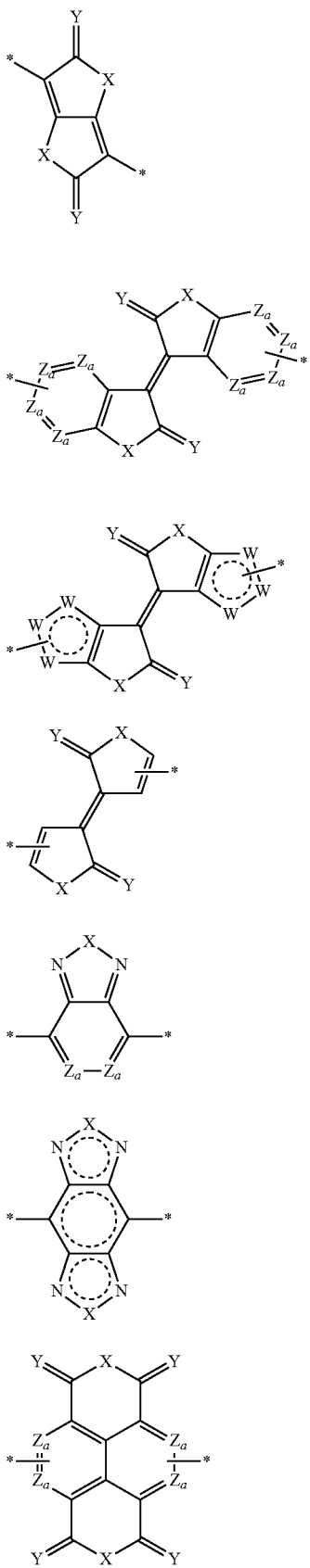

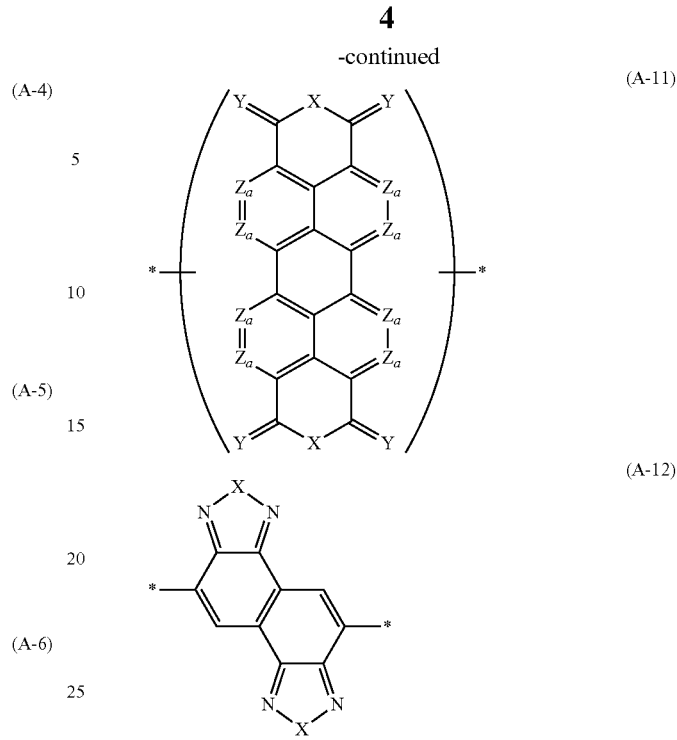

in Formulae A-1 to A-12, X's each independently represent an O atom, a S atom, a Se atom or NR$^{A1}$, Y's each independently represent an O atom or a S atom, $Z_a$'s each independently represent CR$^{A2}$ or a N atom, W's each independently represent C(R$^{A2}$)$_2$, NR$^{A1}$, a N atom, CR$^{A2}$, an O atom, a S atom, or a Se atom, R$^{A1}$'s each independently represent an alkyl group, a monovalent group represented by Formula 1-1, or a bonding site to another structure, R$^{A2}$'s each independently represent a hydrogen atom, a halogen atom, an alkyl group, or a bonding site to another structure, and *'s each independently represent a bonding site to another structure.

<4> The organic semiconductor element according to any one of <1> to <3>, in which, in Formula 1, D represents a structure represented by Formula D-1,

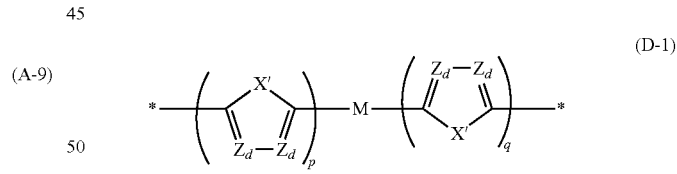

in Formula D-1, X's each independently represent an O atom, a S atom, a Se atom, or NR$^{D1}$, $Z_d$'s each independently represent a N atom or CR$^{D2}$, R$^{D1}$'s each independently represent a monovalent organic group, R$^{D2}$'s each independently represent a hydrogen atom or a monovalent organic group, M represents a single bond, a divalent aromatic heterocyclic group, a divalent aromatic hydrocarbon group, an alkenylene group, an alkynylene group, or a divalent group obtained by combining these, p and q each independently represent an integer of 0 to 4, and *'s each independently represent a bonding site to another structure.

<5> The organic semiconductor element according to any one of <1> to <4>, in which a constitutional repeating unit represented by Formula 1 is a constitutional repeating unit represented by any one of Formulae 2 to 5,

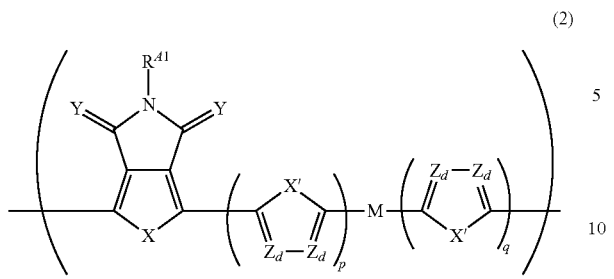
(2)

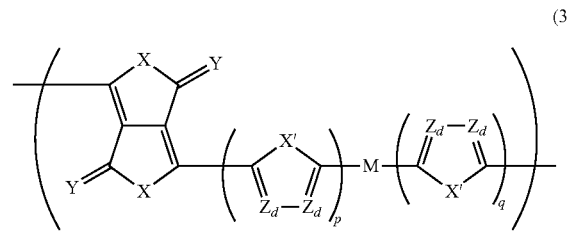
(3)

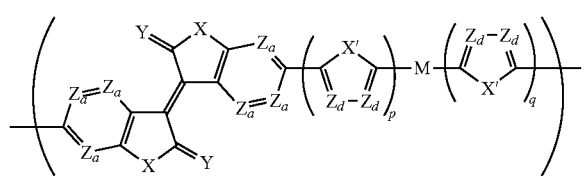
(4)

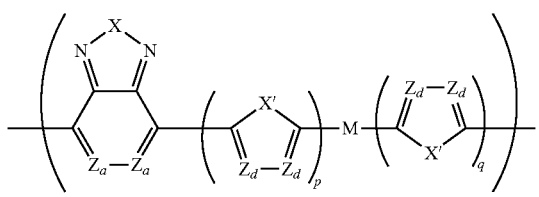
(5)

in Formulae 2 to 5, X's each independently represent an O atom, a S atom, a Se atom or NR$^{A1}$, Y's each independently represent an O atom or a S atom, Z$_a$'s each independently represent CR$^{A2}$ or a N atom, R$^{A1}$'s each independently represent an alkyl group, a monovalent group represented by Formula 1-1, or a bonding site to another structure, R$^{A2}$'s each independently represent a hydrogen atom, a halogen atom, an alkyl group, or a bonding site to another structure, X"s each independently represent an O atom, a S atom, a Se atom, or NR$^{D1}$, Z$_d$'s each independently represent a N atom or CR$^{D2}$, R$^{D1}$'s each independently represent a monovalent organic group, R$^{D2}$'s each independently represent a hydrogen atom or a monovalent organic group, M represents a single bond, a divalent aromatic heterocyclic group, a divalent aromatic hydrocarbon group, an alkenylene group, an alkynylene group, or a divalent group obtained by combining these, and p and q each independently represent an integer of 0 to 4.

<6> The organic semiconductor element according to any one of <1> to <5>, in which the organic semiconductor layer further contains an insulating polymer including a constitutional unit represented by Formula I-1,

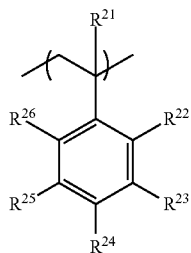
Formula I-1 in Formula I-1, R$^{22}$ to R$^{26}$ each independently represent a hydrogen atom, a hydroxy group, an alkyl group, an alkoxy group, an alkenyl group, an alkynyl group, an aryl group, an aralkyl group, or a halogen atom or may form a ring by linking two of R$^{22}$ to R$^{26}$ that are adjacent to each other, and R$^{21}$ represents a hydrogen atom or an alkyl group.

<7> The organic semiconductor element according to <6>, further comprising: a gate insulating film having a surface energy of 50 to 75 mNm$^{-1}$.

<8> The organic semiconductor element according to any one of <1> to <7>, that is an organic thin film transistor.

<9> A compound comprising: a constitutional repeating unit represented by Formula 1, in which a molecular weight is 2,000 or greater, $$\text{---(D-A)---} \quad (1)$$

in Formula 1, A represents an electron acceptor unit having at least one structure selected from the group consisting of structures represented by Formulae A-1 to A-12, as a partial structure, D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure, and D and/or A has at least one monovalent group represented by Formula 1-1,

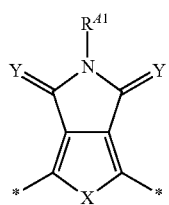
(A-1)

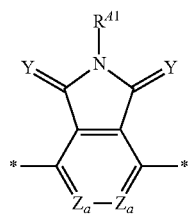
(A-2)

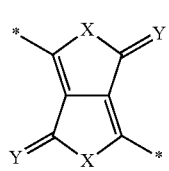
(A-3)

-continued (A-4)

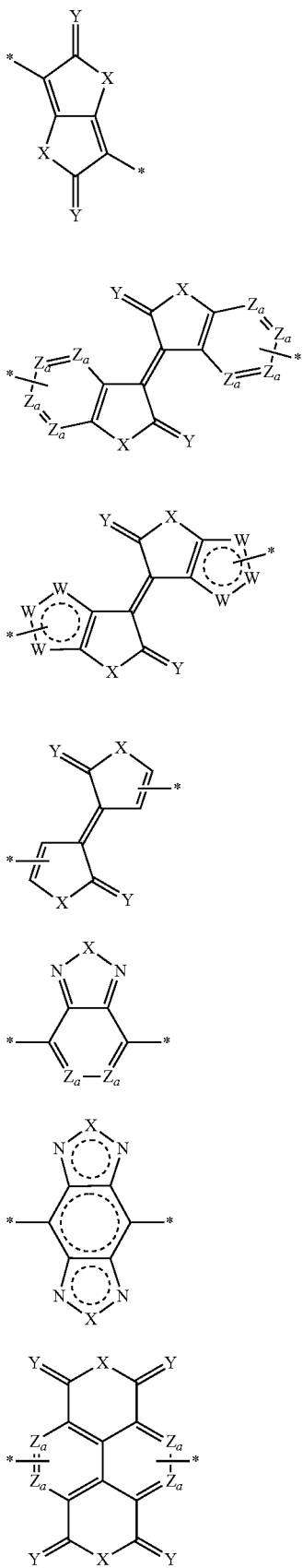

(A-5)

(A-6)

(A-7)

(A-8)

(A-9)

(A-10)

-continued (A-11)

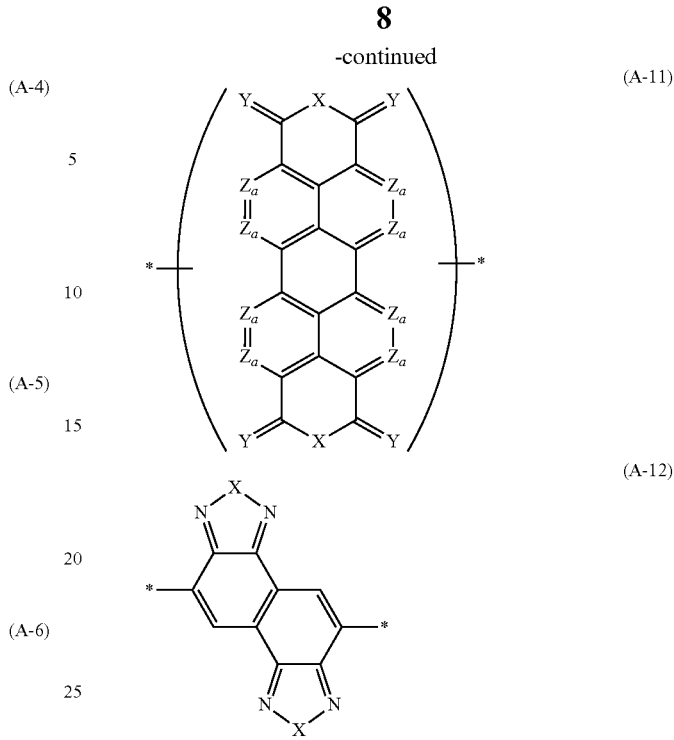

(A-12)

in Formulae A-1 to A-12, X's each independently represent an O atom, a S atom, a Se atom, or $NR^{41}$, Y's each independently represent an O atom or a S atom, $Z_a$'s each independently represent $CR^{42}$ or a N atom, W's each independently represent $C(R^{42})_2$, $NR^{41}$, a N atom, $CR^{42}$, an O atom, a S atom, or a Se atom, $R^{41}$'s each independently represent an alkyl group, a monovalent group represented by Formula 1-1, or a bonding site to another structure, $R^{42}$'s each independently represent a hydrogen atom, a halogen atom, an alkyl group, or a bonding site to another structure, and *'s each independently represent a bonding site to another structure, $$*\text{-L-O-R} \quad (1\text{-}1)$$

in Formula 1-1, L is a linear or branched alkylene group having m carbon atoms, R is an alkyl group not having a substituent and having n carbon atoms, 6≤m+n≤50, and * represents a bonding site to another structure.

<10> The compound according to <9>, in which, in Formula 1, D is a structure represented by Formula D-1,

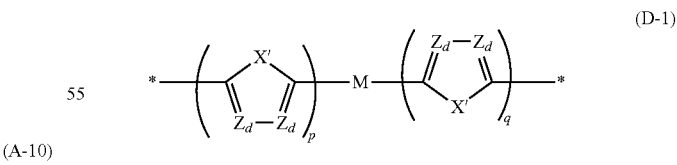

in Formula D-1, X"s each independently represent an O atom, a S atom, a Se atom, or $NR^{D1}$, $Z_d$'s each independently represent a N atom or $CR^{D2}$, $R^{D1}$'s each independently represent a monovalent organic group, $R^{D2}$'s each independently represent a hydrogen atom or a monovalent organic group, M represents a single bond, a divalent aromatic heterocyclic group, a divalent aromatic hydrocarbon group, an alkenylene group, an alkynylene group, or a divalent group obtained by combining these, p and q each independently represent an integer of 0 to 4, and *'s each independently represent a bonding site to another structure.

<11> The compound according to <9> or <10>, in which the constitutional repeating unit represented by Formula 1 is a constitutional repeating unit represented by any one of Formulae 2 to 5,

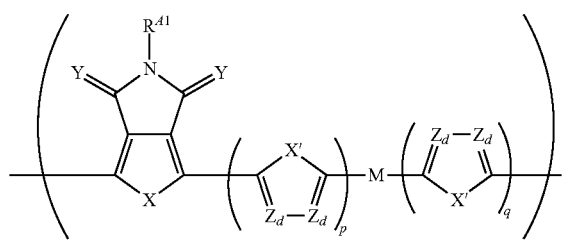

(2)

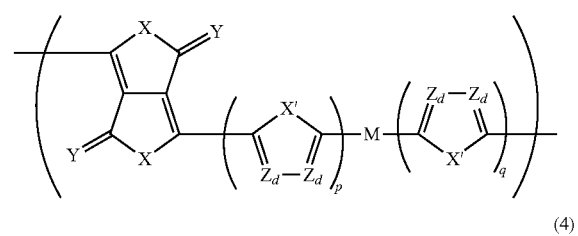

(3)

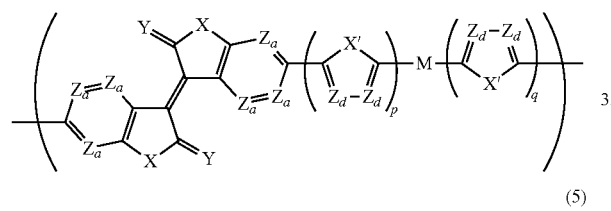

(4)

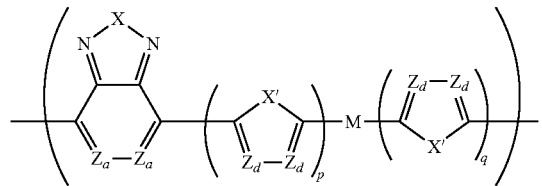

(5)

in Formulae 2 to 5, X's each independently represent an O atom, a S atom, a Se atom or $NR^{41}$, Y's each independently represent an O atom or a S atom, $Z_a$'s each independently represent $CR^{42}$ or a N atom, $R^{41}$'s each independently represent an alkyl group, a monovalent group represented by Formula 1-1, or a bonding site to another structure, $R^{42}$'s each independently represent a hydrogen atom, a halogen atom, an alkyl group, or a bonding site to another structure, X"s each independently represent an O atom, a S atom, a Se atom, or $NR^{D1}$, $Z_d$'s each independently represent an N atom or $CR^{D2}$, $R^{D1}$'s each independently represent a monovalent organic group, $R^{D2}$'s each independently represent a hydrogen atom or a monovalent organic group, M represents a single bond, a divalent aromatic heterocyclic group, a divalent aromatic hydrocarbon group, an alkenylene group, an alkynylene group, or a divalent group obtained by combining these, and p and q each independently represent an integer of 0 to 4.

<12> The compound according to any one of <9> to <11>, that is an organic semiconductor compound.

<13> An organic semiconductor composition comprising: a compound having a constitutional repeating unit represented by Formula 1 and having a molecular weight of 2,000 or greater; and a solvent, $$\text{-(D-A)-} \quad (1)$$

in Formula 1, A represents an electron acceptor unit including a partial structure having at least one of a sp2 nitrogen atom, a carbonyl group, or a thiocarbonyl group, in a ring structure, D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings as a partial structure, and D and/or A has at least one monovalent group represented by Formula 1-1, $$\text{*-L-O-R} \quad (1\text{-}1)$$

in Formula 1-1, L represents a linear or branched alkylene group having m carbon atoms, R represents an alkyl group not having a substituent and having n carbon atoms, $6 \leq m+n \leq 50$, and * represents a bonding site to another structure.

<14> The organic semiconductor composition according to <13>, further comprising: an insulating polymer including a constitutional unit represented by Formula I-1,

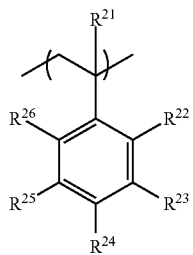

Formula I-1 in Formula I-1, $R^{22}$ to $R^{26}$ each independently represent a hydrogen atom, a hydroxy group, an alkyl group, an alkoxy group, an alkenyl group, an alkynyl group, an aryl group, an aralkyl group, or a halogen atom and may form a ring by linking two of $R^{22}$ to $R^{26}$ that are adjacent to each other, and $R^{21}$ represents a hydrogen atom or an alkyl group.

<15> An organic semiconductor film comprising: a compound having a constitutional repeating unit represented by Formula 1 and having a molecular weight of 2,000 or greater, $$\text{-(D-A)-} \quad (1)$$

in Formula 1, A represents an electron acceptor unit including a partial structure having at least one of a sp2 nitrogen atom, a carbonyl group, or a thiocarbonyl group in a ring structure, D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings as a partial structure, and D and/or A has at least one monovalent group represented by Formula 1-1, $$\text{*-L-O-R} \quad (1\text{-}1)$$

in Formula 1-1, L represents a linear or branched alkylene group having m carbon atoms, R represents an alkyl group not having a substituent and having n carbon atoms, $6 \leq m+n \leq 50$, and * represents a bonding site to another structure.

<16> The organic semiconductor film according to <15>, further comprising an insulating polymer including a constitutional unit represented by Formula I-1,

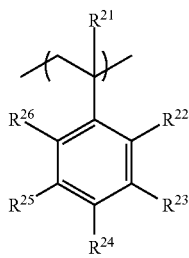

Formula I-1 in Formula I-1, $R^{22}$ to $R^{26}$ each independently represent a hydrogen atom, a hydroxy group, an alkyl group, an alkoxy group, an alkenyl group, an alkynyl group, an aryl group, an aralkyl group, or a halogen atom, and may form a ring by linking two of $R^{22}$ to $R^{26}$ that are adjacent to each other, and $R^{21}$ represents a hydrogen atom or an alkyl group.

<17> A method of manufacturing an organic semiconductor film, comprising: a coating step of coating a substrate with the organic semiconductor composition according to <13> or <14>.

<18> A method of manufacturing an organic semiconductor film, comprising: a coating step of coating a gate insulating film having a surface energy of 50 to 75 mNm$^{-1}$ with the organic semiconductor composition according to <14>.

<19> A method of manufacturing an organic semiconductor element, comprising: a coating step of coating a substrate with the organic semiconductor composition according to <13> or <14>.

<20> A method of manufacturing an organic semiconductor element, comprising: a coating step of coating a gate insulating film having a surface energy of 50 to 75 mNm$^{-1}$ with the organic semiconductor composition according to <14>.

According to the present invention, it is possible to provide an organic semiconductor element in which mobility is high, variation of mobility is suppressed, and temporal stability under high temperature and high humidity is excellent, and a manufacturing method thereof.

According to the present invention, it is possible to provide a novel compound suitable for an organic semiconductor.

According to the present invention, it is possible to provide an organic semiconductor film in which carrier mobility is high, variation of mobility is suppressed, and temporal stability under high temperature and high humidity is excellent, a manufacturing method thereof, and an organic semiconductor composition that can suitably form the organic semiconductor film.

DESCRIPTION OF THE PREFERRED EMBODIMENTS

Figure 1:
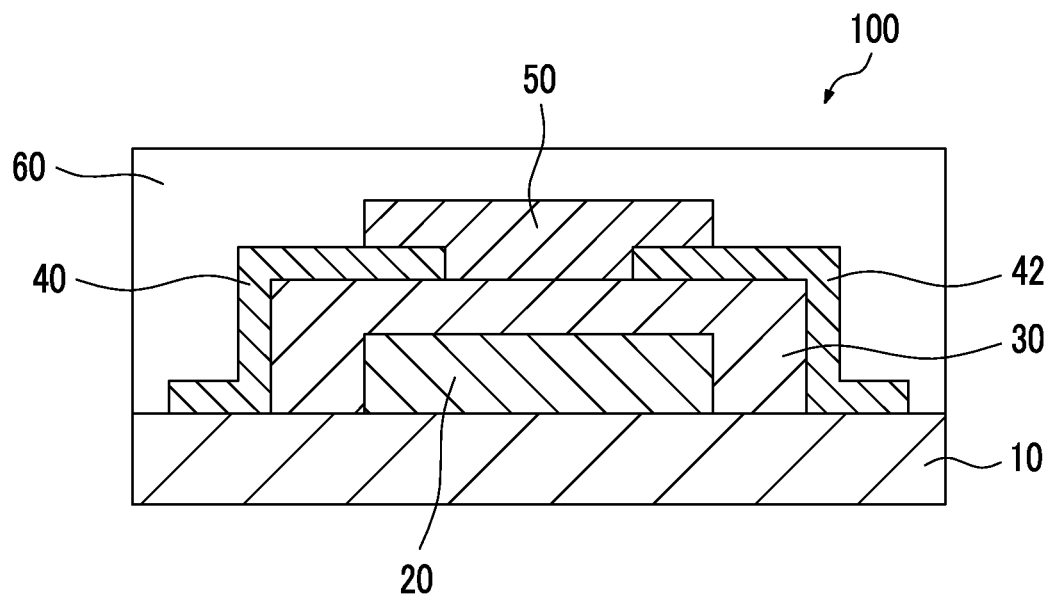
FIG. 1 is a schematic cross-sectional view of an aspect of an organic semiconductor element of the present invention.

Hereinafter, the contents of the present invention will be specifically described. The constituents in the following description will be explained based on typical embodiments of the present invention, but the present invention is not limited to the embodiments. In the specification of the present application, "to" is used to mean that the numerical values listed before and after "to" are a lower limit and an upper limit respectively.

In the present specification, in a case where there is no description regarding whether a group (atomic group) is substituted or unsubstituted, the group includes both of a group having a substituent and a group not having a substituent. For example, an "alkyl group" includes not only an alkyl group not having a substituent (unsubstituted alkyl group) but also an alkyl group having a substituent (substituted alkyl group).

In the present specification, in some cases, a chemical structural formula is described as a simplified structural formula in which a hydrogen atom is omitted.

In the present invention, "mass %" and "weight %" have the same definition, and "part by mass" and "part by weight" have the same definition.

In the present invention, a combination of two or more preferred aspects is a more preferable aspect.

(Organic Semiconductor Element)

The organic semiconductor element according to the present invention has an organic semiconductor layer containing a compound (hereinafter, referred to as a "specific compound") having a constitutional repeating unit represented by Formula 1 and having a molecular weight of 2,000 or greater.

The present inventors have found that, in the organic semiconductor element according to the present invention, carrier mobility is high, variation of mobility is suppressed, and temporal stability under high temperature and high humidity is excellent.

Details of the mechanism that can obtain the above effects are not clear, but it is assumed that the effects are obtained by the following reasons.

A polymer compound represented by Formula 1 is a donor-acceptor-type (also referred to as "D-A-type") polymer having a main-chain skeleton formed from an electron donor unit and an acceptor unit. Such a D-A-type polymer is a structure that can be easily polarized between a donor unit and an acceptor unit in a molecule, and it is considered that carrier conduction in a molecule is advantageous. Interaction (intermolecular force) between a donor unit and an acceptor unit easily works in the molecule, it is considered that there is an effect in which an intermolecular distance is reduced, and it is considered that it is advantageous for carrier conduction between the molecules. As a result, it is considered that the D-A-type polymer is advantageous in carrier mobility. It is known that the film quality (also referred to as "morphology") after coating with the polymer also has an influence on the mobility, and thus it is considered that a uniform film having less unevenness is desirable, not a film having considerable unevenness.

If at least one monovalent group represented by Formula 1-1 is included in the D-A-type polymer of Formula 1, it is assumed that a degree of freedom of steric conformation in a solution state increases, solubility of the polymer can be increased, and thus a dense and uniform film having little unevenness can be formed. In the solid state, it is assumed that intermolecular interaction or intermolecular variation is hardly deteriorated, and necessary film qualities necessary for high mobility can be maintained. As a result, it is considered that mobility is high, variation of mobility is suppressed, temporal stability under high temperature and high humidity is excellent.

The specific compound is preferably an organic semiconductor compound.

The organic semiconductor element according to the present invention is preferably an organic thin film transistor.

$$-(D-A)- \quad (1)$$

In Formula 1, A represents an electron acceptor unit including a partial structure having at least one of a sp2 nitrogen atom, a carbonyl group, or a thiocarbonyl group in a ring structure, D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings as a partial structure, and D and/or A has at least one monovalent group represented by Formula 1-1.

The electron acceptor unit refers to a constitutional unit having electron acceptability and examples thereof include a π electron-deficient heterocyclic unit such as phthalimide.

The electron donor unit refers to a constitutional unit having electron donating properties, and examples thereof include a π electron-rich heterocyclic unit such as thiophene.

$$*-L-O-R \quad (1-1)$$

In Formula 1-1, L represents a linear or branched alkylene group having m carbon atoms, R represents an alkyl group not having a substituent and having n carbon atoms, $6 \leq m+n \leq 50$, and * represents a bonding site to another structure.

<Compound Having Constitutional Repeating Unit Represented by Formula 1>

The organic semiconductor element according to the present invention has an organic semiconductor layer containing a specific compound.

[Electron Acceptor Unit]

In Formula 1, A represents an electron acceptor unit including a partial structure having at least one of a sp2 nitrogen atom, a carbonyl group, or a thiocarbonyl group in a ring structure.

A preferably has at least one structure selected from the group consisting of structures represented by Formulae A-1 to A-12 as a partial structure, and A is more preferably a structure represented by at least one selected from the group consisting of Formulae A-1 to A-12.

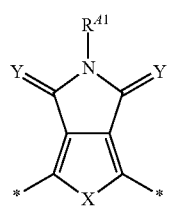
(A-1)

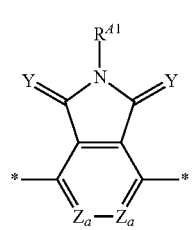
(A-2)

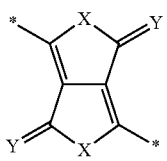
(A-3)

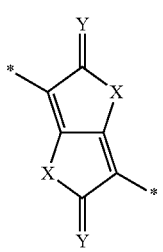
(A-4)

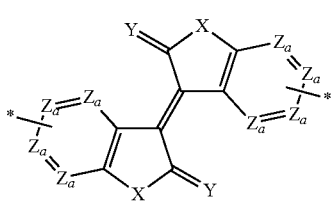
(A-5)

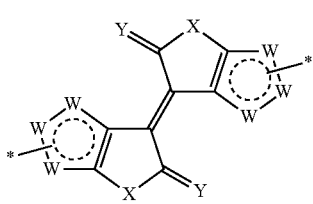
(A-6)

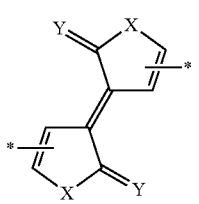
(A-7)

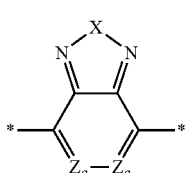
(A-8)

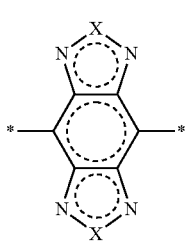
(A-9)

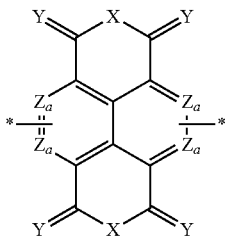
(A-10)

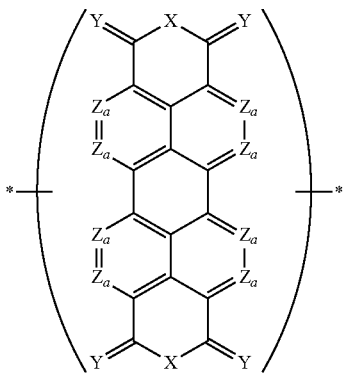
(A-11)

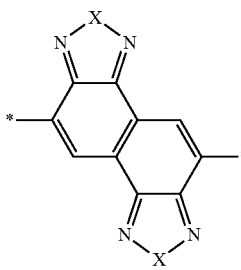
(A-12)

In Formulae A-1 to A-12, X's each independently represent an O atom, a S atom, a Se atom, or $NR^{A1}$, Y's each independently represent an O atom or a S atom, $Z_a$'s each independently represent $CR^{A2}$ or a N atom, W's each independently represent $C(R^{A2})_2$, $NR^{A1}$, a N atom, $CR^{A2}$, an O atom, a S atom, or a Se atom, $R^{A1}$'s each independently represent an alkyl group, a monovalent group represented by Formula 1-1, or a bonding site to another structure, $R^{A2}$'s each independently represent a hydrogen atom, a halogen atom, an alkyl group, or a bonding site to another structure, *'s each independently represent a bonding site to another structure.

In Formulae A-5 and A-10, in each of the two ring structures including $Z_a$, one of $Z_a$'s is $CR^{A2}$, and $R^{A2}$ represents a bonding site to another structure. This bonding site to another structure corresponds to * in the formula. Specifically, a bonding hand (hereinafter, simply referred to as a "bonding hand") in which * that represents a bonding position to another structure is positioned at a tip stretches from any one of Za's in each formula, and Za to which this bonding hand stretches is $CR^{A2}$ and corresponds to an aspect in which $R^{A2}$ represents a bonding site to another structure.

In Formula A-11, two $Z_a$'s are $CR^{A2}$, and $R^{A2}$ represents a bonding site to another structure. This bonding site to another structure corresponds to * in the formula.

In Formula A-6, in each of the two ring structures including W's, one of W's represents at least one of the three following aspects.

Aspect 1: W represents $CR^{A2}$, and $R^{A2}$ represents a bonding site to another structure.

Aspect 2: W represents $NR^{A1}$, and $R^{A1}$ represents a bonding site to another structure.

Aspect 3: W represents $C(R^{A2})_2$, and one of $R^{A2}$'s represents a bonding site to another structure.

In Formulae A-1 to A-12, X's each independently represent an O atom, a S atom, a Se atom, or $NR^{A1}$, and $NR^{A1}$ is preferable.

Y's each independently represent an O atom or a S atom, and an O atom is preferable.

$Z_a$'s each independently represent $CR^{A2}$ or a N atom, and $CR^{A2}$ is preferable.

W's each independently represent $C(R^{A2})_2$, $NR^{A1}$, a N atom, $CR^{A2}$, an O atom, a S atom, or a Se atom, and $C(R^{A2})_2$, $CR^{A2}$, or a S atom is preferable.

$R^{A1}$'s each independently represent an alkyl group, a monovalent group represented by Formula 1-1, or a bonding site to another structure, and a monovalent group represented by Formula 1-1 is preferable.

In a case where $R^{A1}$ represents an alkyl group, an alkyl group having 2 to 30 carbon atoms is preferable, and an alkyl group having 8 to 25 carbon atoms is more preferable. The alkyl group may have a linear shape or a branched shape.

The bonding site to another structure in $R^{A1}$ is a bonding site to another structure represented by * in Formulae A-1 to A-12.

$R^{A2}$'s each independently represent an alkyl group, a hydrogen atom, a halogen atom, or a bonding site to another structure, and a hydrogen atom or a bonding site to another structure is preferable.

In a case where $R^{A2}$ represents an alkyl group, an alkyl group having 2 to 30 carbon atoms is preferable, and an alkyl group having 8 to 25 carbon atoms is more preferable. The alkyl group may have a linear shape or a branched shape.

In a case where $R^{A2}$ represents a halogen atom, a F atom, a Cl atom, a Br atom, or an I atom is preferable, and a F atom is more preferable.

A bonding site to another structure in $R^{A2}$ is a bonding site to another structure represented by * in Formulae A-1 to A-12.

With respect to the specific compound, A in Formula 1 preferably has at least one structure selected from the group consisting of structures represented by Formulae A-1 to A-12 as a partial structure, more preferably has at least one structure selected from the group consisting of structures represented by Formulae A-1 to A to 6, A-8 to A-10, and A-12, as a partial structure, even more preferably has at least one structure selected from the group consisting of structures represented by Formulae A-1, A-3, A-5, and A-8, as a partial structure, particularly preferably has at least one structure selected from the group consisting of structures represented by Formulae A-1, A-3, and A-5, as a partial structure, and most preferably has at least one structure selected from the group consisting of structures represented by Formulae A-1 and A-3, as a partial structure.

The specific compound is preferably an aspect in which A in Formula 1 is a structure represented by each formula to an aspect in which A in Formula 1 is a structure represented by each formula, as a partial structure.

An example in which a structure represented by Formulae A-1 to A-12 is provided below, but the present invention is not limited thereto. In the structural formulae, $R^{A1}$ has the same meaning as $R^{A1}$ in Formulae A-1 to A-12, and preferable aspects are also the same.

* represents a bonding site to another structure.

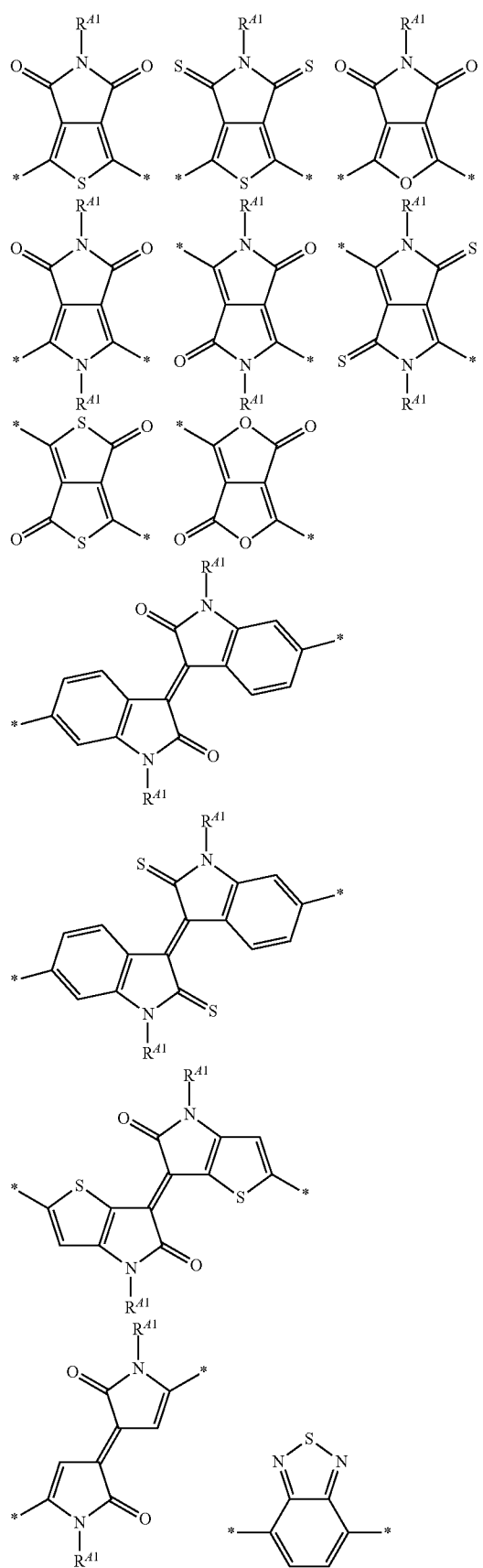

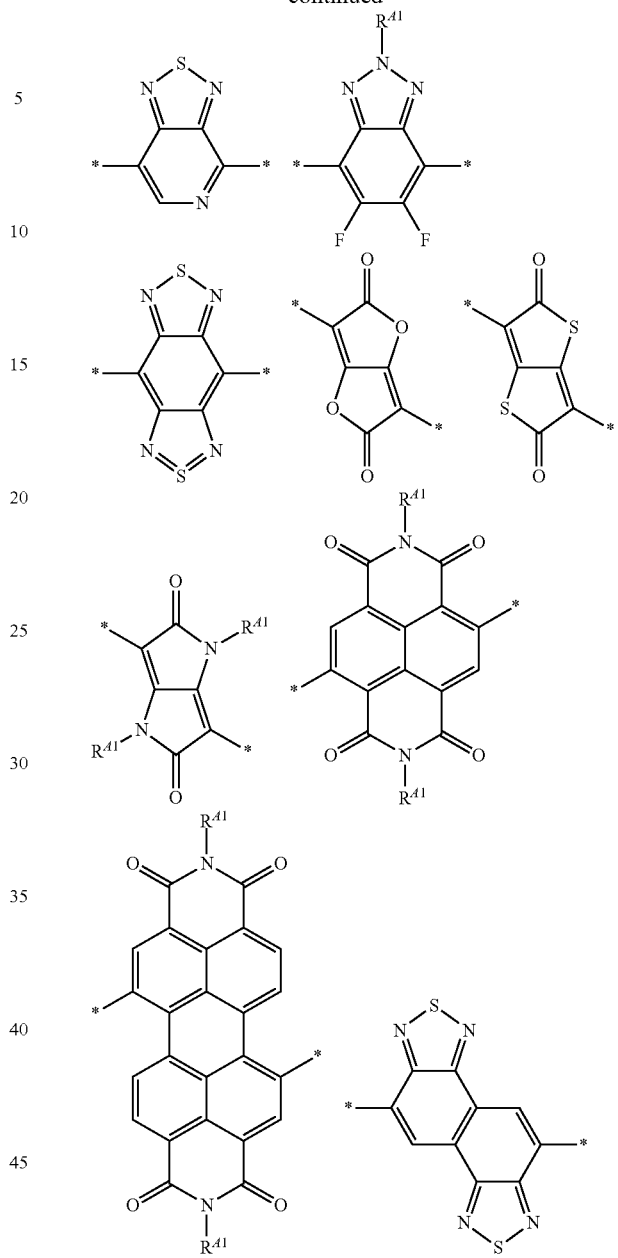

[Electron Donor Unit]

D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure.

The divalent aromatic heterocyclic group having at least one of a N atom, an O atom, a S atom, or a Se atom in a ring structure is preferably a divalent aromatic heterocyclic group having at least one S atom in a ring structure.

The divalent aromatic heterocyclic group may have a single ring or a fused ring structure having two or more rings, and preferably has a structure obtained by combining two or more divalent aromatic heterocyclic groups having single rings or a structure obtained by combining a divalent aromatic heterocyclic group having two or more single rings and a divalent aromatic heterocyclic group having one or more fused ring structures having two or more rings.

The divalent aromatic heterocyclic group may further have a substituent, and examples of the preferable substituent include an alkyl group, an alkenyl group, an alkynyl group, an alkoxy group, an aromatic hydrocarbon group, an aromatic heterocyclic group, a halogen atom, and a monovalent group represented by Formula 1-1.

Examples of the divalent aromatic heterocyclic group are provided below, but the present invention is not limited thereto. In the structural formula, the hydrogen atom may be substituted with an alkyl group, an alkenyl group, an alkynyl group, an alkoxy group, an aromatic hydrocarbon group, an aromatic heterocyclic group, a halogen atom, or a group represented by Formula 1-1, $R^{D1}$ is the same as $R^{D1}$ in Formula D-1, the preferable aspect is also the same, and * represents a bonding site to another structure. The alkyl group is preferably an alkyl group having 1 to 30 carbon atoms and more preferably an alkyl group having 8 to 30 carbon atoms.

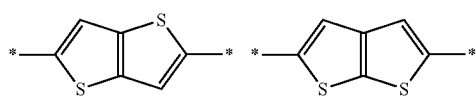
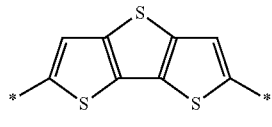
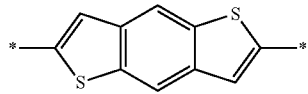
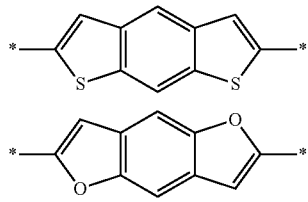
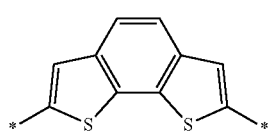
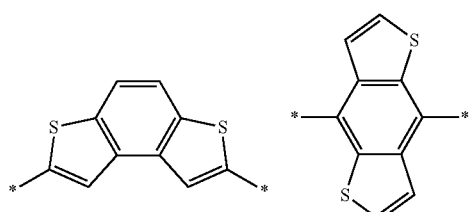
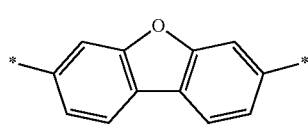
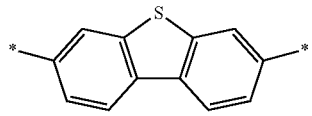

-continued

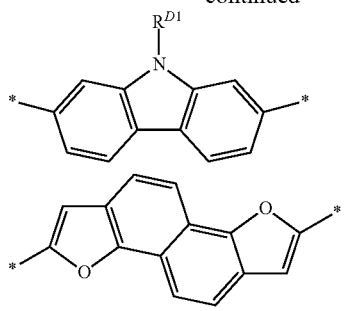
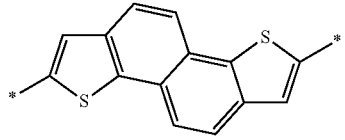
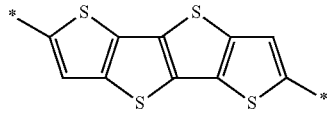
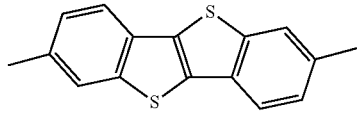
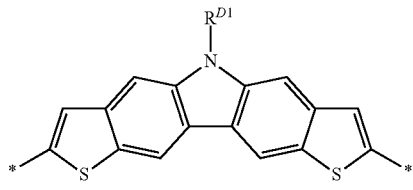
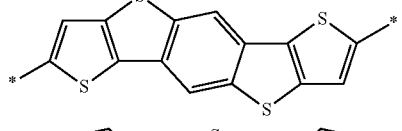
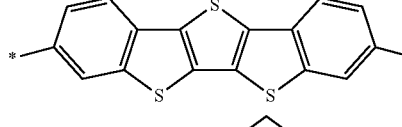
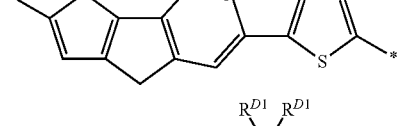
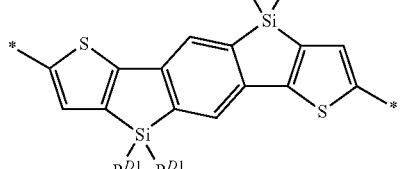
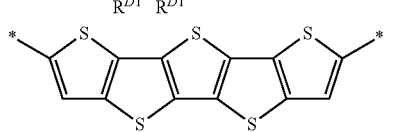
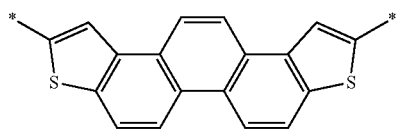

-continued

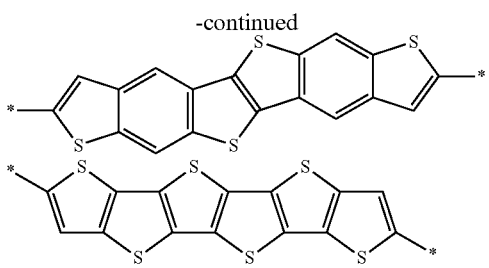

The aromatic hydrocarbon group consisting of a fused ring structure having two or more rings is preferably an aromatic hydrocarbon group having 10 to 20 carbon atoms, more preferably a fluorene group, a naphthylene group, or a group obtained by removing two hydrogen atoms from the aromatic hydrocarbon group in which three or four rings are condensed, and even more preferably a fluorene group, a naphthylene group, or a group obtained by removing two hydrogen atoms from an anthracene ring, a phenanthrene ring, a chrysene ring, or a pyrene ring.

The aromatic hydrocarbon group may further have a substituent, and examples of the preferable substituent include an alkyl group, a halogen atom, and a monovalent group represented by Formula 1-1.

In Formula 1, D is preferably a structure represented by Formula D-1.

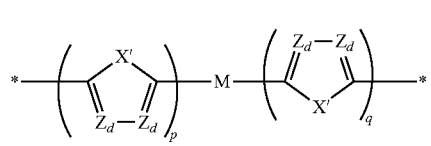

(D-1)

In Formula D-1, X"s each independently represent an O atom, a S atom, a Se atom, or, $NR^{D1}$, $Z_d$'s each independently represent a N atom or $CR^{D2}$, $R^{D1}$'s each independently represent a monovalent organic group, $R^{D2}$'s each independently represent a hydrogen atom or a monovalent organic group, M represents a single bond, a divalent aromatic heterocyclic group, a divalent aromatic hydrocarbon group, an alkenylene group, an alkynylene group, or a divalent group obtained by combining these, p and q each independently represent an integer of 0 to 4, *'s each independently represent a bonding site to another structure.

In Formula D-1, X"s each independently represent an O atom, a S atom, a Se atom, or $NR^{D1}$, preferably an O atom, a S atom, or a Se atom, and more preferably a S atom.

$Z_d$'s each independently represent a N atom or $CR^{D2}$, more preferably represents $CR^{D2}$.

$R^{D1}$'s each independently represent a monovalent organic group, is preferably an alkyl group (preferably having 1 to 30 carbon atoms), an alkynyl group (preferably having 2 to 30 carbon atoms), an alkenyl group (preferably having 2 to 30 carbon atoms), an alkoxy group (preferably having 1 to 30 carbon atoms), an aromatic hydrocarbon group (preferably having 6 to 30 carbon atoms), an aromatic heterocyclic group (preferably 5 to 7-membered ring. an hetero atom is preferably an O atom, a N atom, a S atom, or a Se atom), a halogen atom (preferably a F atom, a Cl atom, a Br atom, and an I atom, more preferably a F atom or a Cl atom, and particularly preferably a F atom), and a monovalent group represented by Formula 1-1, and more preferably an alkyl group, a halogen atom, or a monovalent group represented by Formula 1-1.

$R^{D2}$'s each independently represent a hydrogen atom or a monovalent organic group, preferably represents a hydrogen atom, an alkyl group (preferably having 1 to 30 carbon atoms), an alkynyl group (preferably having 2 to 30 carbon atoms), an alkenyl group (preferably having 2 to 30 carbon atoms), an alkoxy group (preferably having 1 to 30 carbon atoms), an aromatic hydrocarbon group (preferably having 6 to 30 carbon atoms), an aromatic heterocyclic group (preferably 5 to 7-membered ring. an hetero atom is preferably an O atom, a N atom, a S atom, or a Se atom), a halogen atom (preferably a F atom, a Cl atom, a Br atom, or a I atom, more preferably a F atom or a Cl atom, and particularly preferably a F atom), or a monovalent group represented by Formula 1-1, and more preferably represents a hydrogen atom, an alkyl group, a halogen atom, or a monovalent group represented by Formula 1-1.

M represents a single bond, a divalent aromatic heterocyclic group, a divalent aromatic hydrocarbon group, an alkenylene group, an alkynylene group, or a divalent group obtained by combining these.

The divalent aromatic heterocyclic group in M may have a single ring or may have a fused ring structure having two or more rings. Examples of the divalent aromatic heterocyclic group preferably used in the present invention are the same as those of the divalent aromatic heterocyclic group having a fused ring structure having two or more rings.

The divalent aromatic hydrocarbon group in M is preferably an aromatic hydrocarbon group having 6 to 20 carbon atoms, more preferably a phenylene group, a biphenylene group, a fluorene group, a naphthylene group, or a group obtained by removing two hydrogen atoms from aromatic hydrocarbon in which three or four rings are condensed, and even more preferably a fluorene group, a naphthylene group, an anthracene ring, a phenanthrene ring, a chrysene ring, or a group obtained by removing two or more hydrogen atoms from a pyrene ring.

The divalent aromatic heterocyclic group or a divalent aromatic hydrocarbon group in M may further have a substituent, and a preferable substituent include an alkyl group, an alkoxy group, a halogen atom, or a monovalent group represented by Formula 1-1.

An alkenylene group in M is preferably an alkenylene group having 2 to 10 carbon atoms, more preferably an alkenylene group having 2 to 4 carbon atoms, and even more preferably an ethenylene group.

An alkynylene group in M is preferably an alkynylene group having 2 to 10 carbon atoms, more preferably an alkynylene group having 2 to 4 carbon atoms, and even more preferably an ethynylene group.

p and q each independently represent an integer of 0 to 4, preferably an integer of 1 to 3, and more preferably an integer of 1 to 2. It is preferable that p and q have the same value. It is preferable that p+q is 2 to 4.

Examples of the structure represented by Formula D-1 are as below, but the present invention is not limited thereto. In the structural formula, a hydrogen atom may be an alkyl group or may be substituted with a group represented by Formula 1-1, $R^{D1}$ is the same as $R^{D1}$ in Formula D-1, a preferable aspect thereof is also the same, and * represents a bonding site to another structure. The alkyl group is preferably an alkyl group having 1 to 30 carbon atoms and more preferably an alkyl group having 8 to 30 carbon atoms.

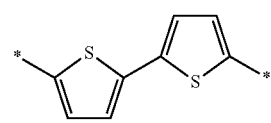

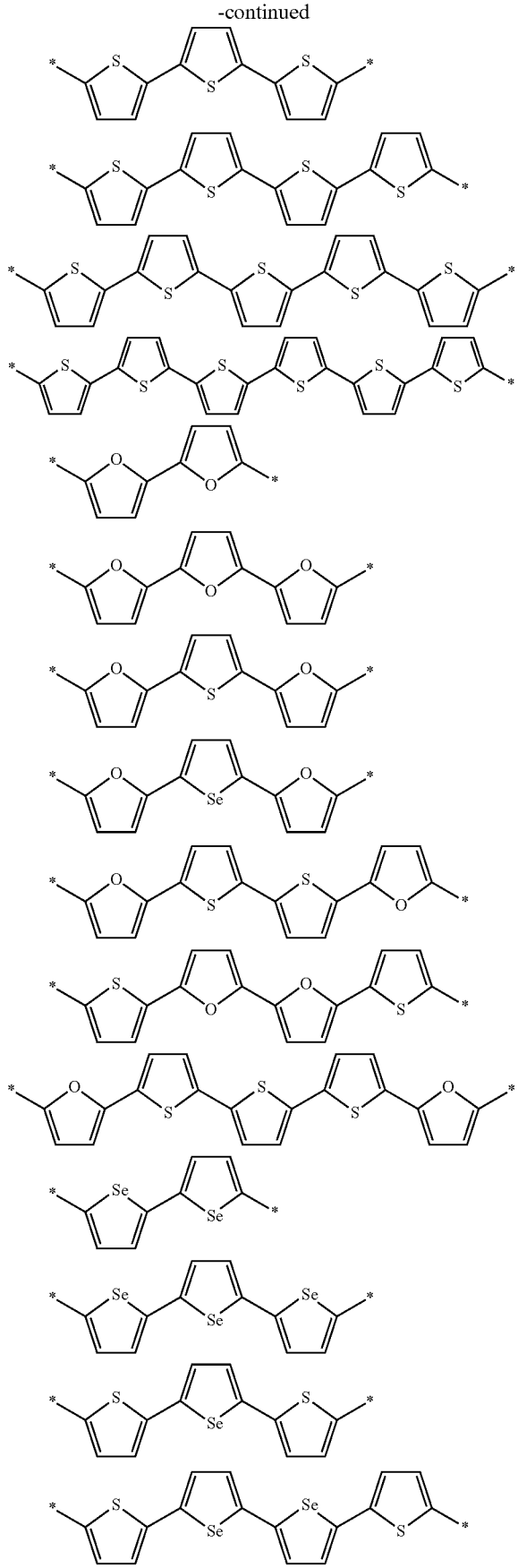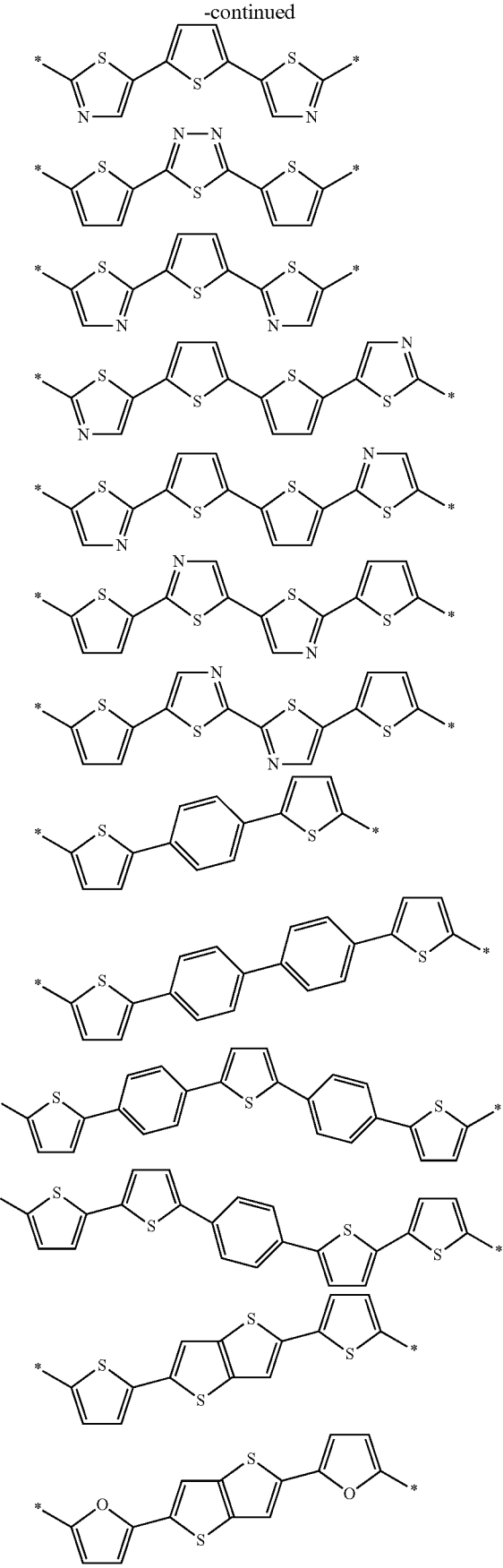

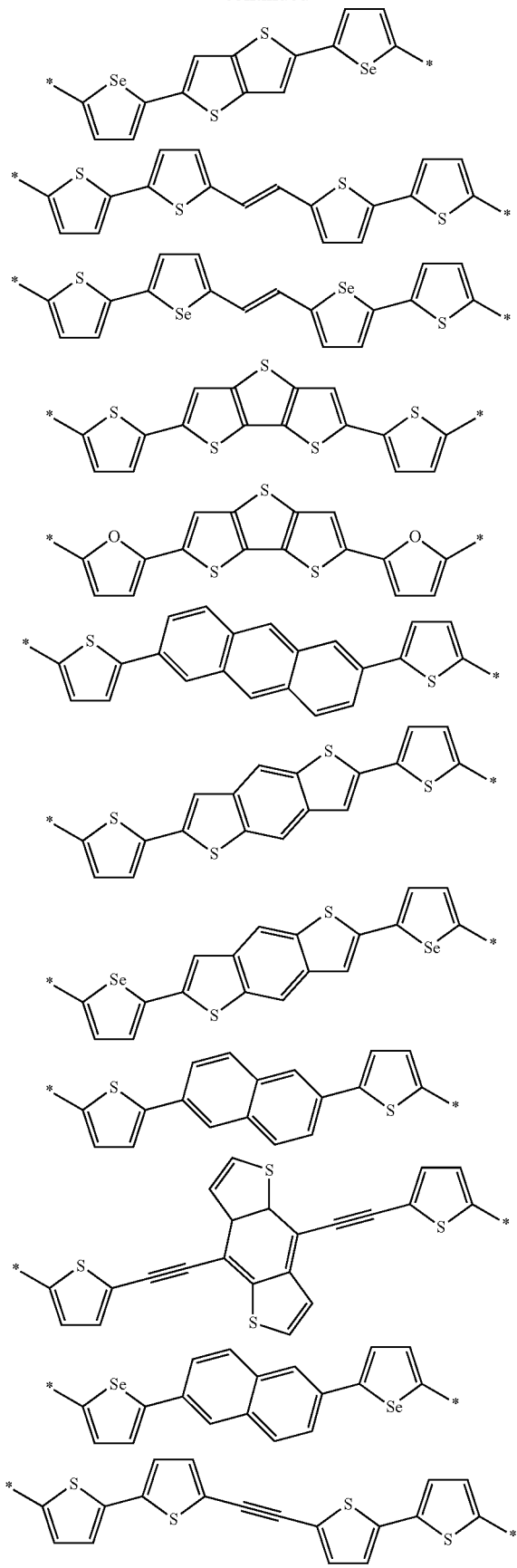
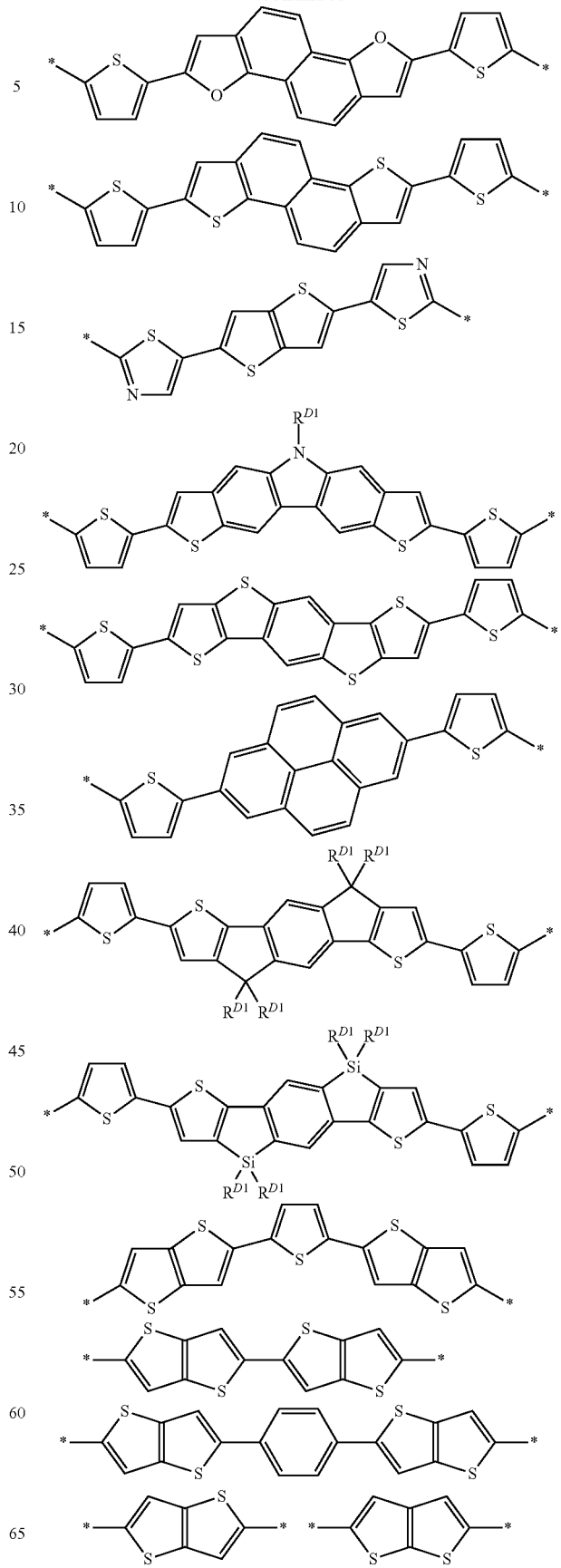

-continued
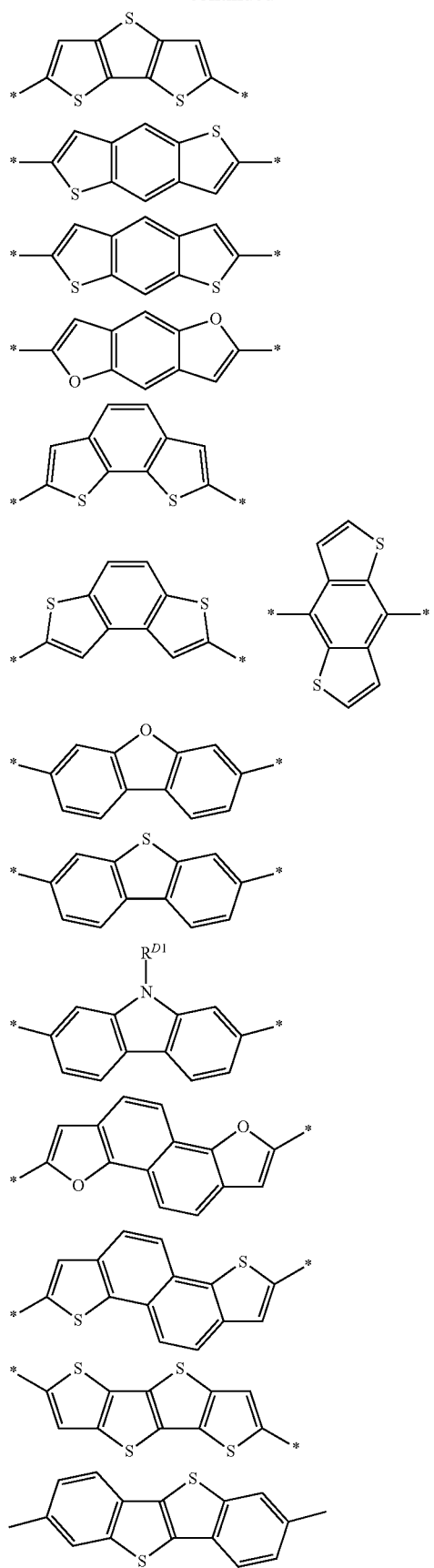
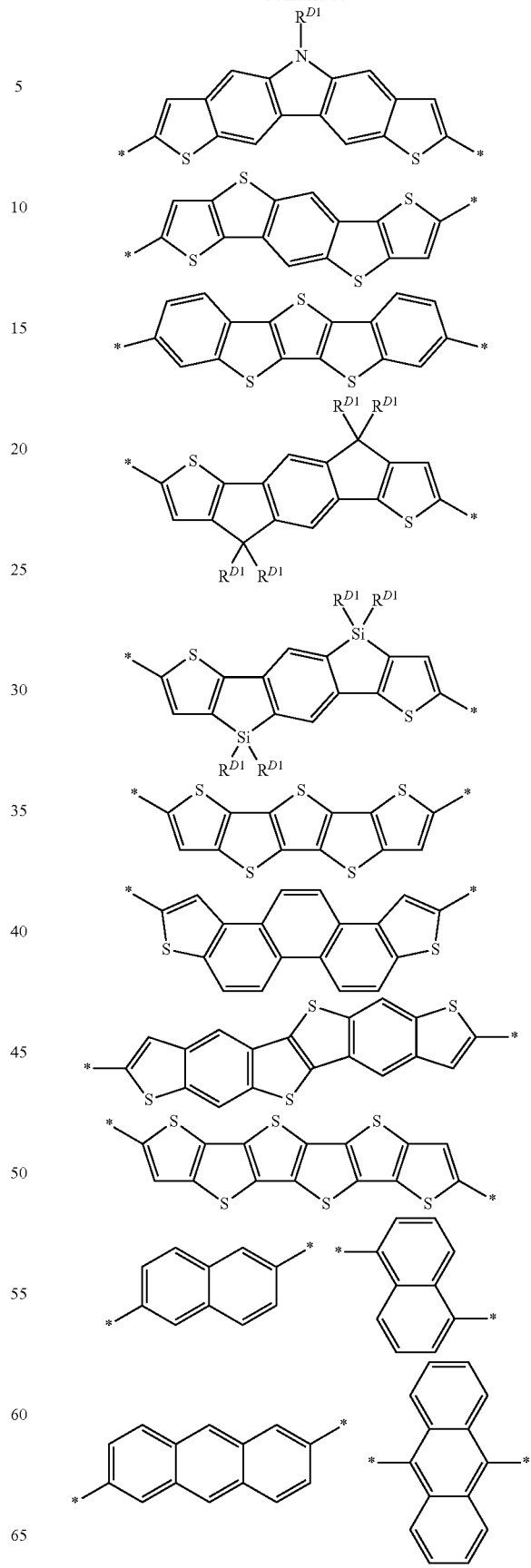

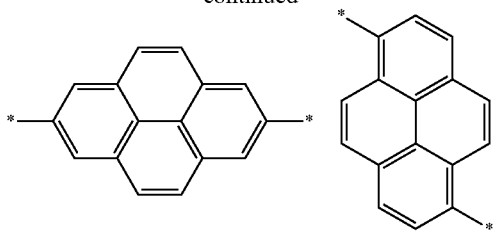

In Formula 1, D and/or A has at least one monovalent group represented by Formula 1-1.

The number of monovalent groups represented by Formula 1-1 in the constitutional repeating unit represented by Formula 1 is preferably 1 to 4 and more preferably 1 or 2.

In Formula 1-1, L represents a linear or branched alkylene group having m carbon atoms, m represents an integer of 1 or greater, preferably an integer of 2 or greater, and more preferably an integer of 3 or greater. m is preferably 30 or less and more preferably 20 or less.

In Formula 1-1, R represents an alkyl group not having a substituent and having n carbon atoms, and $6 \leq m+n \leq 50$.

In Formula 1-1, it is preferable that n represents an integer of 2 or greater. An integer of 4 or greater is more preferable, and an integer of 6 or greater is more preferable. n is preferably 30 or less and more preferably 25 or less.

In Formula 1-1, m+n is $6 \leq m+n \leq 50$ and preferably $6 \leq m+n \leq 40$, more preferably $8 \leq m+n \leq 35$, and even more preferably $14 \leq m+n \leq 30$.

In Formula 1-1, an alkyl group represented by R may have any one of a linear shape, a branched shape, and a circular shape, but is preferably a linear or branched alkyl group. Particularly, in a case where L is a linear alkylene group, R is more preferably a branched alkyl group. In a case where L is a branched alkylene group, R is more preferably a linear alkyl group.

The monovalent group represented by Formula 1-1 preferably has A in Formula 1 and is more preferably bonded to a nitrogen atom existing in A in Formula 1.

The monovalent group represented by Formula 1-1 is preferably a monovalent group represented by Formula 1-2 or 1-3.

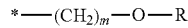 (1-2)

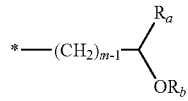 (1-3)

In Formulae 1-2 and 1-3, m represents an integer of 1 or greater, R represents an alkyl group not having a substituent and having n carbon atoms, $R_a$ is an alkyl group not having a substituent and having a carbon atoms, $R_b$ is an alkyl group not having a substituent and having b carbon atoms, $6 \leq m+n \leq 50$ or $6 \leq m+a+b \leq 50$, and * represents a bonding site to another structure.

In Formula 1-2, m is an integer of 1 or greater, preferably an integer of 2 or greater, and more preferably an integer of 3 or greater. m is preferably 30 or less and more preferably 20 or less.

In Formula 1-2, n is preferably an integer of 2 or greater. n is more preferably an integer of 4 or greater and more preferably an integer of 6 or greater. n is preferably 30 or less and more preferably 25 or less.

In Formula 1-2, m+n is $6 \leq m+n \leq 50$, preferably $6 \leq m+n \leq 40$, more preferably $8 \leq m+n \leq 35$, and even more preferably $14 \leq m+n \leq 30$.

In Formula 1-2, an alkyl group represented by R may have any one of a linear shape, a branched shape, and a circular shape, but is preferably a linear or branched alkyl group and more preferably a branched alkyl group.

In Formula 1-3, m is an integer of 1 or greater, preferably an integer of 2 or greater, and more preferably an integer of 3 or greater. m is preferably 30 or less and more preferably 20 or less.

In Formula 1-3, a is preferably an integer of 1 or greater. a is more preferably an integer of 2 or greater and more preferably an integer of 4 or greater. a is preferably 30 or less and more preferably 20 or less.

In Formula 1-3, b is preferably an integer of 2 or greater. b is more preferably an integer of 4 or greater and more preferably an integer of 6 or greater. b is preferably 30 or less and more preferably 20 or less.

In Formula 1-3, m+a+b is $6 \leq m+a+b \leq 50$, preferably is $6 \leq m+a+b \leq 40$, more preferably $8 \leq m+a+b \leq 35$, and even more preferably $14 \leq m+a+b \leq 30$.

In Formula 1-3, an alkyl group represented by $R_a$ or $R_b$ may have any one of a linear shape, a branched shape, and a circular shape, but is preferably a linear or branched alkyl group and more preferably a linear alkyl group.

In view of crystallinity of the compound represented by Formula 1, A in Formula 1 preferably has a symmetry of $C_2$, $C_{2v}$, or $C_{2h}$.

In view of crystallinity of the compound represented by Formula 1, D in Formula 1 preferably has a symmetry of $C_2$, $C_{2v}$, or $C_{2h}$.

In view of crystallinity of the compound represented by Formula 1, in Formula 1, the symmetry of A is $C_2$, $C_{2v}$, or $C_{2h}$, and the symmetry of D is more preferably $C_2$, $C_{2v}$, or $C_{2h}$. With respect to the symmetry, "Molecular Symmetry and Group Theory" (written by Masao Nakazaki, Tokyo Kagaku Dojin Co., Ltd.) is referred to.

[Constitutional Repeating Unit Represented by Formulae 2 to 5]

The constitutional repeating unit represented by Formula 1 is preferably a constitutional repeating unit represented by any one of Formulae 2 to 5, more preferably a constitutional repeating unit represented by Formula 2 or 3, and even more preferably a constitutional repeating unit represented by Formula 3.

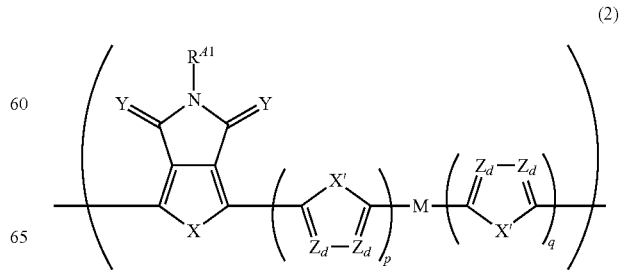 (2)

-continued

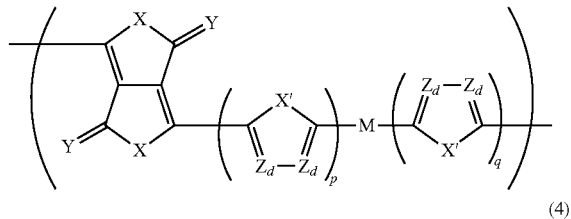

(3)

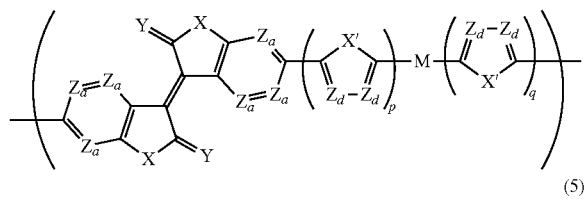

(4)

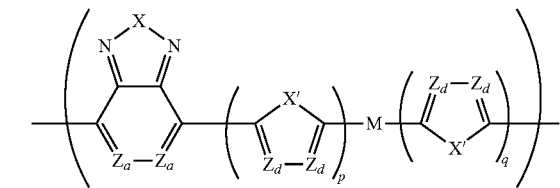

(5)

In Formulae 2 to 5, X's each independently represent an O atom, a S atom, a Se atom, or NR$^{A1}$, Y's each independently represent an O atom or a S atom, $Z_a$'s each independently represent CR$^{A2}$ or a N atom, R$^{A1}$'s each independently represent an alkyl group, a monovalent group represented by Formula 1-1, or a bonding site to another structure, R$^{A2}$'s each independently represent a hydrogen atom, a halogen atom, an alkyl group, or a bonding site to another structure, X"s each independently represent an O atom, a S atom, a Se atom, or NR$^{D1}$, $Z_d$'s each independently represent a N atom or CR$^{D2}$, R$^{D1}$'s each independently represent a monovalent organic group, R$^{D2}$'s each independently represent a hydrogen atom or a monovalent organic group, M represents a single bond, a divalent aromatic heterocyclic group, a divalent aromatic hydrocarbon group, an alkenylene group, an alkynylene group, or a divalent group obtained by combining these, and p and q each independently represent an integer of 0 to 4.

In Formulae 2 to 5, X, Y, $Z_a$, R$^{A1}$, and R$^{A2}$ have the same meaning as X, Y, $Z_a$, R$^{A1}$, and R$^{A2}$ in Formulae A-1 to A-12, respectively, and preferable aspects thereof are also the same.

In Formulae 2 to 5, X', $Z_d$, R$^{D1}$, R$^{D2}$, M, p, and q have the same meaning as X', $Z_d$, R$^{D1}$, R$^{D2}$, M, p, and q in Formula D-1, respectively, and preferable aspects thereof are also the same.

[Preferable Aspects of Specific Compound]

In the specific compound, the content of the constitutional repeating unit represented by Formula 1 is preferably 60 to 100 mass %, more preferably 80 to 100 mass %, and even more preferably 90 to 100 mass % with respect to the total mass of the specific compound. It is particularly preferable that the constitutional repeating unit is substantially formed only with the constitutional repeating unit represented by Formula 1. The expression "the constitutional repeating unit is substantially formed only with the constitutional repeating unit represented by Formula 1" means that the content of the constitutional repeating unit represented by Formula 1 is 95 mass % or greater, preferably 97 mass % or greater, and more preferably 99 mass % or greater.

If the content of the constitutional repeating unit represented by Formula 1 is in the range above, an organic semiconductor having excellent mobility can be obtained.

The specific compound may include a constitutional repeating unit represented by Formula 1 singly or two or more kinds thereof may be included.

The specific compound is a compound having two or more constitutional repeating units represented by Formula 1 and may be an oligomer in which the number "n" of constitutional repeating units is two to nine or may be a polymer in which the number "n" of constitutional repeating units is 10 or greater. Among these, a polymer in which the number "n" of constitutional repeating units is 10 or greater is preferable, in view of mobility and obtainable physical properties of the organic semiconductor film.

In view of mobility, the molecular weight of the compound having a constitutional repeating unit represented by Formula 1 is 2,000 or greater, preferably 10,000 or greater, more preferably 20,000 or greater, even more preferably 30,000 or greater, and particularly preferably 45,000 or greater. In view of solubility, the molecular weight is preferably 1,000,000 or less, more preferably 300,000 or less, even more preferably 200,000 or less, and particularly preferably 150,000 or less.

According to the present invention, in a case where the compound has a molecular weight distribution, the molecular weight of this compound means a weight-average molecular weight.

According to the present invention, in a case where a specific polymer compound has molecular weight distribution, the molecular weight of this compound means a weight-average molecular weight.

According to the present invention, the weight-average molecular weight and the number-average molecular weight of the specific polymer compound can be measured by gel permeation chromatography (GPC) method, and can be obtained in terms of standard polystyrene. Specifically, for example, GPC is performed by using HLC-8121GPC (manufactured by Tosoh Corporation), using two items of TSKgel GMH$_{HR}$-H (20) HT (manufactured by Tosoh Corporation, 7.8 mmID×30 cm) as columns, and using 1,2,4-trichlorobenzene as an eluent. GPC is performed by using an infrared (IR) detector under the conditions in which the sample concentration is 0.02 mass %, the flow rate is 1.0 ml/min, the sample injection amount is 300 μl, and the measurement temperature is 160° C. The calibration curve is manufactured from 12 samples of "standard sample TSK standard, polystyrene": "F-128", "F-80", "F-40", "F-20", "F-10", "F-4", "F-2", "F-1", "A-5000", "A-2500", "A-1000", and "A-500" manufactured by Tosoh Corporation.

The structure of the terminal of the specific compound is not particularly limited, and depends on the existence of other constitutional units, kinds of base substances used in the synthesis, and kinds of a quench agent (reaction terminator) used in the synthesis. Here, examples thereof include a hydrogen atom, a hydroxy group, a halogen atom, an ethylenically unsaturated group, an alkyl group, an aromatic heterocyclic group (preferably a thiophene ring), and an aromatic hydrocarbon group (preferably a benzene ring).

A method of synthesizing a specific compound is not particularly limited, and may be synthesized with reference to well-known methods. For example, with reference to JP2010-527327A, JP2007-516315A, JP2014-515043A, JP2014-507488A, JP2011-501451A, JP2010-18790A, WO2012/174561A, JP2011-514399A, and JP2011-514913A, synthesis may be performed by synthesizing a precursor of an electron acceptor unit and a precursor of an electron donor unit and performing cross-coupling reactions such as Suzuki coupling and Stille coupling of each precursor.

Hereinafter, preferable specific examples of the preferable constitutional repeating unit represented by Formula 1 are provided, but the present invention is not limited to the examples below.

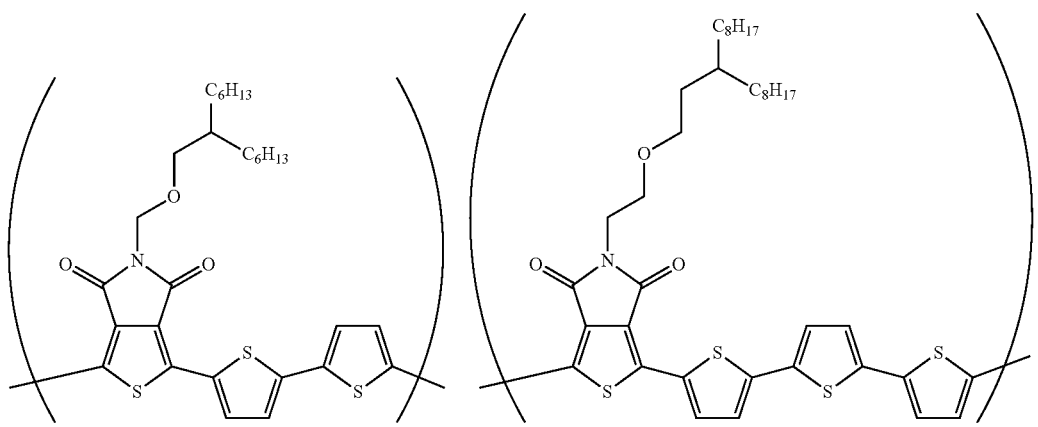

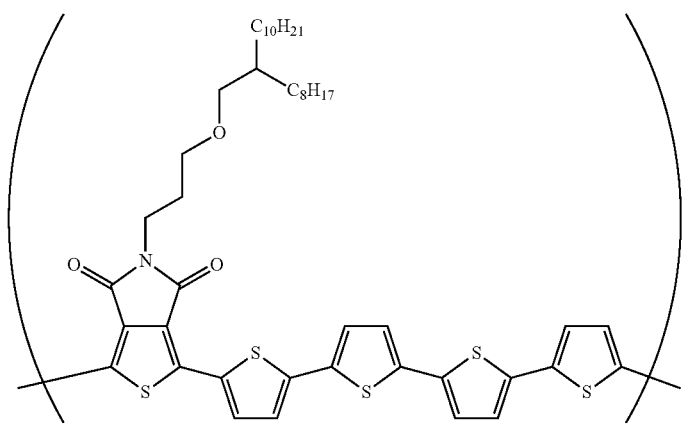

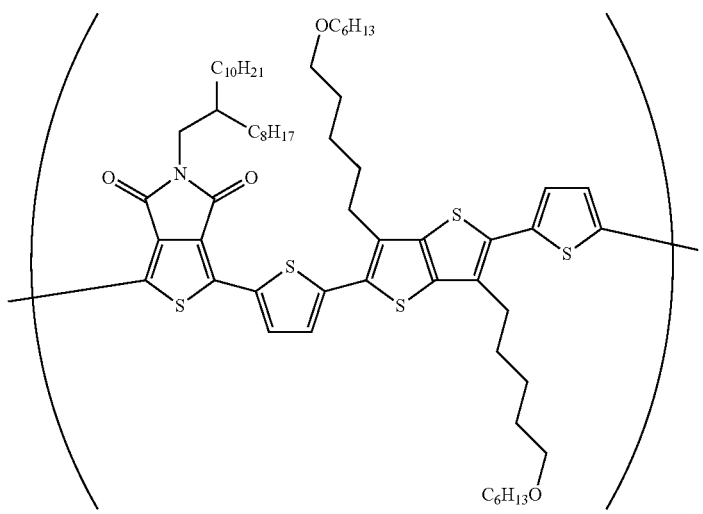

-continued
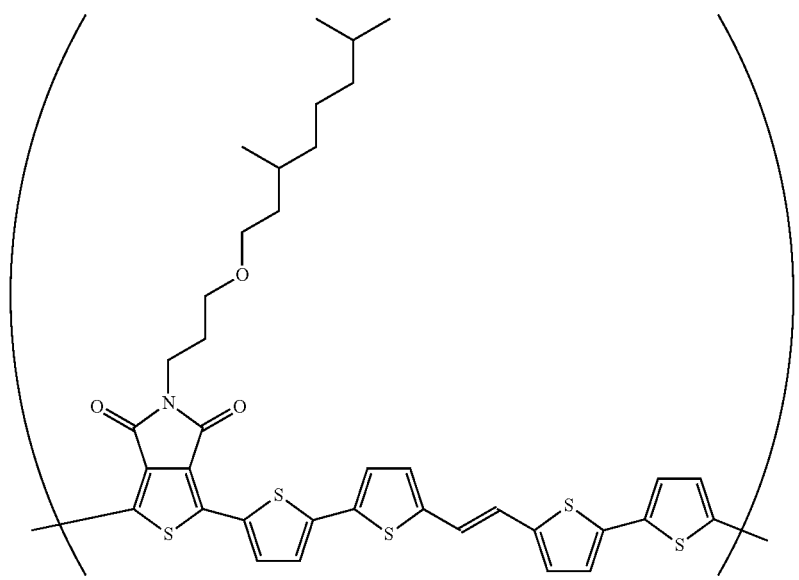
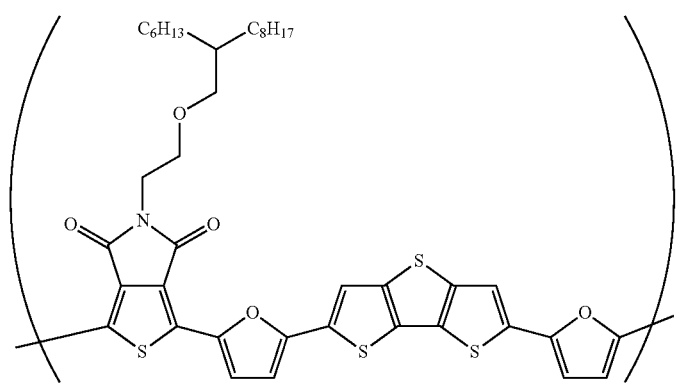
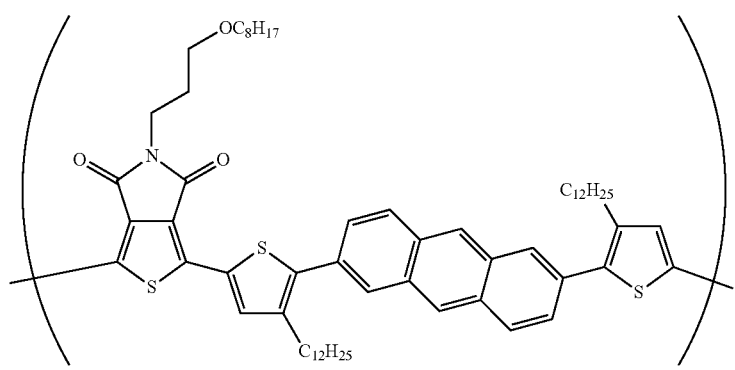
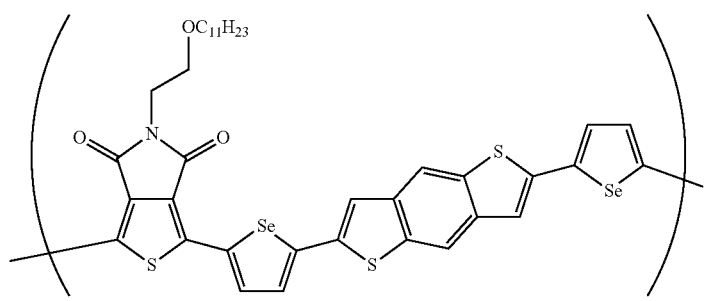

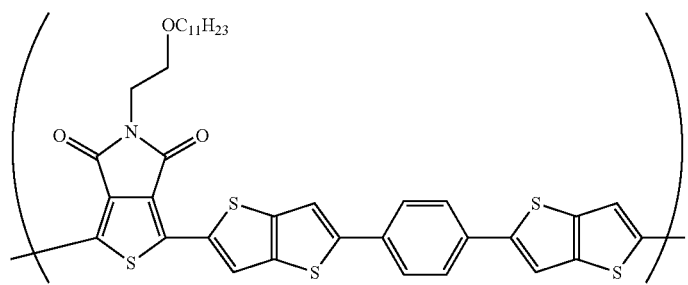
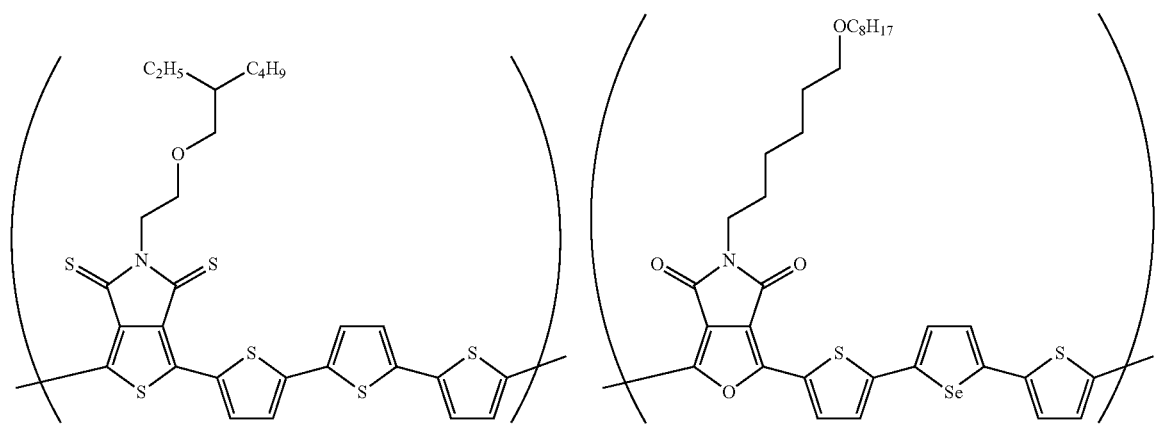
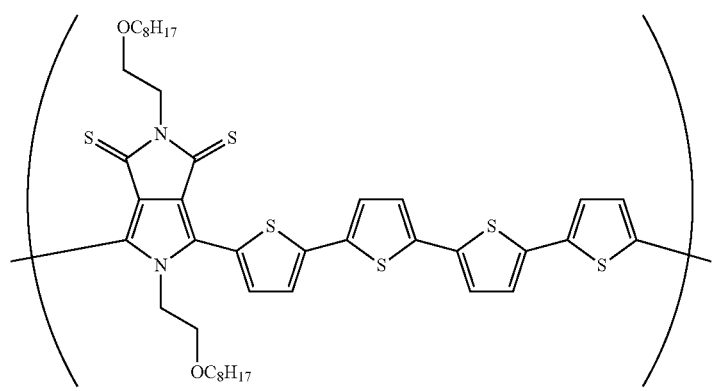
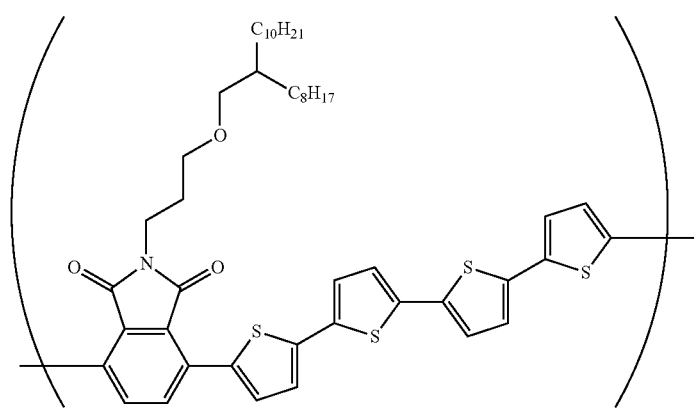

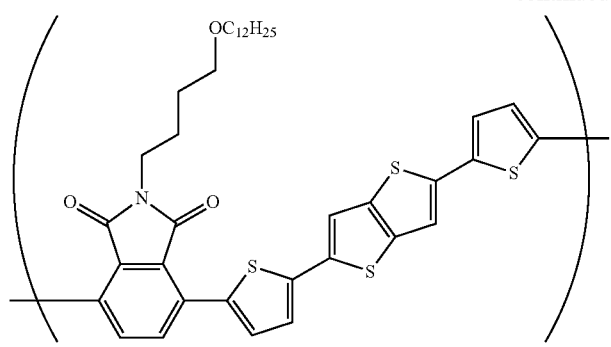
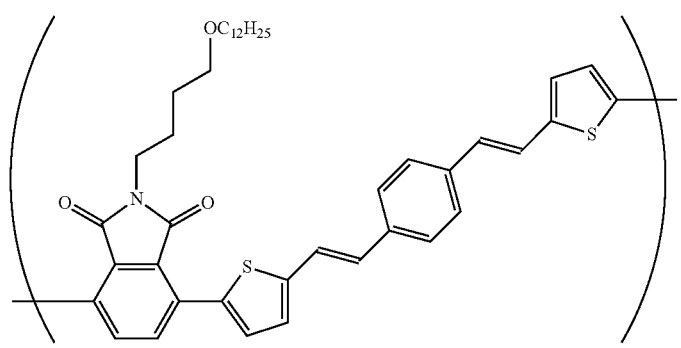
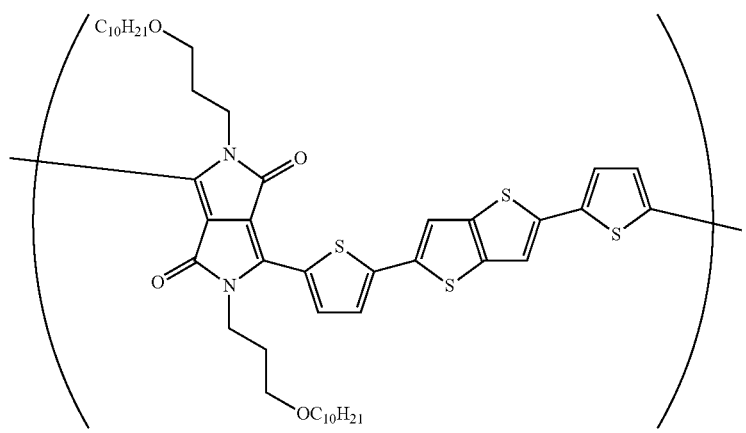
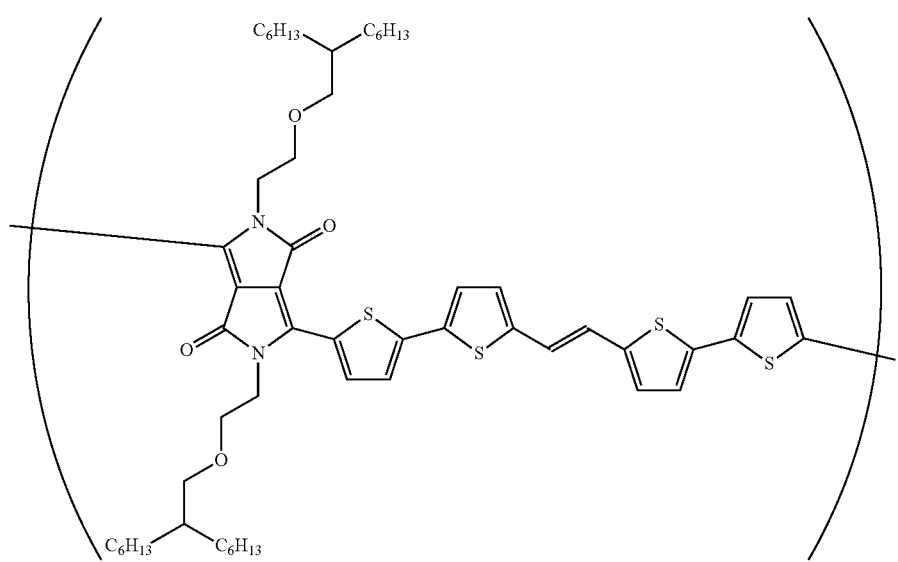

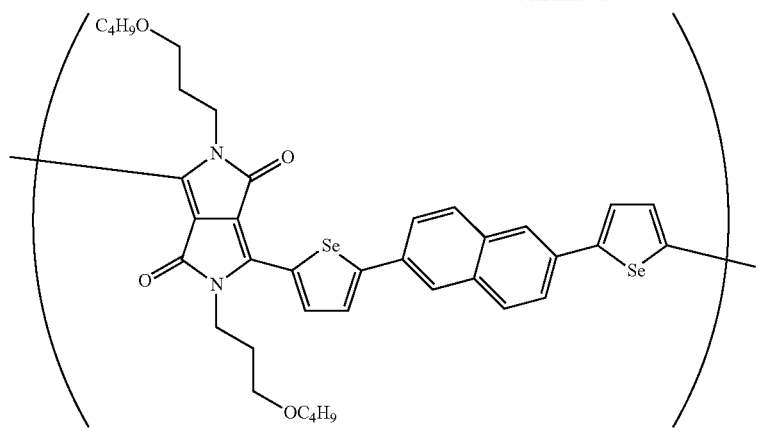
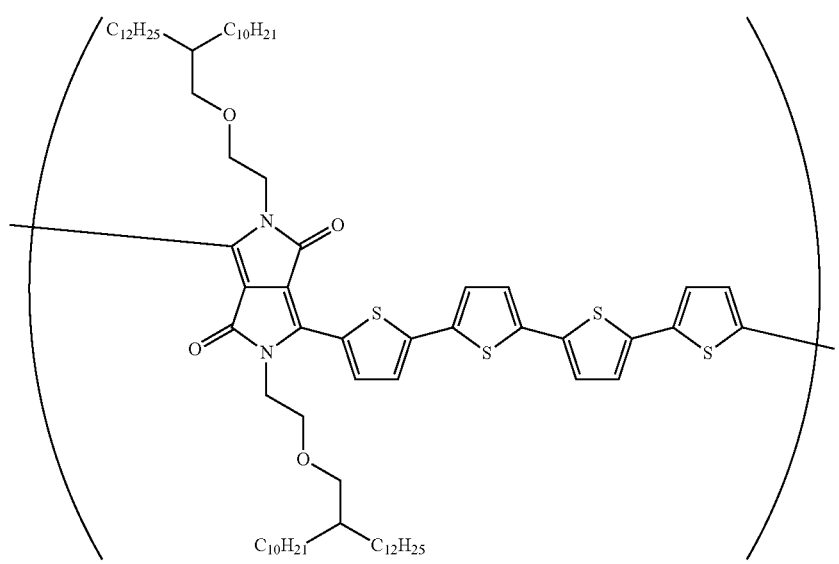
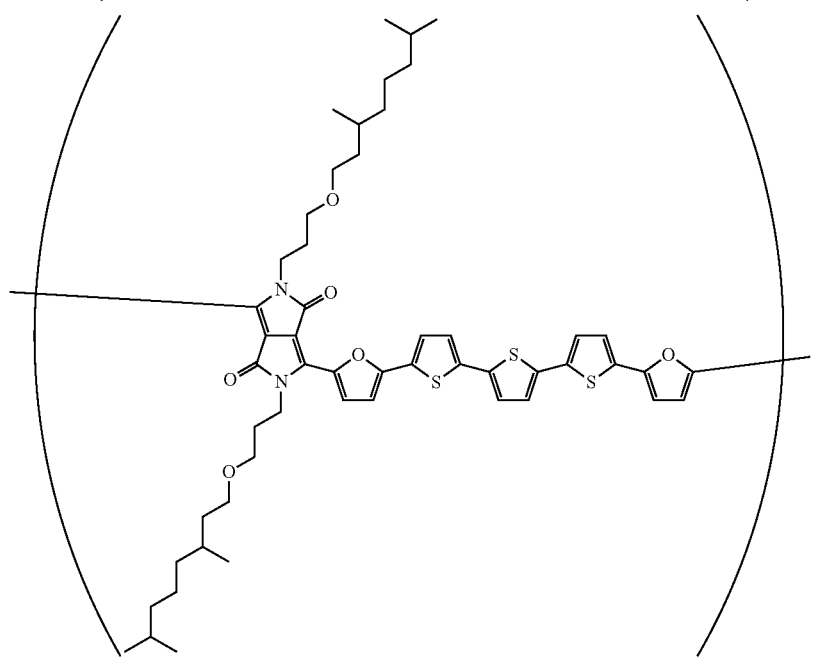

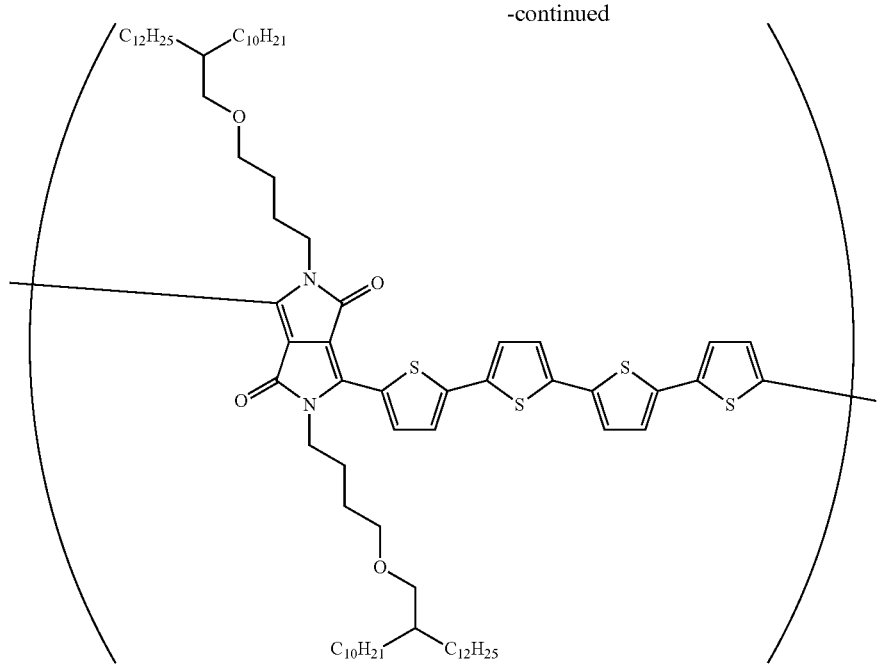
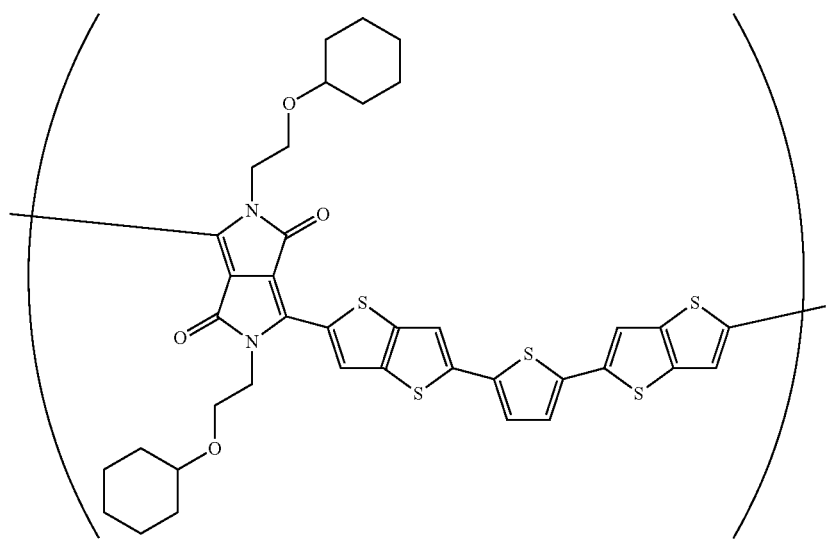
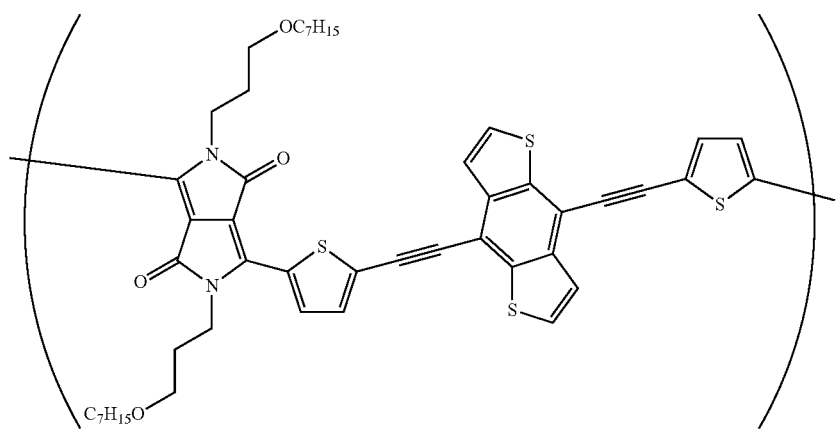

-continued
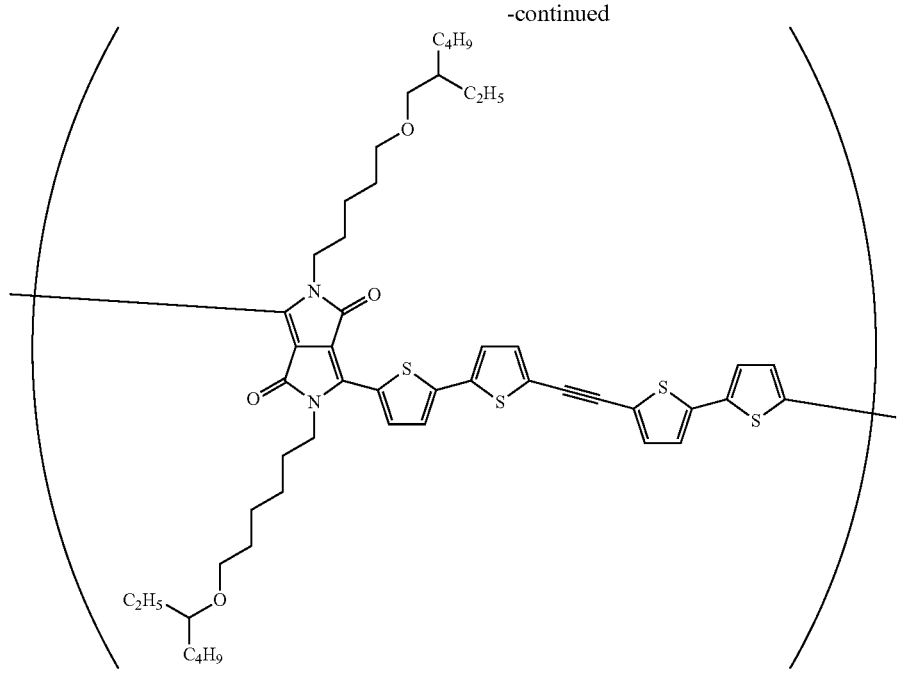
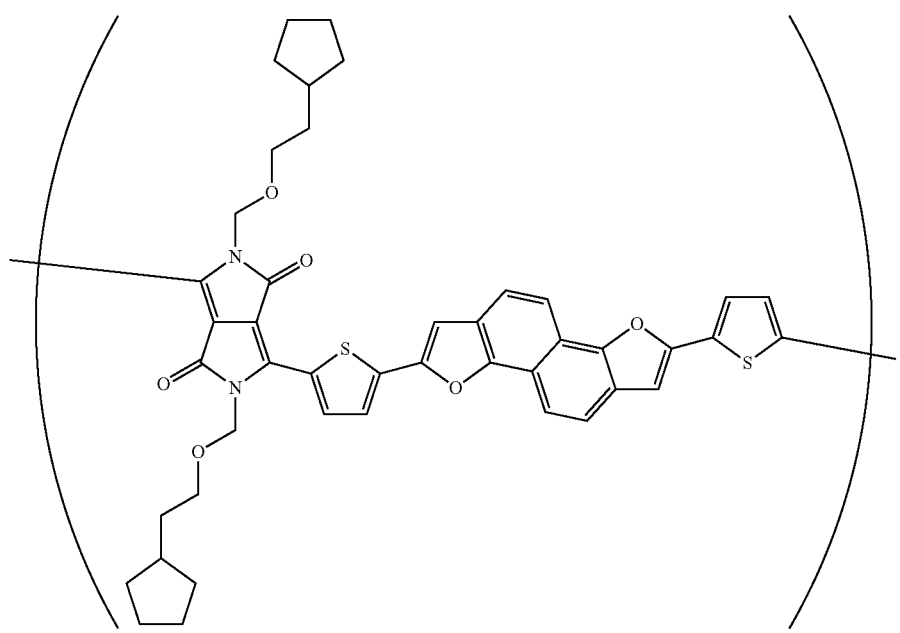
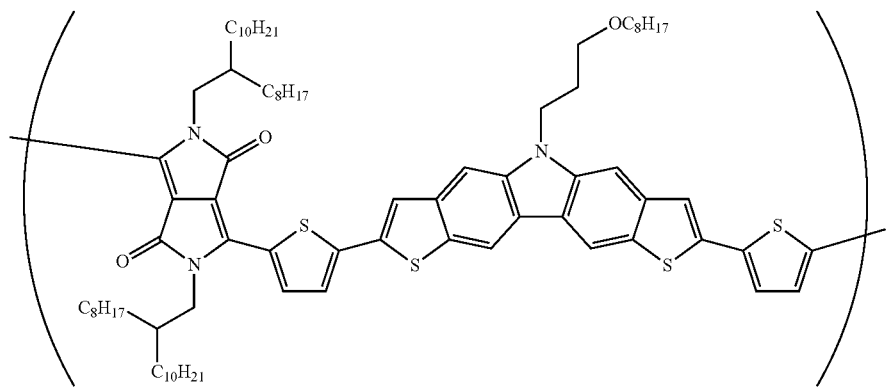

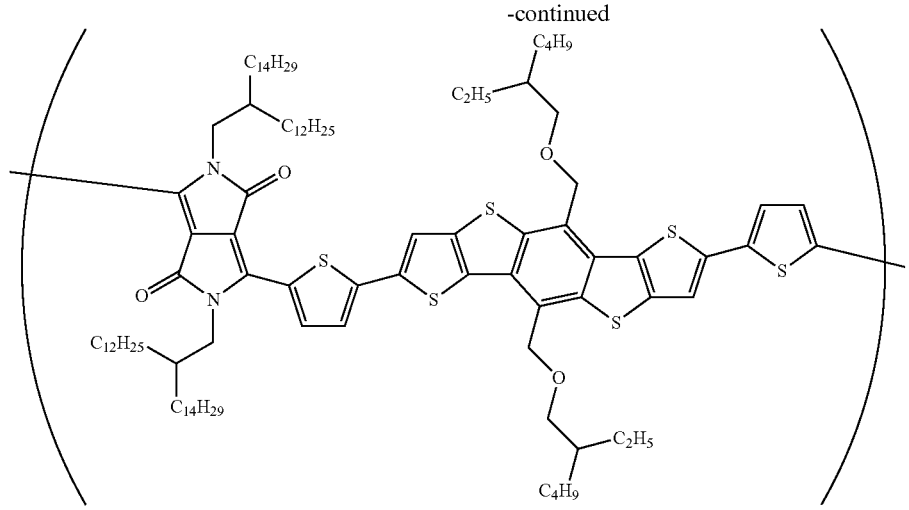
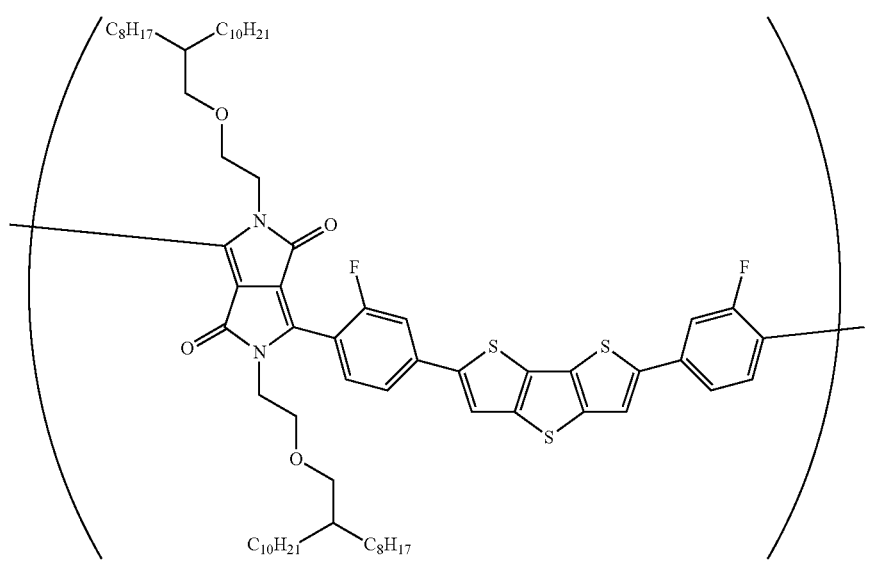
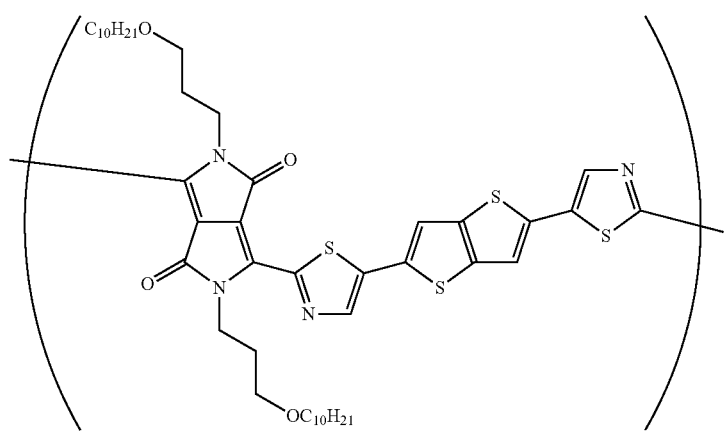

-continued
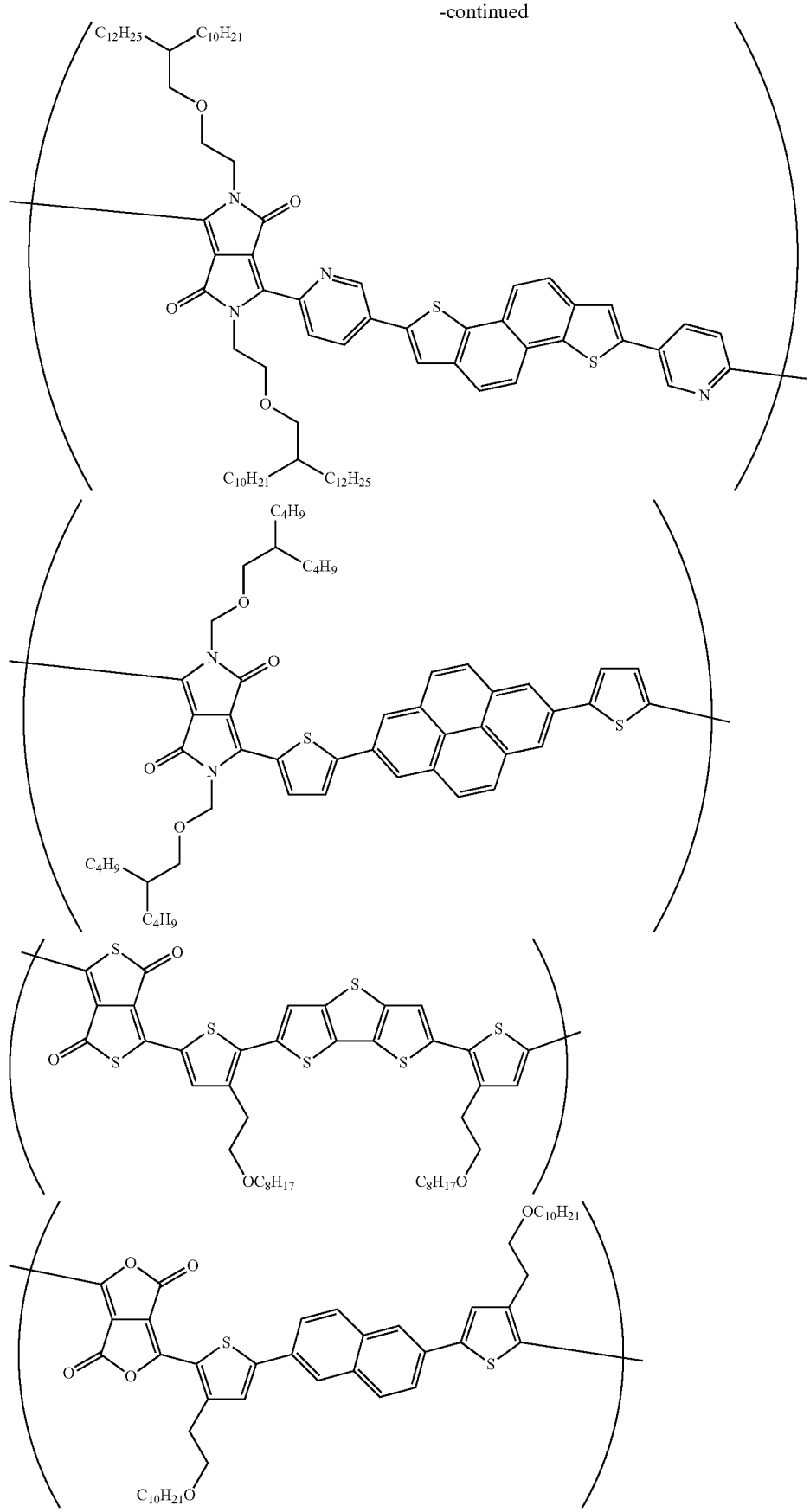

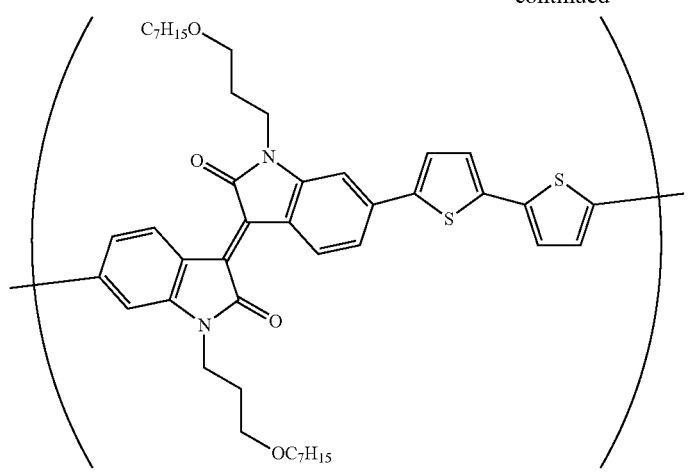
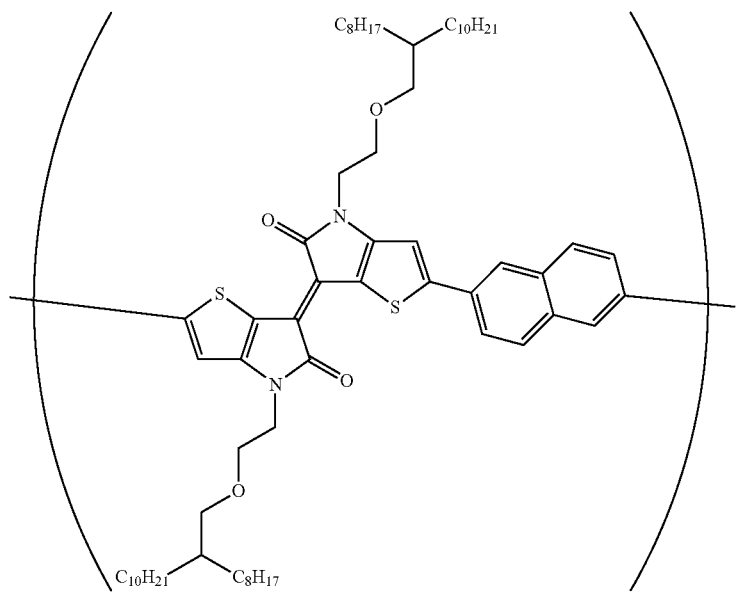
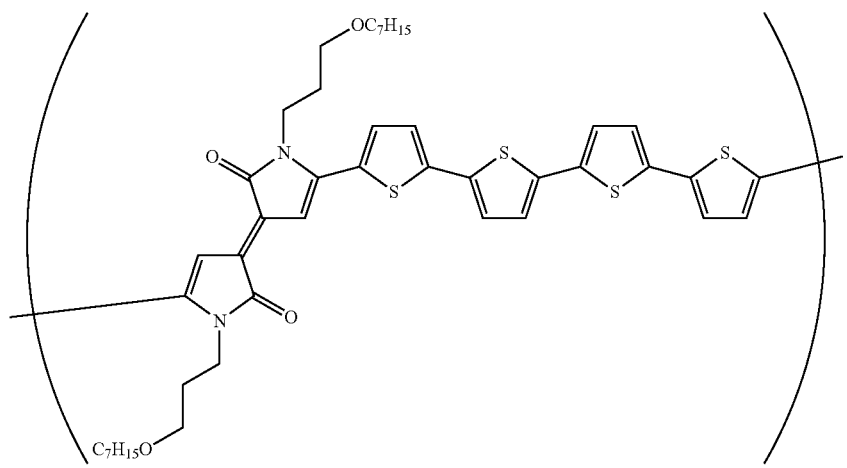

-continued
53 54
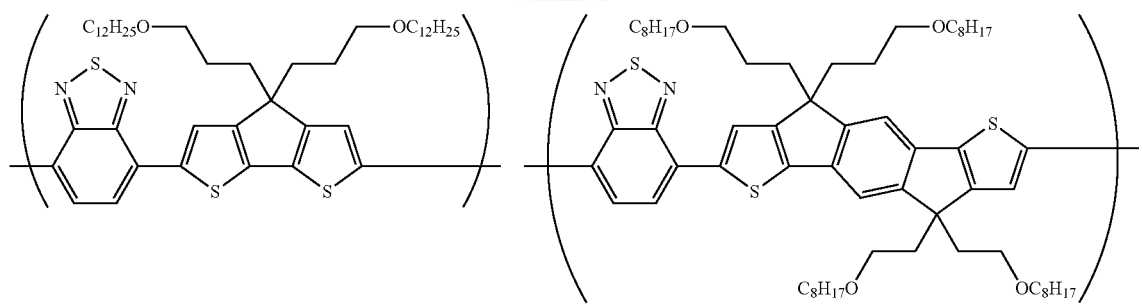
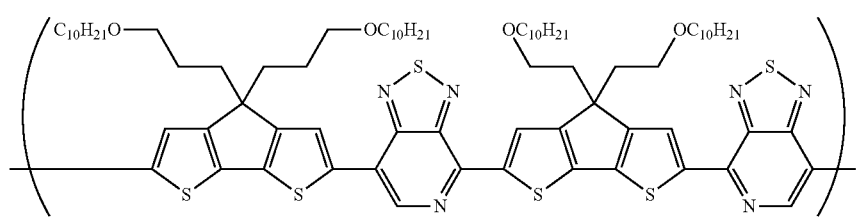
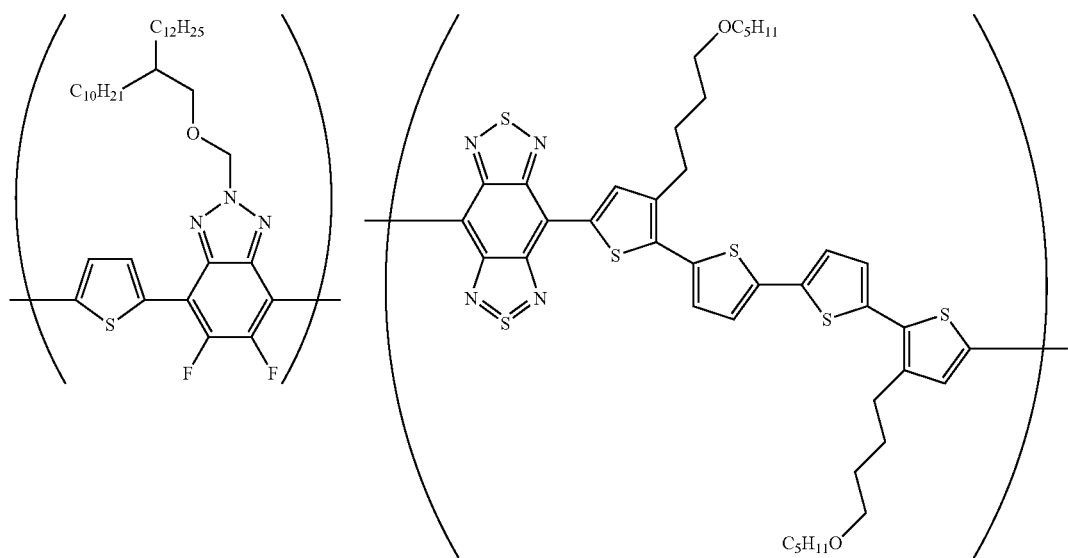
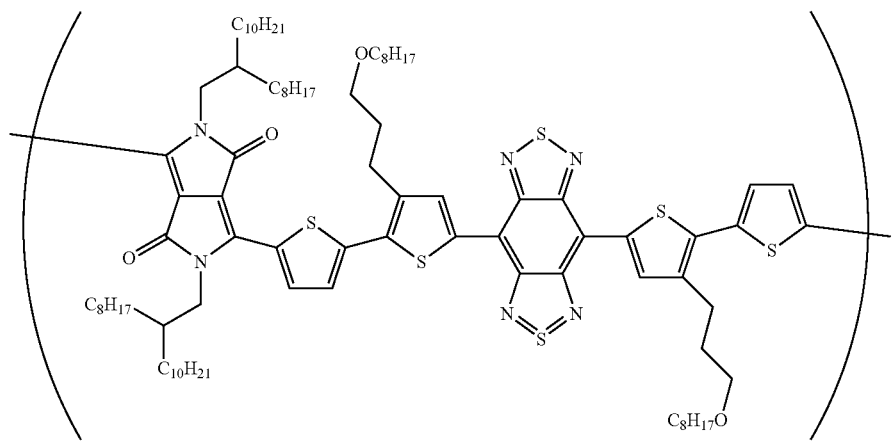

-continued
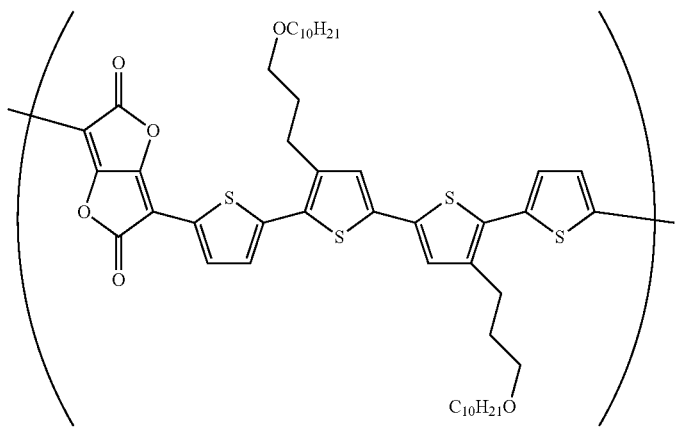
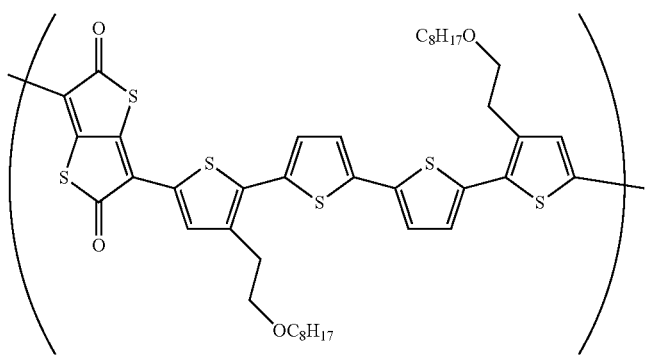
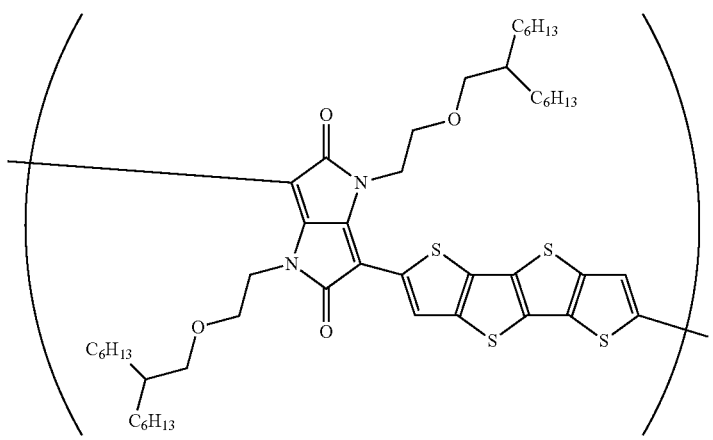
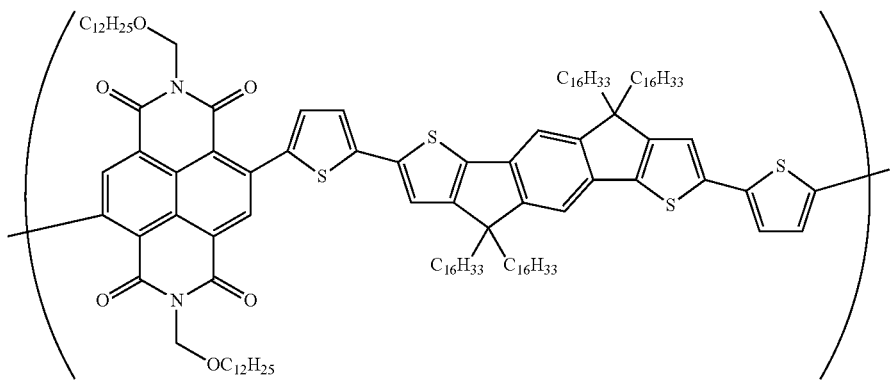

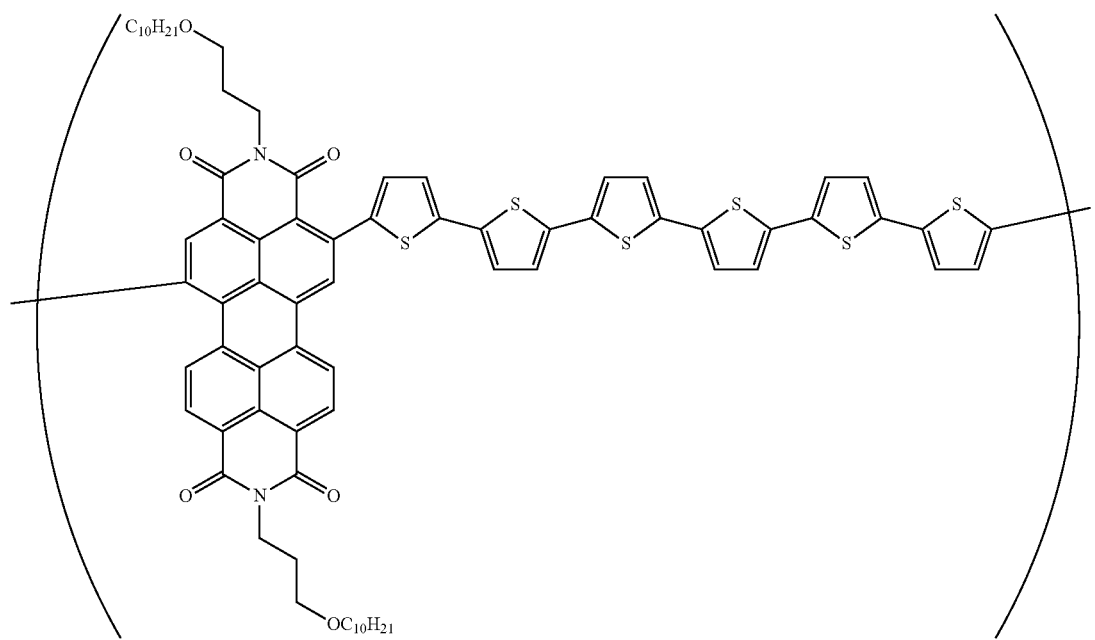
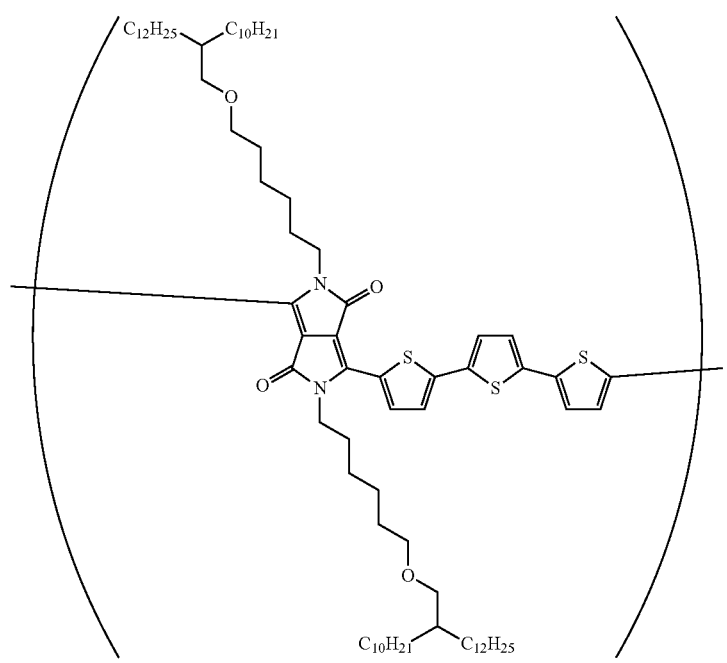

-continued
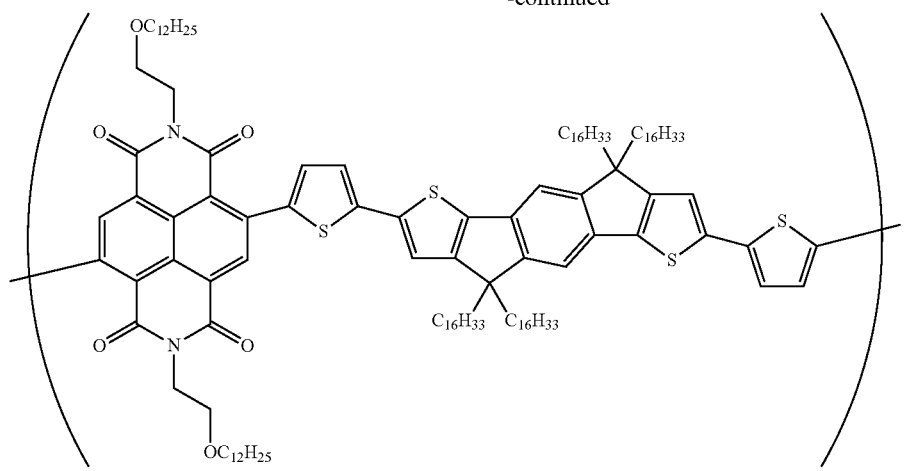
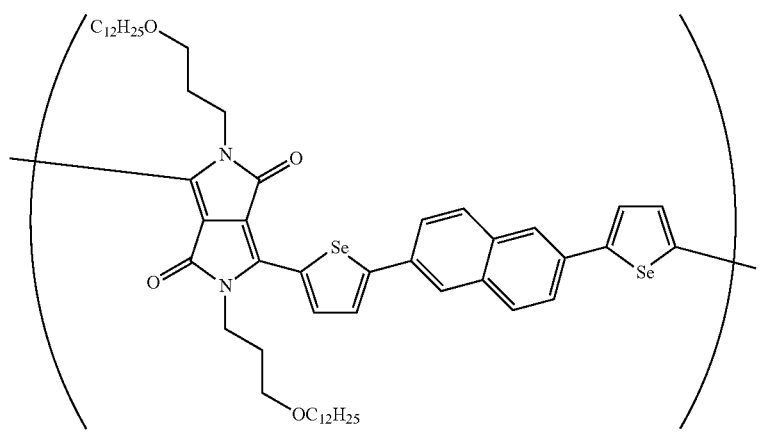
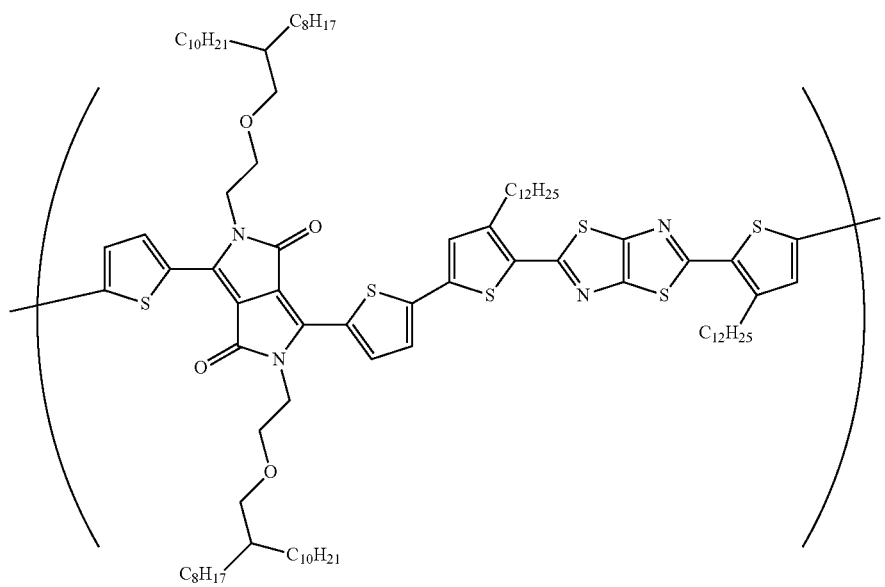

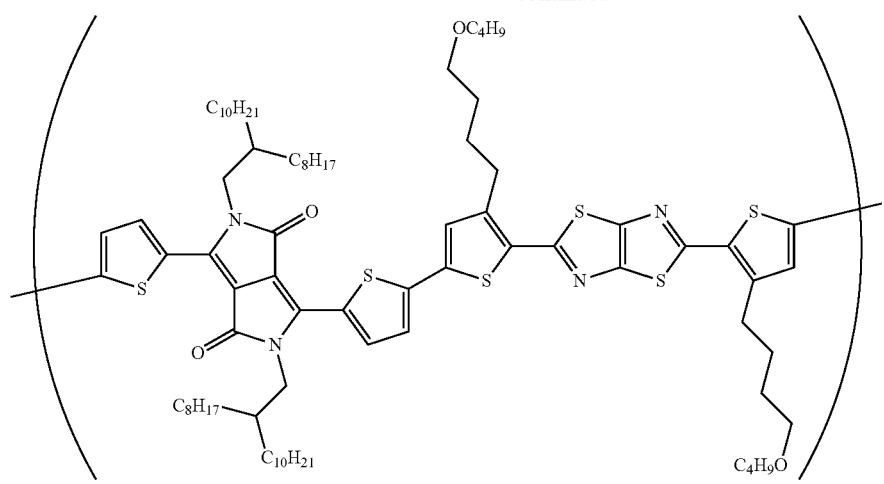
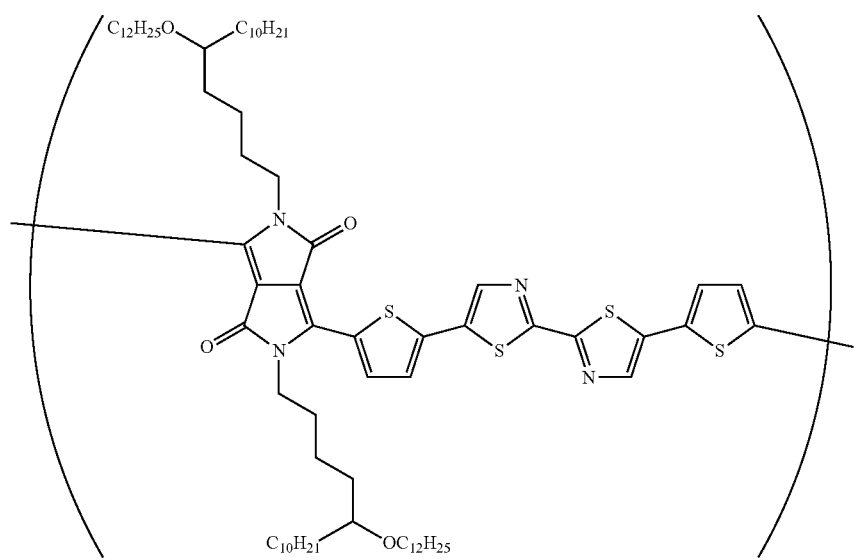
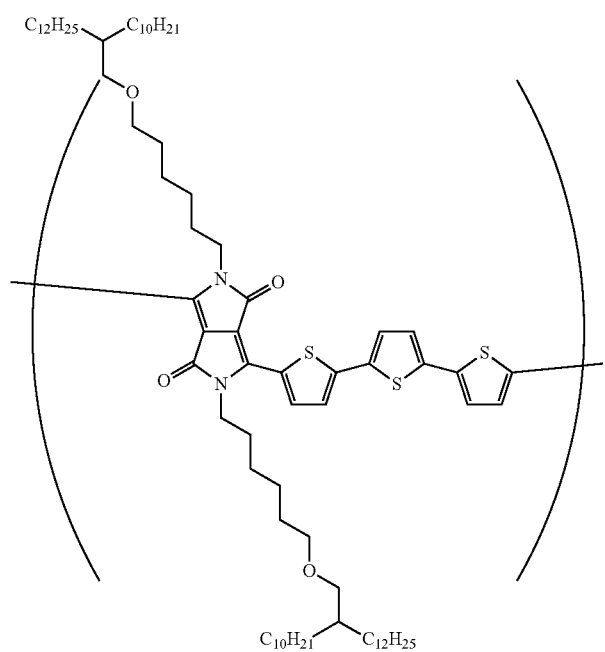

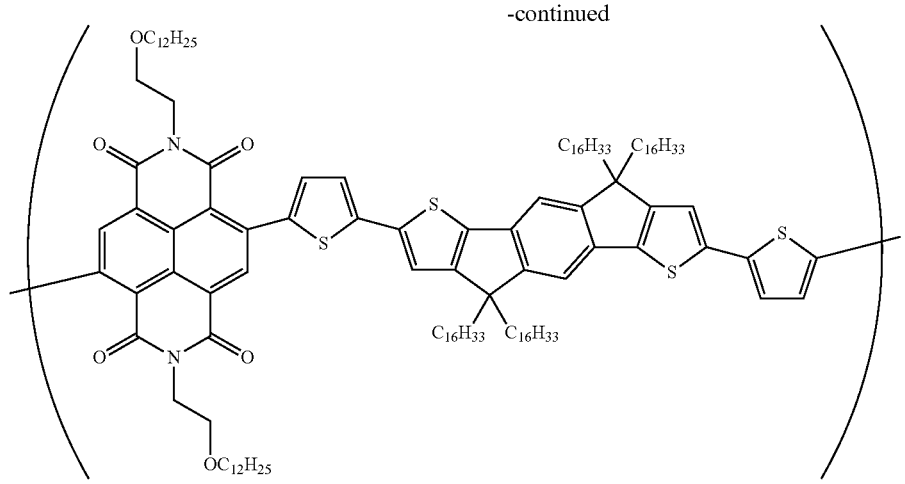
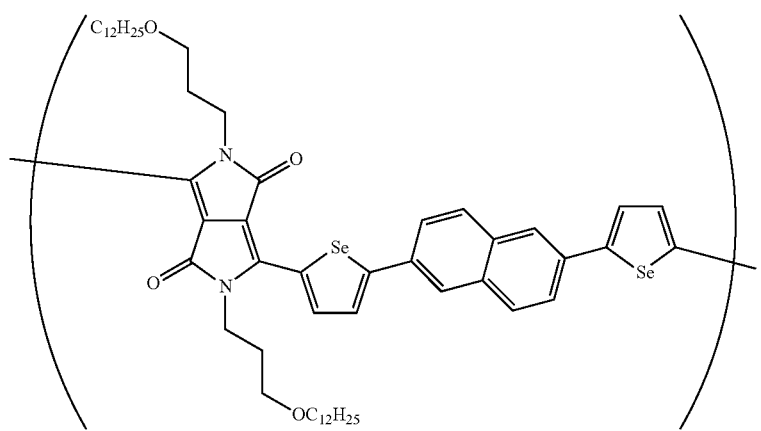
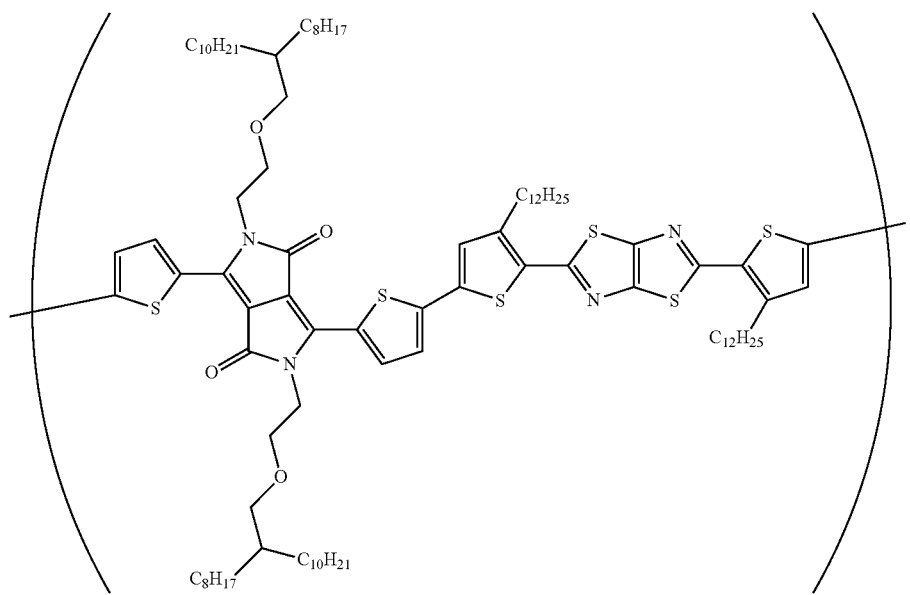

-continued
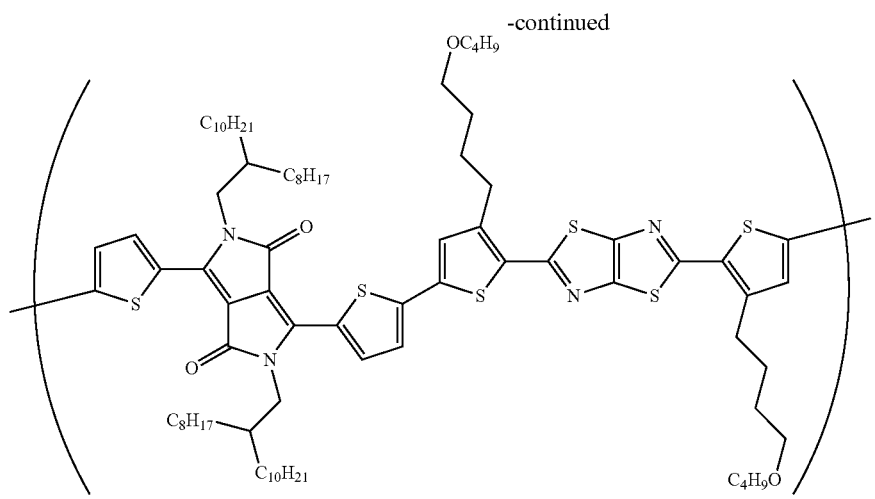
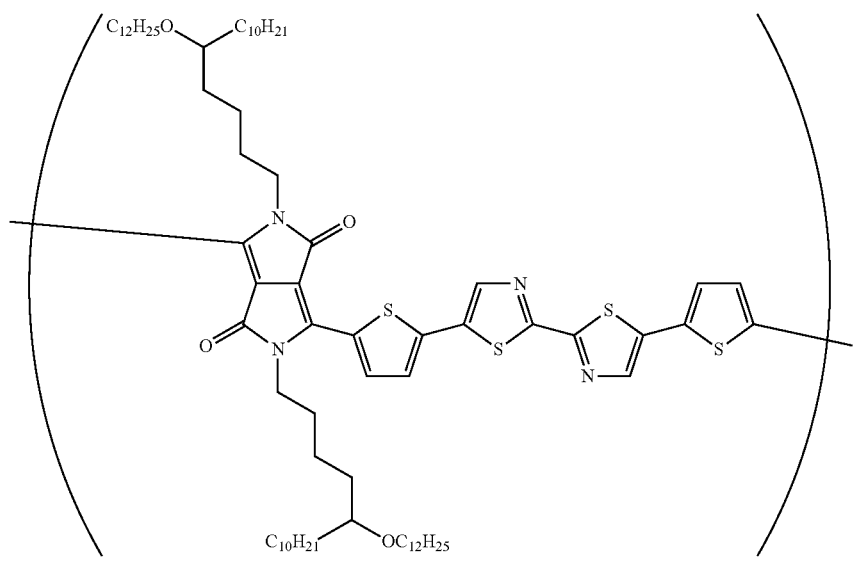
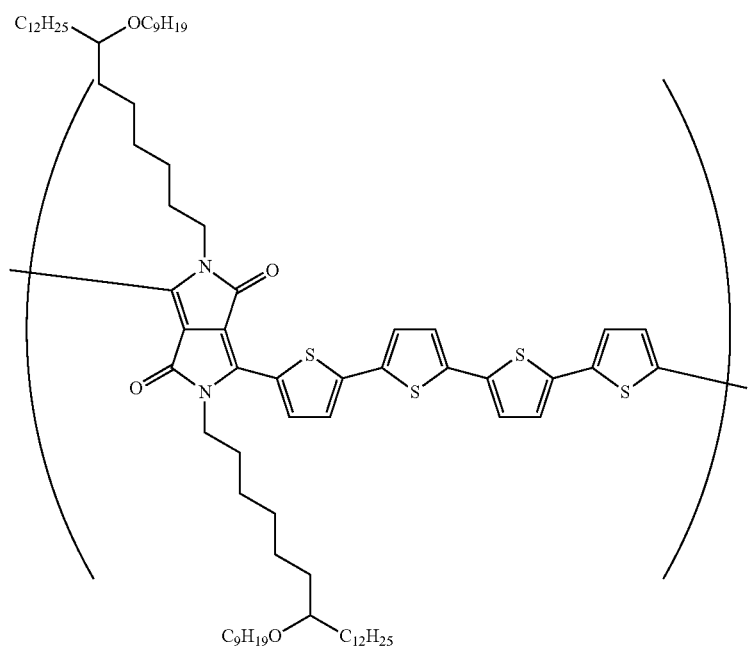

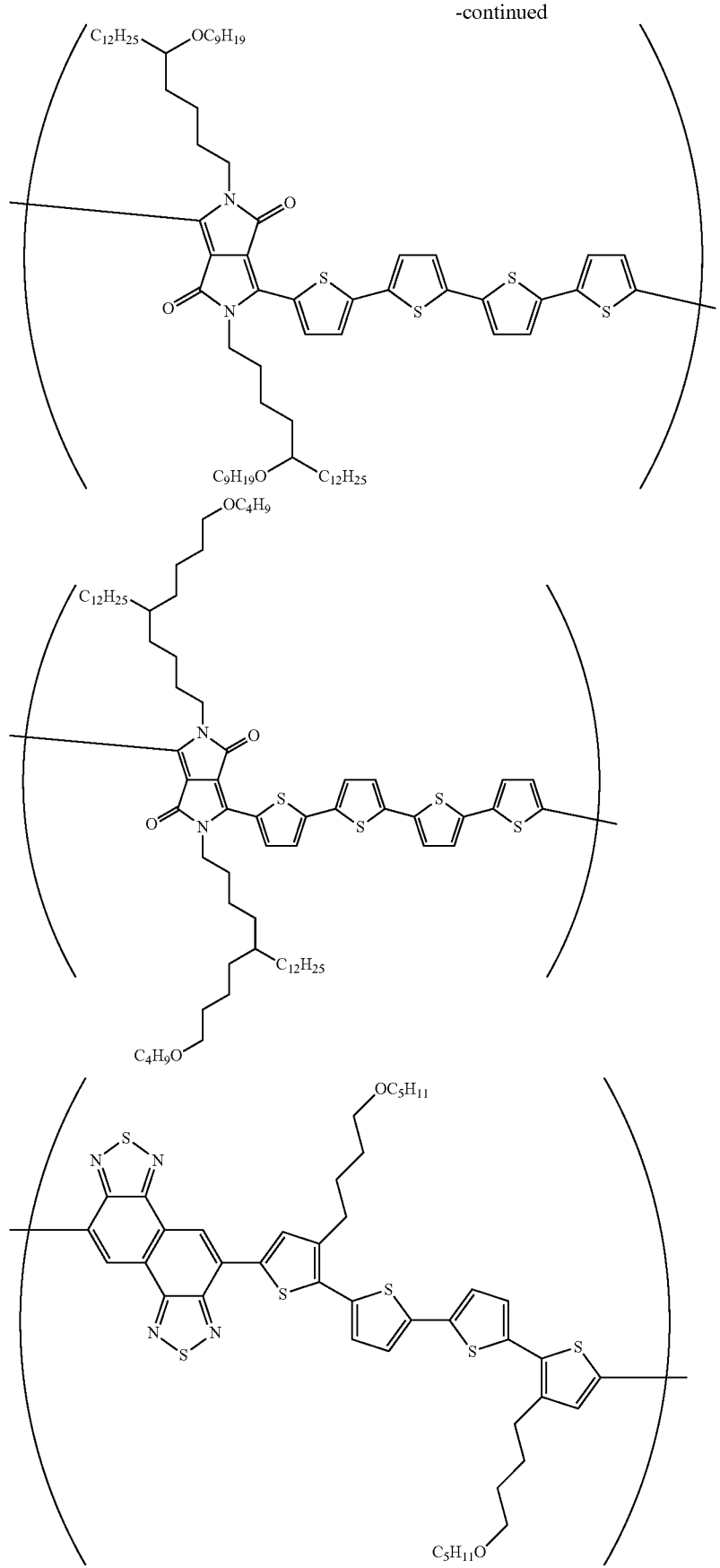

<Binder Polymer>

The organic semiconductor layer of the organic semiconductor element according to the present invention may contain the binder polymer.

The organic semiconductor element according to the present invention may be an organic semiconductor element having a layer (hereinafter, referred to as a "binder polymer layer") including the organic semiconductor layer and the binder polymer.

The types of the binder polymer are not particularly limited, and well-known binder polymers can be used.

Examples of the binder polymer include insulating polymers such as polystyrene, poly(α-methyl styrene), polyvinylcinnamate, poly(4-vinylphenyl), and poly(4-methyl styrene), polycarbonate, polyarylate, polyester, polyamide, polyimide, polyurethane, polysiloxane, polysulfone, polymethyl methacrylate, polymethyl acrylate, cellulose, polyethylene, and polypropylene, and copolymers thereof, a semiconductor polymer such as polysilane, polycarbazole, polyarylamine, polyfluorene, polythiophene, polypyrrole, polyaniline, polyparaphenylenevinylene, polyacene, and polyheteroacene, and copolymers thereof, and rubber, and a thermoplastic elastomer.

Among these, as the binder polymer, a polymer compound (a polymer having a monomer unit having a benzene ring group) having a benzene ring is preferable. The content of the monomer unit having a benzene ring group is not particularly limited. However, the content is preferably 50 mol % or greater, more preferably 70 mol % or greater, and even more preferably 90 mol % or greater with respect to the total monomer unit. The upper limit is not particularly limited, but examples of the upper limit include 100 mol %.

The binder polymer preferably includes an insulating polymer.

The insulating polymer is not particularly limited, as long as the insulating polymer exhibits insulating properties. The "insulating polymer" according to the present invention means a polymer having volume resistivity of $10^6$ Ωcm or greater. The volume resistivity is measured by using the following method.

[Method of Measuring Volume Resistivity]

A clear glass substrate in a square of 50 mm was coated with the polymer, so as to obtain a polymer film having a thickness of 1 μm. The volume resistivity of the obtained film was measured by using LORESTA GP MCP-T 610 type (Trade name, manufactured by Mitsubishi Materials Corporation).

According to the present invention, the fact that the organic semiconductor layer includes an insulating polymer can be checked by subjecting the organic semiconductor layer to the element mapping measurement by time-of-flight secondary ion mass spectrometry (TOF-SIMS) using etching ion beams in combination.

The insulating polymer is preferably a polymer including a constitutional unit represented by Formula I-1.

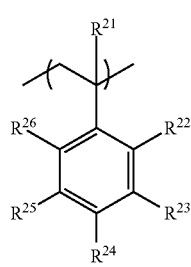

(I-1)

In Formula I-1, $R^{22}$ to $R^{26}$ each independently represent a hydrogen atom, a hydroxy group, an alkyl group, an alkoxy group, an alkenyl group, an alkynyl group, an aryl group, an aralkyl group, or a halogen atom, a ring may be formed by linking two of $R^{22}$ to $R^{26}$ that are adjacent to each other, and $R^{21}$ represents a hydrogen atom or an alkyl group.

$R^{22}$ to $R^{26}$ each independently and preferably represents a hydrogen atom, a hydroxy group, an alkyl group, an alkoxy group, an aryl group, and a halogen atom, more preferably represents a hydrogen atom, a hydroxy group, an alkyl group, and an alkoxy group, even more preferably represents a hydrogen atom and an alkyl group, and most preferably represents a hydrogen atom.

The alkyl group may have any one of a linear shape, a branched shape, and a circular shape, and a linear shape or branched shape is preferable.

The number of carbon atoms of the alkyl group is preferably 1 to 15, more preferably 1 to 8, and even more preferably 1 to 4.

The number of carbon atoms of the alkoxy group is preferably 1 to 15, more preferably 1 to 8, and even more preferably 1 to 4.

The number of carbon atoms of the alkenyl group is preferably 1 to 15, more preferably 1 to 8, and even more preferably 1 to 4.

The number of carbon atoms of the alkynyl group is preferably 1 to 15, more preferably 1 to 8, and even more preferably 1 to 4.

The number of carbon atoms of the aryl group is preferably 6 to 20 and more preferably 6 to 12.

The number of carbon atoms of the aralkyl group is preferably 7 to 21 and more preferably 7 to 15.

Two of $R^{22}$ to $R^{26}$ that are adjacent to each other may be linked to each other to form a ring. Examples of the formed ring include an aromatic ring, and a benzene ring is preferable.

$R^{21}$ represents a hydrogen atom or an alkyl group (a methyl group, an ethyl group, and the like), and a hydrogen atom is preferable.

The halogen atom is preferably a fluorine atom.

The content of the polymer including a constitutional unit represented by Formula I-1 is preferably 50 mass % or greater, more preferably 80 mass % or greater, and even more preferably 90 mass % or greater with respect to the total mass of the polymer including the constitutional unit represented by Formula I-1 including the constitutional unit represented by Formula I-1.

The insulating polymer including the constitutional unit represented by Formula I-1 is preferably an insulating polymer including a constitutional unit represented by Formula I-1, a copolymer in which a repeating unit of a polymer consists of a constitutional unit represented by Formula I-1 only, or a homopolymer consisting of a constitutional unit represented by Formula I-1 only, more preferably a copolymer in which a repeating unit of a polymer consists of a constitutional unit represented by Formula I-1 only or a homopolymer consisting of a constitutional unit represented by Formula I-1 only, and even more preferably a homopolymer consisting of a constitutional unit represented by Formula I-1 only.

A weight-average molecular weight of the binder polymer is not particularly limited, but is preferably 1,000 to 2,000,000, more preferably 1,500 to 1,000,000, even more preferably 3,000 to 1,000,000, still even more preferably 2,500 to 200,000, and most preferably 20,000 to 150,000.

The polydispersity (weight-average molecular weight/number-average molecular weight) of the binder polymer is preferably 2.5 or less, more preferably 1.5 or less, and even more preferably 1.1 or less.

The weight-average molecular weight (Mw) and the number-average molecular weight (Mn) of the above binder polymer can be measured in terms of standard polystyrene, by using gel permeation chromatography (GPC, manufactured by Tosoh Corporation; HLC-8120; Tskgel Multipore HXL-M) and using tetrahydrofuran (THF) as a solvent.

In a case where a solvent described below is used, it is preferable that the binder polymer exhibits solubility higher than the solubility of the specific compound in a used solvent. If the above aspect is adopted, mobility of the obtained organic semiconductor and temporal stability under high temperature and high humidity are improved.

A content of the binder polymer in the organic semiconductor layer of the organic semiconductor element of the present invention is preferably 1 to 200 parts by mass, more preferably 10 to 150 parts by mass, and even more preferably 20 to 120 parts by mass with respect to 100 parts by mass of the content of the specific compound. If the content is within the above range, mobility and temporal stability under high temperature and high humidity of the obtained organic semiconductor are further improved.

<Other Components>

Other components may be included other than the specific compound and the binder polymer may be included in the organic semiconductor layer according to the organic semiconductor element of the present invention.

As other components, well-known additives and the like can be used.

In the organic semiconductor layer of the present invention, a content of the components other than the specific compound and the binder polymer is preferably equal to or less than 10 mass %, more preferably equal to or less than 5 mass %, even more preferably equal to or less than 1 mass %, and particularly preferably equal to or less than 0.1 mass %. If the content of other components is within the above range, film formability is improved, and mobility and temporal stability under high temperature and high humidity of the obtained organic semiconductor are further improved.

<Method of Forming Organic Semiconductor Layer>

The method of forming the organic semiconductor layer according to the organic semiconductor element of the present invention is not particularly limited. However, a desired organic semiconductor layer can be formed by applying the organic semiconductor composition according to the present invention described below to a source electrode, a drain electrode, and a gate insulating film and performing a drying treatment, if necessary.

The organic semiconductor element of the present invention is preferably manufactured by using the organic semiconductor composition of the present invention described below.

A method of manufacturing an organic semiconductor film or an organic semiconductor element by using the organic semiconductor composition of the present invention is not particularly limited, and known methods can be adopted. Examples thereof include a method of manufacturing an organic semiconductor film by applying the composition onto a predetermined base material and if necessary, performing a drying treatment.

The method of applying the composition onto a base material is not particularly limited, and known methods can be adopted. Examples thereof include an ink jet printing method, a screen printing method, a flexographic printing method, a bar coating method, a spin coating method, a knife coating method, a doctor blade method, and the like. An ink jet printing method, a flexographic printing method, and a screen printing method are preferable.

Preferred examples of the flexographic printing method include an aspect in which a photosensitive resin plate is used as a flexographic printing plate. By printing the composition onto a substrate according to the aspect, a pattern can be easily formed.

Among the above methods, the method of manufacturing an organic semiconductor element of the present invention preferably includes a coating step of coating a substrate with the organic semiconductor composition of the present invention described below and more preferably includes a coating step of coating a substrate with the organic semiconductor composition of the present invention and a removing step of removing the solvent from the composition with which the substrate is coated.

The coating step is more preferably a coating step of coating a gate insulating film with the organic semiconductor composition according to the present invention further containing an insulating polymer including a constitutional unit represented by Formula I-1 in which the surface energy is 50 to 75 mNm$^{-1}$.

According to the aspect, it is possible to obtain an organic semiconductor element including an insulating polymer including a constitutional unit represented by Formula I-1 in an organic semiconductor layer and further including a gate insulating film in which the surface energy is 50 to 75 mNm$^{-1}$.

The organic semiconductor element is an organic semiconductor element having high mobility.

The organic semiconductor composition according to the present invention described below includes a solvent and preferably includes an organic solvent.

As the solvent, well-known solvents can be used.

Specific examples thereof include a hydrocarbon-based solvent such as hexane, octane, decane, toluene, xylene, mesitylene, ethylbenzene, amylbenzene, decalin, 1-methylnaphthalene, 1-ethylnaphthalene, 1,6-dimethylnaphthalene, and tetralin, a ketone-based solvent such as acetone, methyl ethyl ketone, methyl isobutyl ketone, cyclohexanone, acetophenone, propiophenone, butyrophenone, α-tetralone, and β-tetralone, a halogenated hydrocarbon-based solvent such as dichloromethane, chloroform, tetrachloromethane, dichloroethane, trichloroethane, tetrachloroethane, chlorobenzene, 1,2-dichlorobenzene, 1,2,4-trichlorobenzene, chlorotoluene, and 1-fluoronaphthalene, a heterocyclic solvent such as pyridine, picoline, quinoline, thiophene, 3-butyl thiophene, and thieno [2,3-b] thiophene, a halogenated heterocyclic solvent such as 2-chlorothiophene, 3-chlorothiophene, 2, 5-dichlorothiophene, 3,4-dichlorothiophene, 2-bromothiophene, 3-bromothiophene, 2,3-dibromothiophene, 2,4-dibromothiophene, 2,5-dibromothiophene, 3,4-dibromothiophene, and 3,4-dichloro-1,2,5-thiadiazole, an ester-based solvent such as ethyl acetate, butyl acetate, amyl acetate, 2-ethylhexyl acetate, γ-butyrolactone, and phenyl acetate, an alcohol-based solvent such as methanol, propanol, butanol, pentanol, hexanol, cyclohexanol, methyl cellosolve, ethyl cellosolve, and ethylene glycol, an ether solvent such as dibutyl ether, tetrahydrofuran, dioxane, anisole, ethoxybenzene, propoxybenzene, isopropoxybenzene, butoxybenzene, 2-methylanisole, 3-methylanisole, 4-methylanisole, 4-ethylanisole, dimethyl anisole (any one of 2,3-, 2,4-, 2,5-, 2,6-, 3,4-, 3,5-, and 3,6-), 1,4-benzodioxane, 2,3-dihydrobenzofuran, phthalane, chroman, and isochroman, an amide-imide-based solvent such as N,N-dimethylformamide, N,N-dimethylacetamide, 1-methyl-2-pyrrolidone, 1-methyl-2-imidazolidinone, and 1,3-dimethyl-2-imidazolidinone, a sulfoxide-based solvent such as dimethylsulfoxide, a phosphate ester-based solvent such as trimethyl phosphate, a nitrile-based solvent such as acetonitrile and benzonitrile, and a nitro-based solvent such as nitromethane and nitrobenzene.

The solvent may be used singly or two or more types thereof may be used in combination.

Among these, a hydrocarbon-based solvent, a ketone-based solvent, a halogenated hydrocarbon-based solvent, a heterocyclic solvent, a halogenated heterocyclic solvent, or an ether-based solvent are preferable, toluene, xylene, mesitylene, amylbenzene, tetralin, acetophenone, propiophenone, butyrophenone, α-tetralone, dichlorobenzene, anisole, ethoxybenzene, propoxybenzene, isopropoxybenzene, butoxybenzene, 2-methylanisole, 3-methylanisole, 4-methylanisole, 2,3-dihydrobenzofuran, phthalane, chroman, isochroman, 1-fluoronaphthalene, 3-chlorothiophene, and 2,5-dibromothiophene are more preferable, and toluene, xylene, tetralin, acetophenone, propiophenone, butyrophenone, α-tetralone, anisole, ethoxybenzene, propoxybenzene, butoxybenzene, 2-methylanisole, 3-methylanisole, 4-methylanisole, 2,3-dihydrobenzofuran, phthalane, chroman, isochroman, 1-fluoronaphthalene, 3-chlorothiophene, and 2,5-dibromothiophene are particularly preferable.

The boiling point of the solvent is preferably 100° C. or greater, in view of film formability. The boiling point of the solvent is more preferably 100° C. to 300° C., even more preferably 125° C. to 250° C., and particularly preferably 150° C. to 225° C.

It is preferable that a boiling point of the solvent of which the content is the greatest is 100° C. or greater and, it is more preferable that a boiling point of the total solvent is 100° C. or greater.

In a case where the solvent is contained, the content of the specific compound according to organic semiconductor composition of the present invention is preferably 0.01 to 50 mass %, more preferably 0.02 to 25 mass %, even more preferably 0.05 to 15 mass %, and particularly preferably 0.1 to 10 mass %. In a case where a binder polymer is contained, the content of the binder polymer is preferably 0.01 to 50 mass %, more preferably 0.05 to 25 mass %, and even more preferably 0.1 to 10 mass %. If the content is in the range above, the coating properties are excellent, and the organic semiconductor film can be easily formed.

The drying treatment in the removing step is a treatment performed if necessary, and the optimal treatment conditions are appropriately selected according to the type of the specific compound used and the solvent. In view of further improving mobility and temporal stability under high temperature and high humidity of the obtained organic semiconductor and improving productivity, a heating temperature is preferably 30° C. to 100° C. and more preferably 40° C. to 80° C., and a heating time is preferably 10 to 300 minutes and more preferably 30 to 180 minutes.

The organic semiconductor device composition according to the present invention may contain additives such as a surfactant, an antioxidant, a crystallization controlling agent, and a crystal alignment control agent, in addition to a polymer binder.

The surfactant is not particularly limited, and examples thereof include a nonionic surfactant such as polyoxyethylene alkyl ethers, polyoxyethylene alkyl allyl ethers, polyoxyethylene polyoxypropylene block copolymers, sorbitan fatty acid esters, and polyoxyethylene sorbitan fatty acid ester, a fluorine-based surfactant such as MEGAFACE F171 and F176 (manufactured by DIC Corporation), FLUORAD FC430 (manufactured by Sumitomo 3M Co., Ltd.), SUFYNOL E1004 (manufactured by Asahi Glass Co., Ltd.), and PF656 and PF6320 manufactured by OMNOVA Solutions Inc., and an organosiloxane polymer such as a polysiloxane polymer KP-341 (manufactured by Shin-Etsu Chemical Co., Ltd.), KF-410 (manufactured by Shin-Etsu Chemical Co., Ltd.), KF-412 (manufactured by Shin-Etsu Chemical Co., Ltd.), KF-96-100cs (manufactured by Shin-Etsu Chemical Co., Ltd.), BYK-322 (manufactured by BYK Japan KK), and BYK-323 (manufactured by BYK Japan KK).

The content of the surfactant is preferably about 0.001 to about 1 mass % in the coating liquid.

Examples of the antioxidant include a phenol-based antioxidant, a phosphorus-based antioxidant, and a sulfur-based antioxidant.

Specific examples of the phenol-based antioxidant include 2,6-di-t-butyl-4-methylphenol, n-octadecyl-3-(3',5'-di-t-butyl-4'-hydroxyphenyl) propionate, tetrakis[methylene-3-(3,5-di-t-butyl-4-hydroxyphenyl) propionate] methane, tris(3,5-di-t-butyl-4-hydroxybenzyl) isocyanurate, 4,4'-butylidene bis-(3-methyl-6-t-butylphenol), triethylene glycol bis[3-(3-t-butyl-4-hydroxy-5-methylphenyl) propionate], 3,9-bis {2-[3-(3-t-butyl-4-hydroxy-5-methylphenyl) propionyloxy]-1,1-dimethylethyl}-2,4,8,10-tetraoxaspiro[5,5]undecane.

Examples of the commercially available products of the phenol-based antioxidant include IRGANOX 1010, IRGANOX 1035, IRGANOX 1076, IRGANOX 1135, IRGANOX 245, IRGANOX 259, IRGANOX 295, and IRGANOX 3114 (hereinafter, all are manufactured by BASF SE), ADEKA STAB AO-20, ADEKA STAB AO-30, ADEKA STAB AO-40, ADEKA STAB AO-50, ADEKA STAB AO-60, ADEKA STAB AO-70, ADEKA STAB AO-80, ADEKA STAB AO-90, and ADEKA STAB AO-330 (hereinafter, all are manufactured by ADEKA Corporation), SUMILIZER BHT, SUMILIZER BP-101, SUMILIZER GA-80, SUMILIZER MDP-S, SUMILIZER BBM-S, SUMILIZER GM, SUMILIZER GS(F), and SUMILIZER GP (hereinafter, all are manufactured by Sumitomo Chemical Co., Ltd.), HOSTANOX O10, HOSTANOX O16, HOSTANOX O14, and HOSTANOX O3 (hereinafter, all are manufactured by Clariant SE), ANTAGE BHT, ANTAGE W-300, ANTAGE W-400, and ANTAGE W500 (hereinafter, all are manufactured by Kawaguchi Chemical Industry Co., Ltd.), and SEENOX 224M, and SEENOX 326M (hereinafter, all are manufactured by Shipro Kasei Kaisha, Ltd.), YOSHINOX BHT, YOSHINOX BB, TOMINOX TT and TOMINOX 917 (hereinafter, all are manufactured by Mitsubishi Chemical Holdings Corporation), and TTHP (manufactured by Toray Industries, Inc.).

Specific examples of the phosphorus-based antioxidant include trisnonylphenyl phosphite, tris(2,4-di-t-butylphenyl) phosphite, distearyl pentaerythritol diphosphite, bis(2,4-di-t-butylphenyl) pentaerythritol phosphite, bis(2,6-di-t-butyl-4-methylphenyl) pentaerythritol phosphite, 2,2-methylene bis(4,6-di-t-butylphenyl) octyl phosphite, and tetrakis(2,4-di-t-butylphenyl)-4,4-biphenylene-di-phosphonite.

Examples of the commercially available products of the phosphorus-based antioxidant include ADEKA STAB 1178 (manufactured by ADEKA Corporation), SUMILIZER TNP (manufactured by Sumitomo Chemical Co., Ltd.), JP-135 (manufactured by Johoku Chemical Co., Ltd.), ADEKA STAB 2112 (manufactured by ADEKA Corporation), JPP-2000 (manufactured by Johoku Chemical Co., Ltd.), Weston 618 (manufactured by GE), ADEKA STAB PEP-24G (manufactured by ADEKA Corporation), ADEKA STAB PEP-36 (manufactured by ADEKA Corporation), ADEKA STAB HP-10 (manufactured by ADEKA Corporation), Sandstab P-EPQ (manufactured by Sand Co., Ltd.), PHOSPHITE 168 (manufactured by BASF SE).

Specific examples of the sulfur-based antioxidant include dilauryl-3,3'-thiodipropionate, dimyristyl-3,3'-thiodipropionate, distearyl-3,3'-thiodipropionate, and pentaerythritol tetrakis(3-lauryl thiopropionate). Examples of the commercially available products of the sulfur-based antioxidant include SUMILIZER TPL (manufactured by Sumitomo Chemical Co., Ltd.), YOSHINOX DLTP (manufactured by Mitsubishi Chemical Holdings Corporation), ANTIOX L (manufactured by NOF Corporation), SUMILIZER TPM (manufactured by Sumitomo Chemical Co., Ltd.), YOSHINOX DMTP (manufactured by Mitsubishi Chemical Holdings Corporation), ANTIOX M (manufactured by NOF Corporation), SUMILIZER TPS (manufactured by Sumitomo Chemical Co., Ltd.), YOSHINOX DSTP (manufactured by Mitsubishi Chemical Holdings Corporation), ANTIOX S (manufactured by NOF Corporation), ADEKA STAB AO-412S (manufactured by ADEKA Corporation), SEENOX 412S (manufactured by Shipro Kasei Kaisha, Ltd.), and SUMILIZER TDP (manufactured by Sumitomo Chemical Co., Ltd.).

The content of the antioxidant is preferably about 0.01 to about 5 mass % in the coating liquid.

A film thickness of the formed organic semiconductor layer is not particularly limited. From the viewpoint of mobility and temporal stability under high temperature and high humidity of the obtained organic semiconductor, the film thickness is preferably 10 to 500 nm and more preferably 30 to 200 nm.

After coating with the organic semiconductor composition according to the present invention, it is preferable that the formed organic semiconductor film is subjected to heating annealing. The annealing temperature is suitably optimized depending on the substrate used, but is preferably 80° C. to 300° C., more preferably 120° C. to 250° C., and even more preferably 150° C. to 200° C. According to the heating annealing, it is considered that the substituent represented by Formula 1-1 which is a flexible substituent is re-arranged, and thus it is assumed that more excellent film quality (morphology) is formed. As a result, it is possible to obtain an organic semiconductor film in which mobility is high, variation of mobility is suppressed, and temporal stability under high temperature and high humidity is excellent.

The organic semiconductor element is not particularly limited, but is preferably an organic semiconductor element having 2 to 5 terminals, and more preferably an organic semiconductor element having 2 or 3 terminals.

It is preferable that the organic semiconductor element is not a photoelectric conversion element.

The organic semiconductor element according to the present invention is preferably a non-luminous organic semiconductor element.

Examples of a 2-terminal element include a rectifier diode, a constant voltage diode, a PIN diode, a Schottky barrier diode, a surge protection diode, a diac, a varistor, a tunnel diode, and the like.

Examples of a 3-terminal element include a bipolar transistor, a Darlington transistor, a field effect transistor, insulated gate bipolar transistor, a uni-junction transistor, a static induction transistor, a gate turn thyristor, a triac, a static induction thyristor, and the like.

Among these, a rectifier diode and transistors are preferable, and a field effect transistor is more preferable.

As the field effect transistor, an organic thin film transistor is preferable.

An aspect of the organic thin film transistor according to the present invention will be described with reference to a drawing.

FIG. 1 is a schematic cross-sectional view of an aspect of an organic semiconductor element (organic thin film transistor (organic TFT)) of the present invention.

In FIG. 1, an organic thin film transistor 100 comprises a substrate 10, a gate electrode 20 disposed on the substrate 10, a gate insulating film 30 covering the gate electrode 20, a source electrode 40 and a drain electrode 42 which contact a surface of the gate insulating film 30 that is on the side opposite to the gate electrode 20 side, an organic semiconductor film 50 covering a surface of the gate insulating film 30 between the source electrode 40 and the drain electrode 42, and a sealing layer 60 covering each member. The organic thin film transistor 100 is a bottom gate-bottom contact type organic thin film transistor.

In FIG. 1, the organic semiconductor film 50 corresponds to a film formed of the composition described above.

Hereinafter, the substrate, the gate electrode, the gate insulating film, the source electrode, the drain electrode, the organic semiconductor film, the sealing layer, and a method of forming each of these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoint of applicability to each device and costs, a glass substrate or a plastic substrate is preferable.

Examples of materials of the plastic substrate include a thermosetting resin (for example, an epoxy resin, a phenol resin, a polyimide resin, or a polyester resin (for example, polyethylene terephthalate (PET) or polyethylene naphthalate (PEN)) and a thermoplastic resin (for example, a phenoxy resin, a polyethersulfone, polysulfone, or polyphenylene sulfone).

Examples of materials of the ceramic substrate include alumina, aluminum nitride, zirconia, silicon, silicon nitride, silicon carbide, and the like.

Examples of materials of the glass substrate include soda lime glass, potash glass, borosilicate glass, quartz glass, aluminosilicate glass, lead glass, and the like.

<Gate Electrode, Source Electrode, and Drain Electrode>

Examples of materials of the gate electrode, the source electrode, and the drain electrode include a metal such as gold (Au), silver, aluminum (Al), copper, chromium, nickel, cobalt, titanium, platinum, tantalum, magnesium, calcium, barium, or sodium; a conductive oxide such as $InO_2$, $SnO_2$, or indium tin oxide (ITO); a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, or graphite; and the like. Among these, a metal is preferable, and silver and aluminum are more preferable.

A thickness of each of the gate electrode, the source electrode, and the drain electrode is not particularly limited, but is preferably 20 to 200 nm.

A method of forming the gate electrode, the source electrode, and the drain electrode is not particularly limited, but examples thereof include a method of vacuum vapor-depositing or sputtering an electrode material onto a substrate, a method of coating a substrate with a composition for forming an electrode, a method of printing a composition for forming an electrode onto a substrate, and the like. Furthermore, in a case where the electrode is patterned, examples of the patterning method include a photolithography method; a printing method such as ink jet printing, screen printing, offset printing, or relief printing; a mask vapor deposition method; and the like.

<Gate Insulating Film>

The gate insulating film is not particularly limited, as long as the gate insulating film is a film provided between a gate electrode and an organic semiconductor layer and having insulating properties. The gate insulating film may be a film of a single layer or may be a film of multi layers.

The gate insulating film is preferably formed of insulating materials. Examples of the insulating materials preferably include an organic material such as an organic polymer and an inorganic material such as inorganic oxide. In view of handleability, it is preferable that an organic material is used.

The organic polymer, the inorganic oxide, and the like are not particularly limited, as long as the organic polymer, the inorganic oxide, and the like have insulating properties. It is preferable to form a thin film, for example, a thin film having a thickness of 1 μm or less.

The organic polymer and the inorganic oxide may be used singly or two or more kinds thereof may be used in combination. The gate insulating film may be a hybrid layer in which an organic polymer described below and inorganic oxide described below is mixed.

The organic polymer is not particularly limited. Examples thereof include poly(meth)acrylate represented by polyvinyl phenol, polystyrene (PS), and polymethyl methacrylate, a cyclic fluoroalkyl polymer represented by polyvinyl alcohol, polyvinyl chloride (PVC), polyvinylidene fluoride (PVDF), polytetrafluoroethylene (PTFE), and CYTOP, polyorganosiloxane represented by polycycloolefin, polyester, polyethersulfone, polyether ketone, polyimide, poly (meth) acrylic acid, polybenzoxazole, an epoxy resin, and polydimethylsiloxane (PDMS), polysilsesquioxane, and butadiene rubber. In addition to the above, examples thereof include a thermosetting resin such as a phenol resin, a novolak resin, a cinnamate resin, an acrylic resin, and a polyparaxylylene resin.

The organic polymer may be used in combination with a compound having a reactive substituent such as an alkoxysilyl group, a vinyl group, an acryloyloxy group, an epoxy group, and a methylol group.

In a case where the gate insulating film is formed of an organic polymer, for the purpose of increasing solvent resistance and insulation resistance of the gate insulating film, or the like, it is preferable that an organic polymer is crosslinked and cured. The crosslinking is preferably performed by using light, heat, or both, so as to generate acid or radical.

In a case where crosslinking is performed with a radical, as a radical generating agent that generates radicals by light or heat, for example, thermal polymerization initiators (H1) and photopolymerization initiators (H2) disclosed in paragraphs 0182 to 0186 of JP2013-214649A, photoradical generating agents disclosed in paragraphs 0046 to 0051 of JP2011-186069A, photoradical polymerization initiators disclosed in paragraphs 0042 to 0056 of JP2010-285518A can be suitably used, and the contents thereof are preferably incorporated in this specification.

The "compound (G) having number-average molecular weight (Mn) of 140 to 5,000, having crosslinking functional groups, and not having a fluorine atom" disclosed in 0167 to 0177 of JP2013-214649A is preferably used, and the contents thereof are preferably incorporated to this specification.

In a case where crosslinking is performed with acid, as a photoacid generator that generates acid by light, for example, photocationic polymerization initiators disclosed in paragraphs 0033 to 0034 of JP2010-285518A, acid generators disclosed in paragraphs 0120 to 0136 of JP2012-163946A can be used, particularly, sulfonium salt and iodonium salt can be preferably used, and the contents thereof are preferably incorporated in this specification.

As a thermal acid generator (catalyst) that generates acid by heat, for example, thermal cation polymerization initiators and particularly onium salts disclosed in paragraphs 0035 to 0038 of JP2010-285518A, catalysts disclosed in paragraphs 0034 to 0035 of JP2005-354012A, particularly, sulfonic acids and sulfonic acid amine salts preferably can be used, and the contents thereof are preferably incorporated to this specification.

Crosslinking agents, particularly difunctional or higher epoxy compounds and oxetane compounds disclosed in paragraphs 0032 to 0033 of JP2005-354012A, crosslinking agents, particularly compounds, each of which has two or more crosslinking groups and in which at least one of these crosslinking groups is a methylol group or an NH group, disclosed in paragraphs 0046 to 0062 of JP2006-303465A, and compounds, each of which has two or more of hydroxymethyl groups or alkoxymethyl groups in a molecule, disclosed in paragraphs 0137 to 0145 of JP2012-163946A, are preferably used, and the contents thereof are preferably incorporated in this specification.

Examples of the method forming a gate insulating film with an organic polymer include a step of coating and curing the organic polymer. The coating method is not particularly limited, and examples thereof include the above printing methods. Among these, a wet coating method such as a micro gravure coating method, a dip coating method, a screen coating printing, a die coating method, or a spin coating method is preferable.

The inorganic oxide is not particularly limited, and examples thereof include oxide such as silicon oxide, silicon nitride ($SiN_y$), hafnium oxide, titanium oxide, tantalum oxide, aluminum oxide, niobium oxide, zirconium oxide, copper oxide, and nickel oxide, perovskite such as $SrTiO_3$, $CaTiO_3$, $BaTiO_3$, $MgTiO_3$, and $SrNb_2O_6$, or composite oxide or mixture of these. Here, examples of silicon oxide include boron phosphorus silicon glass (BPSG), phosphorus silicon glass (PSG), borosilicate glass (BSG), arsenic silicate glass (AsSG), lead silicate glass (PbSG), silicon oxynitride (SiON), spin-on-glass (SOG), low dielectric constant $SiO_2$-based materials (for example, polyaryl ether, cycloperfluorocarbon polymer and benzocyclobutene, cyclic fluororesin, polytetrafluoroethylene, fluoroaryl ether, fluorinated polyimide, amorphous carbon, and organic SOG), in addition to silicon oxide (SiOx).

As the method of forming a gate insulating film with inorganic oxide, for example, a vacuum film forming method such as a vacuum deposition method, a sputtering method, ion plating, or a chemical vapor deposition (CVD) method can be used, and it is possible to perform assistance from plasma, an ion gun, a radical gun, and the like, by using arbitrary gas at the time of forming a film.

A film may be performed by causing a precursor corresponding to each of the metal oxide, specifically, metal halides such as chlorides and bromides, metal alkoxide, and metal hydroxide, to react with an acid such as hydrochloric acid, sulfuric acid, and nitric acid and a base such as sodium hydroxide or potassium hydroxide in alcohol or water so as to perform hydrolysis. In a case where such a solution-based process is used, a wet-coating method can be used.

In addition to the above method, the gate insulating film can be prepared by combining any one of a lift-off method, a sol-gel method, an electrodeposition method, and shadow mask method, with a patterning method, if necessary.

The gate insulating film may be subjected to a surface treatment such as a corona treatment, a plasma treatment, and an ultraviolet (UV)/ozone treatment. However, in this case, it is preferable not to cause surface roughness to be coarse by the treatment. The arithmetic average roughness Ra or root mean square roughness $R_{MS}$ of the gate insulating film surface is preferably 0.5 nm or less.

As the method of adjusting surface energy of the insulating film, an ultraviolet (UV)/ozone treatment is effective, and it is possible to hydrophilize a gate insulating film surface by appropriately selecting the treatment time.

In a case where the organic semiconductor element according to the present invention includes an insulating polymer including a constitutional unit represented by Formula I-1 in the organic semiconductor layer, it is preferable to further include a gate insulating film having the surface energy of 50 to 75 mNm$^{-1}$.

The surface energy can be obtained by a well-known method, by measuring a contact angle of a film consisting of a resin (C) in both water and an organic solvent (glycerin and diiodomethane are mainly used) and substituting the contact angle to the Owens's equation (the following refers to a case where glycerin (gly) is used in an organic solvent).

Owens's Equation $$1+\cos\theta_{H2O}=2(\gamma_s^d)^{1/2}(\gamma_{H2O}^d)^{1/2}/\gamma_{H2O,V}+2(\gamma_s^h)^{1/2}(\gamma_{H2O}^h)^{1/2}/\gamma_{H2O,V}$$

$$1+\cos\theta_{gly}=2(\gamma_s^d)^{1/2}(\gamma_{gly}^d)^{1/2}/\gamma_{gly,V}+2(\gamma_s^h)^{1/2}(\gamma_{gly}^h)^{1/2}/\gamma_{gly,V}$$

Here, if measured values in the literature of $\gamma_{H2O}^d=21.8$, $\gamma_{gly}^d=37.0$, $\gamma_{H2O}^h=51.0$, $\gamma_{gly}^h=26.4$, $\gamma_{H2O,V}=72.8$, and $\gamma_{gly,V}=63.4$ are substituted, a measured value of a contact angle of water is substituted with $\theta_{H2O}$, a measured value of a contact angle of glycerine is substituted with $\theta_{gly}$, a dispersion power component $\gamma_s^d$ of the surface energy and a polar component $\gamma_s^h$ are obtained, and thus the sum of these components $\gamma_s^{Vh}=\gamma_s^d+\gamma_s^h$ can be obtained as surface energy (mNm$^{-1}$).

The present inventors have found that it is possible to effectively increase carrier mobility of the obtained organic thin film transistor by causing the organic semiconductor element according to the present invention to include an insulating polymer including a constitutional unit represented by Formula I-1 and further including a gate insulating film having surface energy of 50 to 75 mNm$^{-1}$.

Specific mechanism thereof is not clear, but it is considered that it is because it is possible to increase array regularity of the organic semiconductor compound by causing the organic semiconductor compound and the specific insulating polymer to coexist in the organic semiconductor layer, compared with the case of an existence of the organic semiconductor compound singly. According to this increase of the array regularity, carrier diffusion generated due to fluctuation of the structure in the main chain of the organic semiconductor compound is suppressed, or popping of carriers between polymer chains of the organic semiconductor compound is improved. With respect to the reason why the array regularity increases, in a state of a composition liquid in which the organic semiconductor compound and the specific insulating polymer coexist, both are appropriately compatible with each other, the phase separation is promoted in a case where the solvent dries, and this state changes to a film state, and a domain of the organic semiconductor compound and a domain of the insulating polymer are independently formed. It is considered that the speed at the time of forming of these domains or the degree of the phase separation relates to the control of array regularity. It is considered that mobility is improved since the combination between the compound having a constitutional repeating unit represented by Formula 1 and having a molecular weight of 2,000 or greater according to the present invention and the insulating polymer including the constitutional unit represented by Formula I-1 is suitable.

<Binder Polymer Layer>

The organic semiconductor element of the present invention may have the binder polymer layer between a layer containing the aforementioned organic semiconductor layer and an insulating film. In a case where the organic semiconductor element has the binder polymer layer, the organic semiconductor element has the binder polymer layer between the aforementioned organic semiconductor layer and the gate insulating film. A film thickness of the binder polymer layer is not particularly limited, but is preferably 20 to 500 nm. The binder polymer layer should be a layer containing the aforementioned polymer, and is preferably a layer composed of the aforementioned binder polymer.

A method of forming the binder polymer layer is not particularly limited, and a known method (a bar coating method, a spin coating method, a knife coating method, a doctor blade method, or an ink jet method) can be used.

In a case where the binder polymer layer is formed by performing coating by using a composition for forming a binder polymer layer, for the purpose of removing a solvent, causing crosslinking, or the like, the composition may be heated (baked) after coating.

<Sealing Layer>

From the viewpoint of durability, the organic semiconductor element of the present invention preferably comprises a sealing layer as an outermost layer. In the sealing layer, a known sealant can be used.

A thickness of the sealing layer is not particularly limited, but is preferably 0.2 to 10 µm.

A method of forming the sealing layer is not particularly limited, but examples thereof include a method of coating a substrate, on which the gate electrode, the gate insulating film, the source electrode, the drain electrode, and the organic semiconductor film are formed, with a composition for forming a sealing layer, and the like. Specific examples of the method of coating the substrate with the composition for forming a sealing layer are the same as the examples of the method of coating the substrate with the composition for forming a gate insulating film. In a case where the organic semiconductor film is formed by coating the substrate with the composition for forming a sealing layer, for the purpose of removing the solvent, causing crosslinking, or the like, the composition may be heated (baked) after coating.

Figure 2:
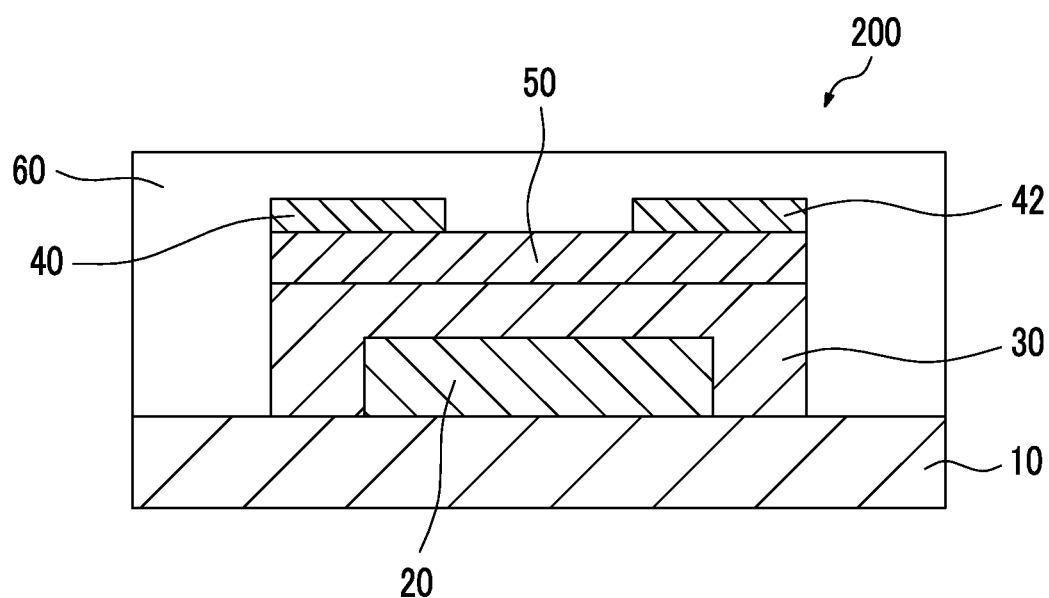
FIG. 2 is a schematic cross-sectional view of another aspect of the organic semiconductor element of the present invention.

FIG. 2 is a schematic cross-sectional view of another aspect of the organic semiconductor element (organic thin film transistor) of the present invention.

In FIG. 2, an organic thin film transistor 200 comprises the substrate 10, the gate electrode 20 disposed on the substrate 10, the gate insulating film 30 covering the gate electrode 20, the organic semiconductor film 50 disposed on the gate insulating film 30, the source electrode 40 and the drain electrode 42 disposed on the organic semiconductor film 50, and the sealing layer 60 covering each member. Herein, the source electrode 40 and the drain electrode 42 are formed using the aforementioned composition of the present invention. The organic thin film transistor 200 is a bottom gate-top contact type organic thin film transistor. The substrate, the gate electrode, the gate insulating film, the source electrode, the drain electrode, the organic semiconductor film, and the sealing layer are as described above.

In FIGS. 1 and 2, the aspects of the bottom gate-bottom contact type organic thin film transistor and the bottom gate-top contact type organic thin film transistor were specifically described. However, the organic semiconductor element of the present invention can also suitably used in a top gate-bottom contact type organic thin film transistor and a top gate-top contact type organic thin film transistor.

The organic thin film transistor described above can be suitably used for electronic paper and a display device.

(Compound)

The compound according to the present invention has the constitutional repeating unit represented by any one of Formulae 2 to 5 and has a molecular weight of 2,000 or greater.

The compound according to the present invention is preferably an organic semiconductor compound.

With respect to the compound according to the present invention, the compound having a constitutional repeating unit represented by any one of Formulae 2 to 5 and having a molecular weight of 2,000 or greater is the same as the compound having a constitutional repeating unit represented by any one of Formulae 2 to 5, and preferable aspects thereof are the same.

(Organic Semiconductor Composition)

The organic semiconductor composition according to the present invention contains the compound (aforementioned specific compound) according to the present invention and a solvent.

The organic semiconductor composition according to the present invention may contain a binder polymer.

The specific compound, the binder polymer, and the solvent in the organic semiconductor composition according to the present invention have the same meanings as the specific compound, the binder polymer, and the solvent described above, and preferable aspects thereof are also the same.

The content of the specific compound in the organic semiconductor composition according to the present invention is not particularly limited, but is preferably 0.005 to 10 mass %, more preferably 0.01 to 5 mass %, and even more preferably 0.05 to 3 mass % with respect to the total mass of the organic semiconductor composition.

The organic semiconductor composition according to the present invention may include other components in addition to the specific compound, the binder polymer, and the solvent.

As the component, well-known additives may be used.

The content of the component in addition to the specific compound, the binder polymer, and the solvent in the organic semiconductor composition according to the present invention is preferably 10 mass % or less, more preferably 5 mass % or less, even more preferably 1 mass % or less, and particularly preferably 0.1 mass % or less with respect to the total solid content. If the content is in the range described above, film formability is improved, and mobility and temporal stability under high temperature and high humidity of the obtained organic semiconductor are further improved. The solid content is an amount of the components excluding the volatilizable component such as the solvent.

The viscosity of the organic semiconductor composition according to the present invention is not particularly limited. However, in view of excellent coating properties, the viscosity is preferably 3 to 100 mPa·s, more preferably 5 to 50 mPa·s, and even more preferably 9 to 40 mPa·s. The viscosity according to the present invention refers to the viscosity at 25° C.

As a method of measuring the viscosity, a measuring method in conformity of JIS Z8803 is preferable.

The method of manufacturing the organic semiconductor composition according to the present invention is not particularly limited, and well-known methods can be applied. For example, a desired composition can be obtained by adding a specific amount of a specific compound in the solvent and applying an appropriate stirring treatment. In a case where the binder polymer is used, the specific compound and the binder polymer are simultaneously or sequentially added, so as to suitably manufacture the composition.

(Organic Semiconductor Film)

The organic semiconductor film according to the present invention contains the specific compound.

The organic semiconductor film according to the present invention preferably contains a binder polymer.

The specific compound and the binder polymer in the organic semiconductor film according to the present invention have the same meanings as the specific compound and the binder polymer described above in the organic semiconductor element according to the present invention, and preferable aspects thereof are also the same.

The organic semiconductor composition according to the present invention may include other components in addition to the specific compound and the binder polymer.

As the component, well-known additives may be used.

The content of the component in addition to the specific compound and the binder polymer in the organic semiconductor film according to the present invention preferably 10 mass % or less, more preferably 5 mass % or less, even more preferably 1 mass % or less, and particularly preferably 0.1 mass % or less. If the content is in the range above, film formability is improved, and mobility and temporal stability under high temperature and high humidity of the obtained organic semiconductor are further improved. The solid content is an amount of components other than the volatilizable components such as the solvent.

The film thickness of the organic semiconductor film according to the present invention is not particularly limited. However, in view of mobility and temporal stability under high temperature and high humidity of the obtained organic semiconductor, the film thickness is preferably 10 to 500 nm and more preferably 30 to 200 nm.

The organic semiconductor film according to the present invention can be suitably used in the organic semiconductor element, and can be particularly suitably used in the organic transistor (organic thin film transistor).

The organic semiconductor film according to the present invention can be suitably manufactured by using the organic semiconductor composition according to the present invention.

The method of manufacturing the organic semiconductor film according to the present invention is not particularly limited, and well-known methods can be employed. Examples thereof include a method of manufacturing an organic semiconductor film by applying the organic semiconductor composition according to the present invention on a predetermined base material and performing a dry treatment, if necessary.

The method of applying the composition on the base material is not particularly limited. Examples thereof include an ink jet printing method, a screen printing method, a flexographic printing method, a bar coating method, a spin coating method, a knife coating method, and a doctor blade method. An ink jet printing method, a screen printing method, and a flexographic printing method are preferable.

Among these, the method of manufacturing the organic semiconductor film according to the present invention preferably includes a coating step of coating the substrate with the organic semiconductor composition according to the present invention and more preferably includes a coating step of coating a substrate with the organic semiconductor composition according to the present invention and a removing step of removing the solvent from the coated composition.

The coating step is more preferably a coating step of coating a gate insulating film having a surface energy of 50 to 75 mNm$^{-1}$ with the organic semiconductor composition according to the present invention further containing an insulating polymer including a constitutional unit represented by Formula I-1.

According to the aspect, it is possible to obtain an organic semiconductor film having high mobility.

EXAMPLES

Hereinafter, the present invention will be more specifically described based on examples. The materials and the amount thereof used, the proportion of the materials, the content and procedure of treatments, and the like described in the following examples can be appropriately changed within a scope that does not depart from the gist of the present invention. Accordingly, the scope of the present invention is not limited to the following specific examples. Herein, unless otherwise specified, "part" and "%" are based on mass.

Examples 1 to 23 and Comparative Examples 1 to 10

<Organic Semiconductor>
Structures of Compounds 1 to 23 and Comparative Compounds 1 to 10 which were used in the organic semiconductor layer are provided below.

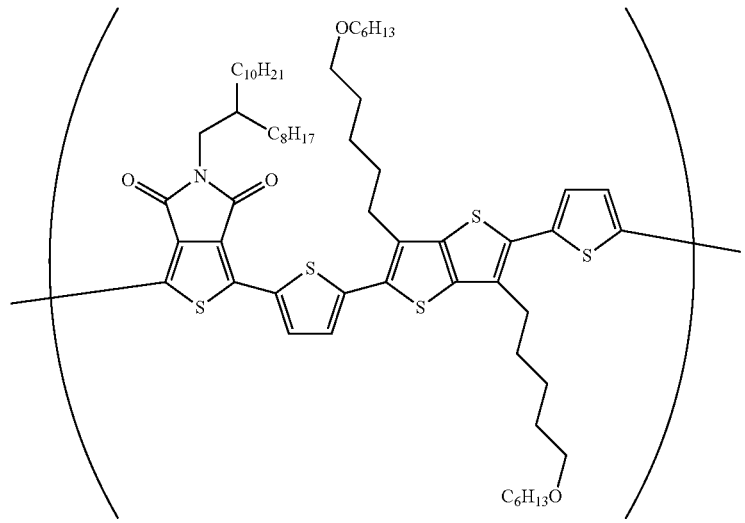

Compound 1

Mw = 47,000

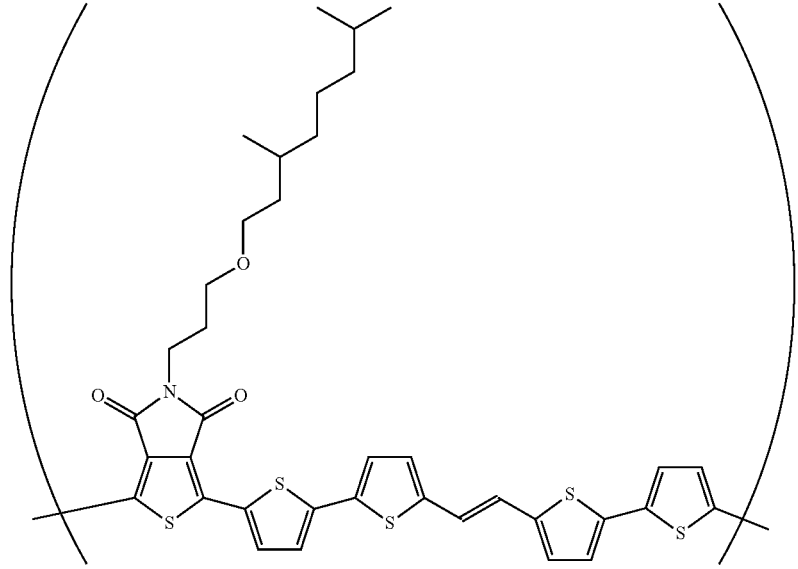

Compound 2

Mw = 35,000

-continued
Compound 3
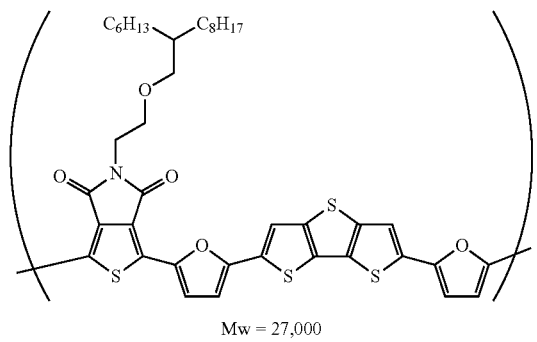
Mw = 27,000
Compound 4
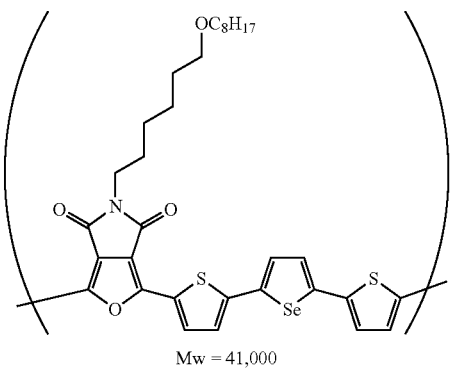
Mw = 41,000
Compound 5
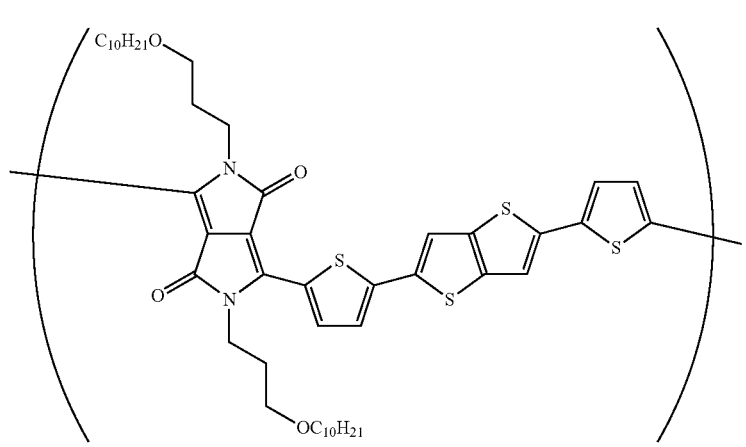
Mw = 97,000
Compound 6
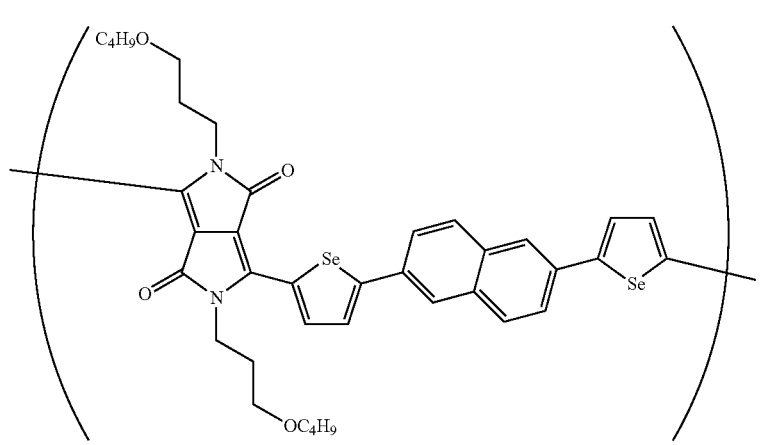
Mw = 87,000

Compound 7
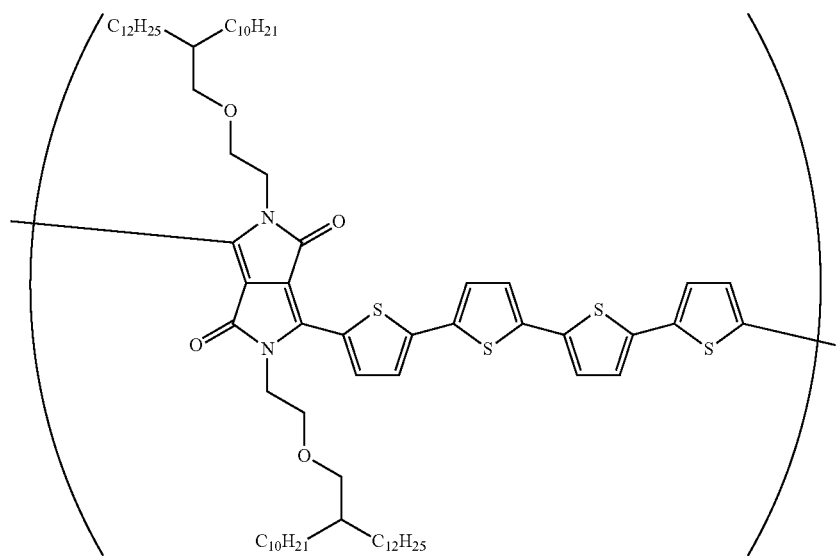
Mw = 106,000
Compound 8
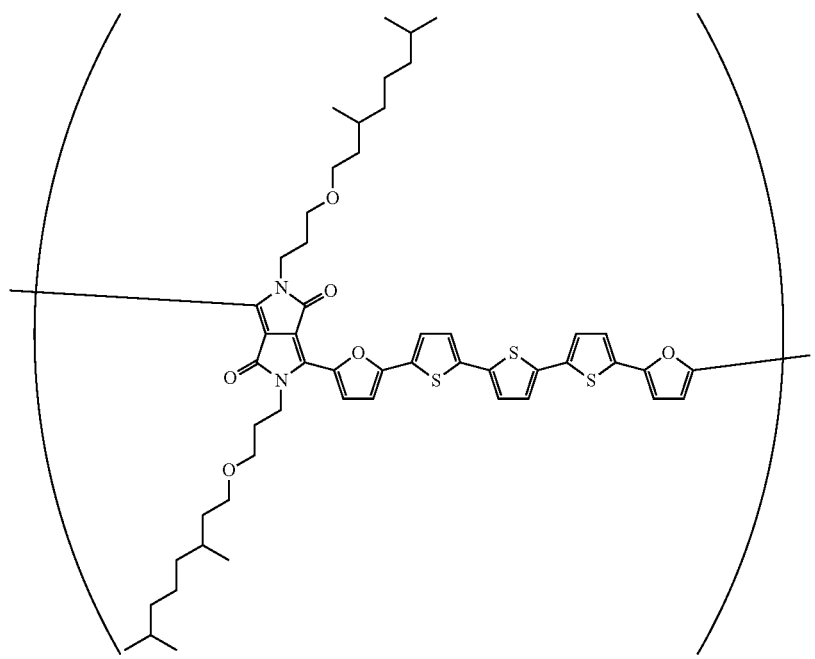
Mw = 136,000

Compound 9
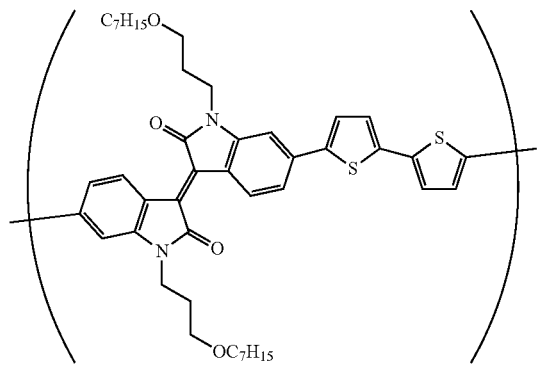
Mw = 132,000
Compound 10
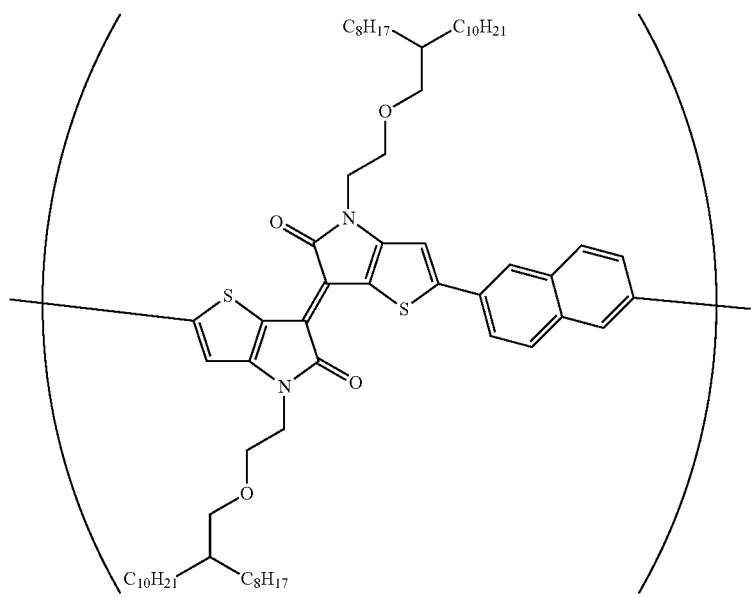
Mw = 77,000
Compound 11
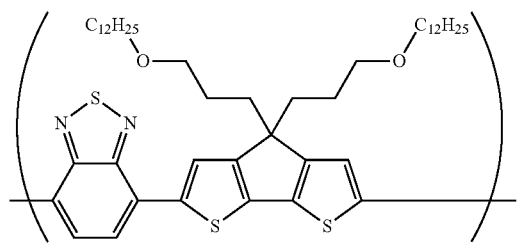
Mw = 94,000

Compound 12
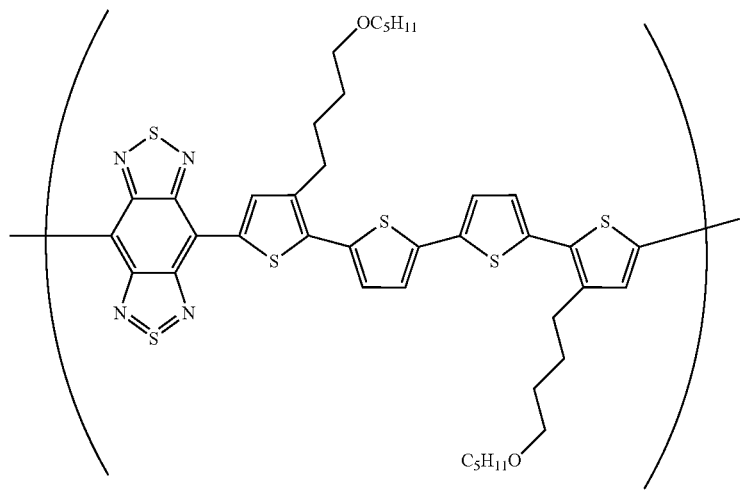
Mw = 104,000
Compound 13
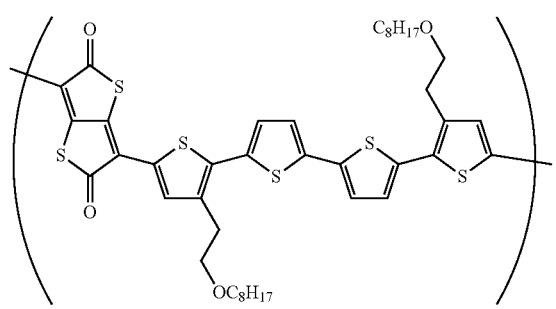
Mw = 53,000
Compound 14
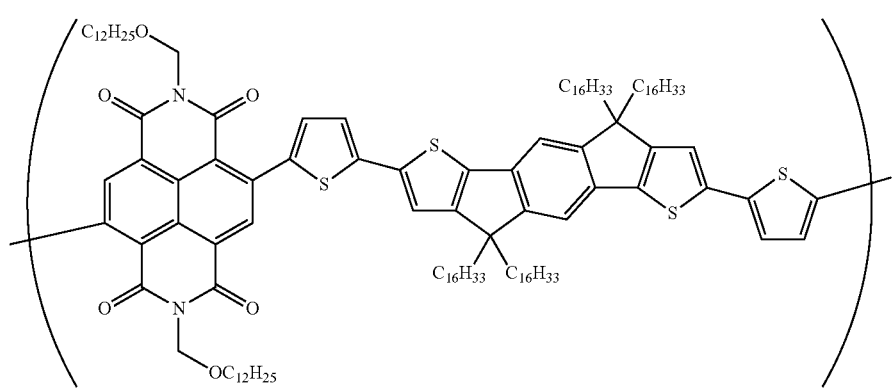
Mw = 39,000

Compound 15
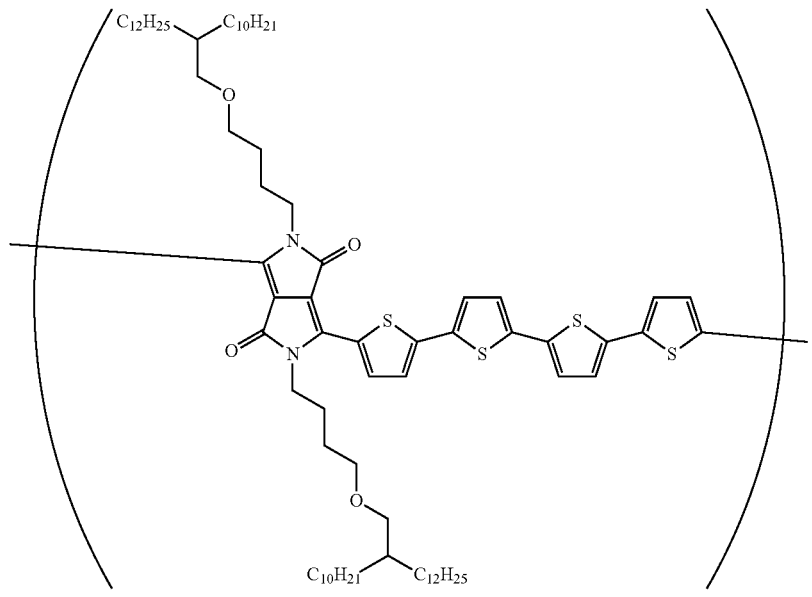
Mw = 105,000
Compound 16
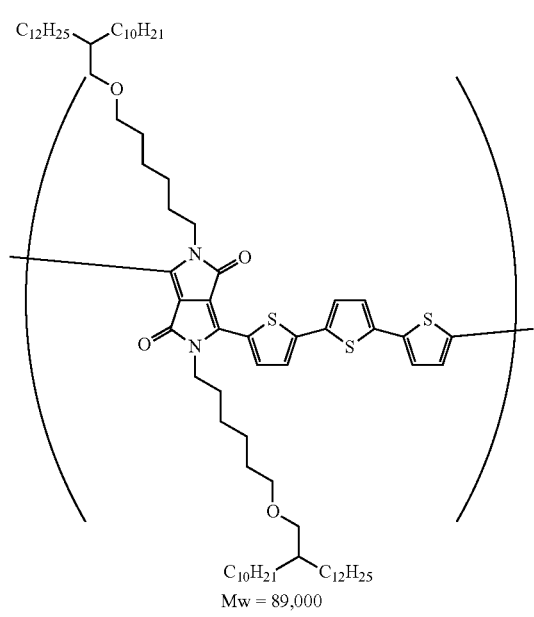
Mw = 89,000

-continued
Compound 17
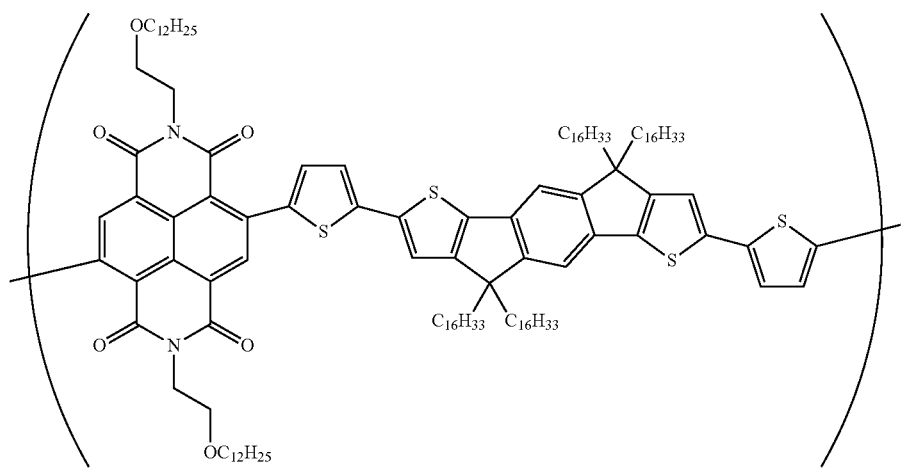
Mw = 38,000
Compound 18
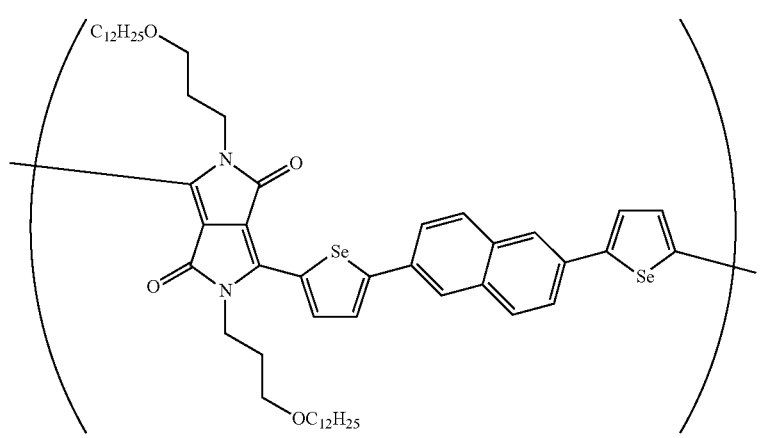
Mw = 85,000
Compound 19
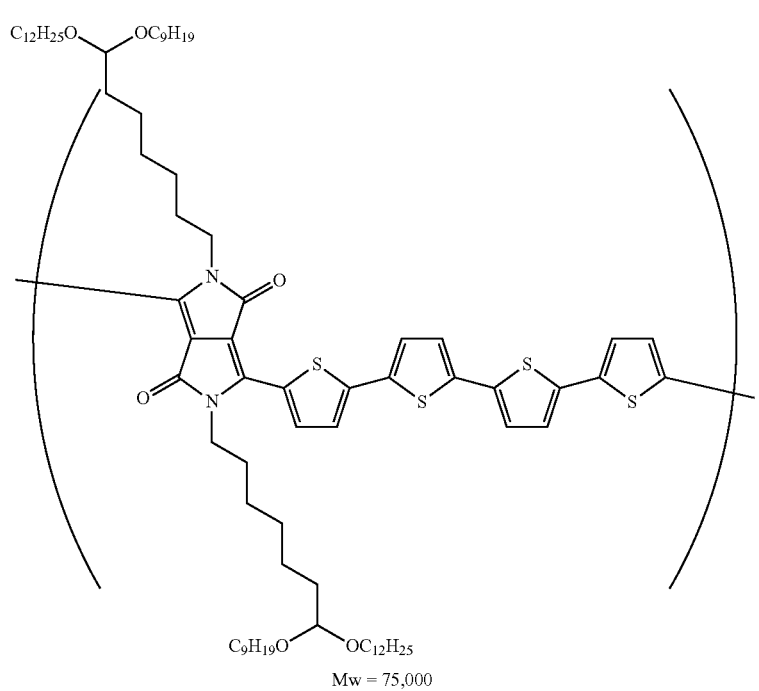
Mw = 75,000

Compound 20
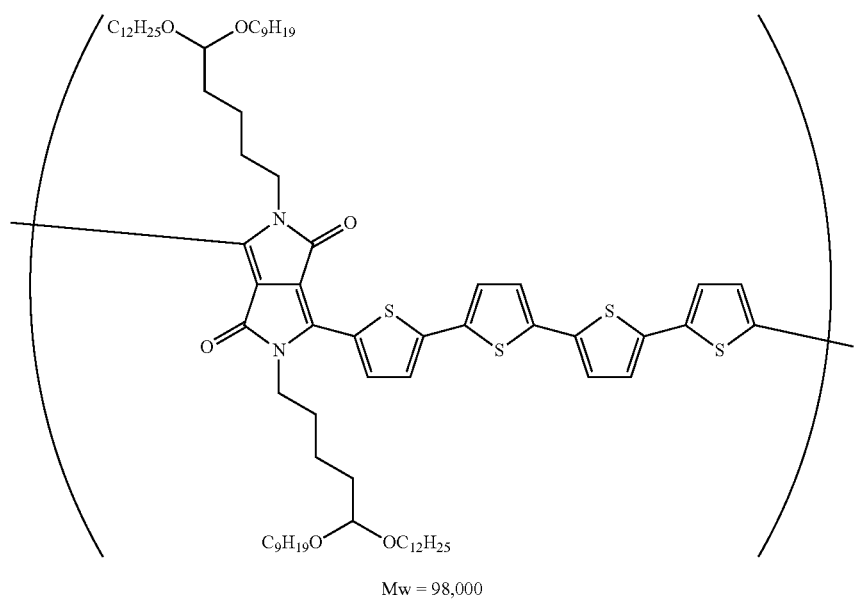
Mw = 98,000
Compound 21
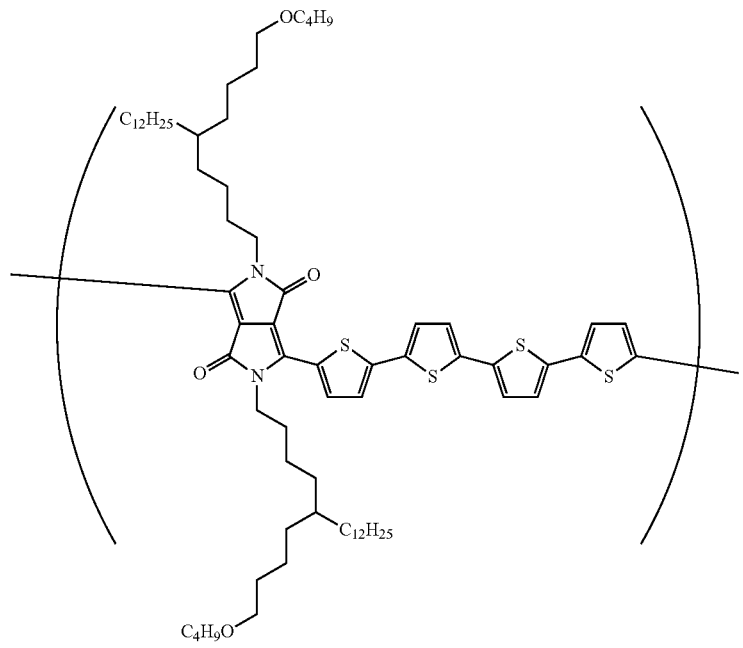
Mw = 88,000

Compound 22
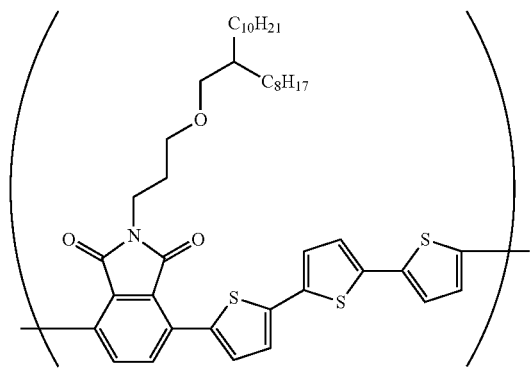
Mw = 33,000
Compound 23
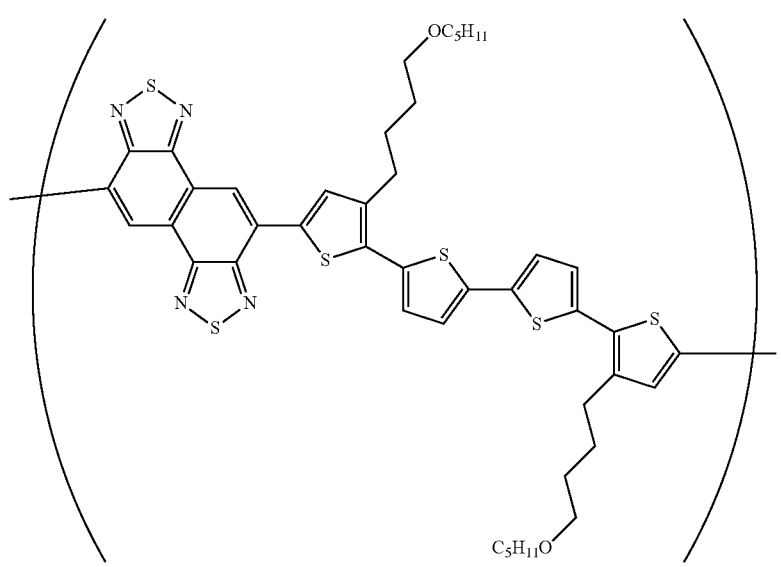
Mw = 65,000
Comparative Compound 1
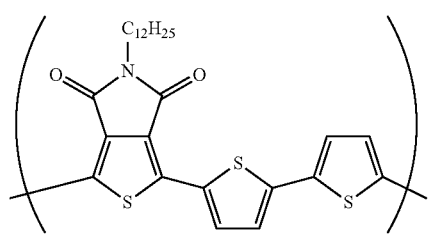
Mw = 35,000
Comparative Compound 2
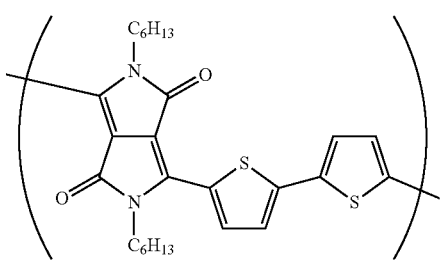
Mw = 1,200

-continued
Comparative Compound 3
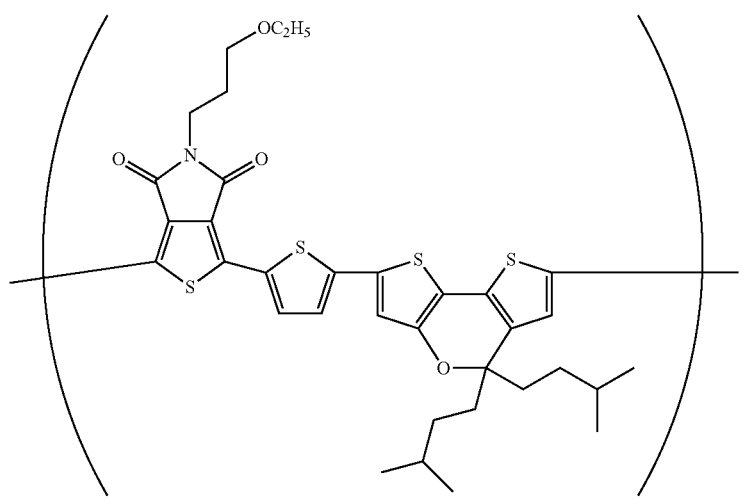
Mw = 39,000
Comparative Compound 4
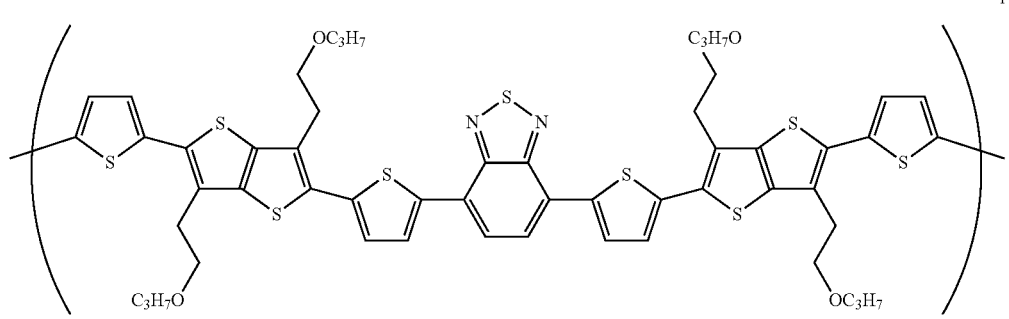
Mw = 52,000
Comparative Compound 5
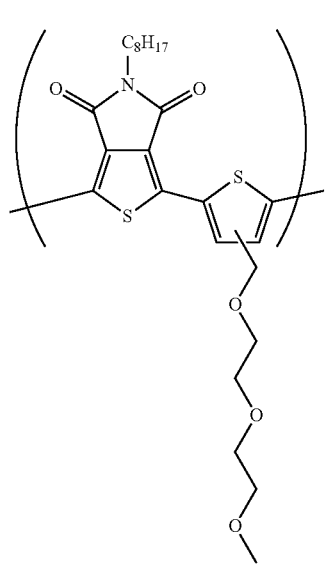
Mw = 7,800

Comparative Compound 6
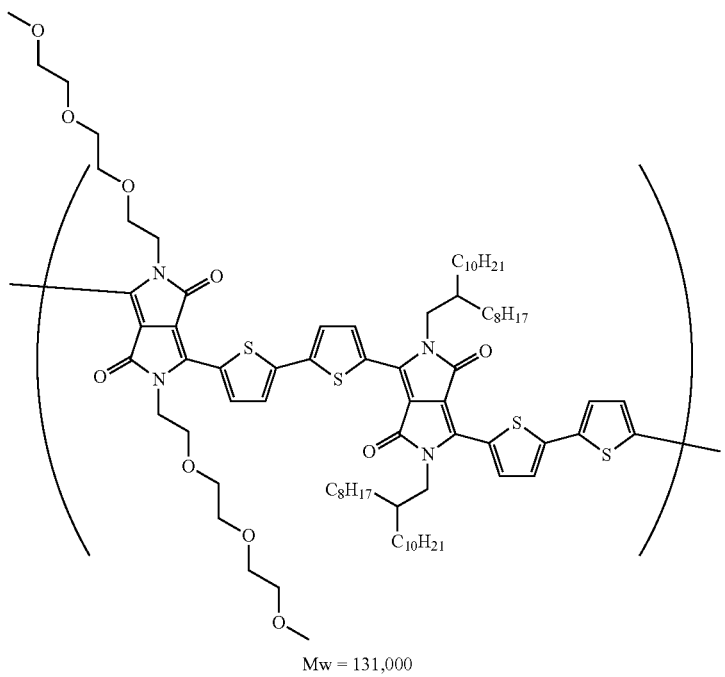
Mw = 131,000
Comparative Compound 7
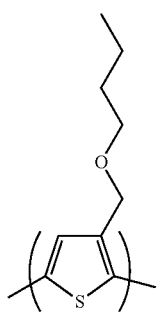
Mw = 38,000
Comparative Compound 8
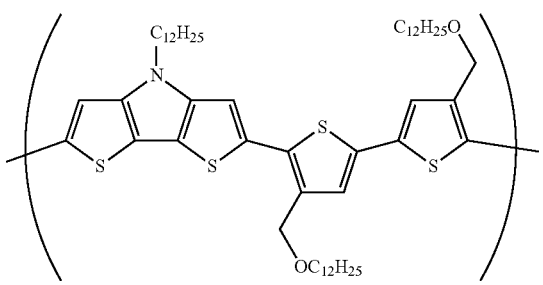
Mw = 9,500
Comparative Compound 9
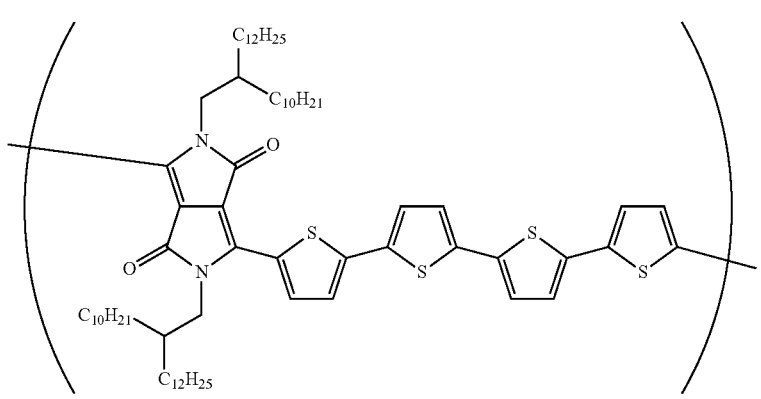
Mw = 51,000

-continued

Comparative Compound 10

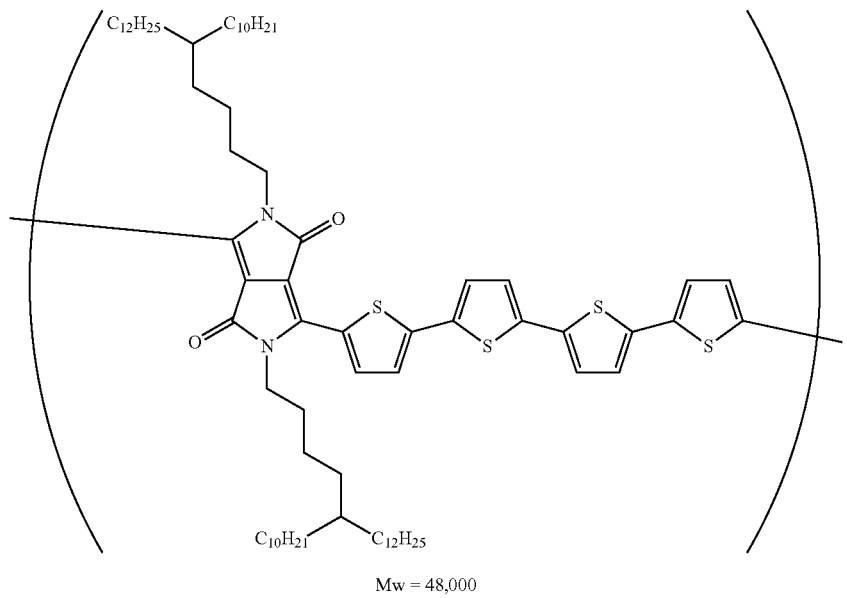

Mw = 48,000

Synthesis Example

The synthesis method follows the method of synthesizing a general D-A-type π conjugated polymer. As a representative example, a method of synthesizing Compounds 1 and 7 is provided.

[Synthesis of Compound 1]

1,3-dibromo-5-(2-octyldodecyl)-4H-thieno[3,4-c]pyrrole-4,6(5H)-dione which was a monomer was synthesized by the method disclosed in J. Mater. Chem., 2012, 22, 14639. Intermediate 1, which was another monomer, was synthesized by the synthesis route provided in Scheme X1 with reference to JP2008-504379A and J. Polym. Sci. Part A: Polym. Chem., 2013, 51, 424.

Scheme XI

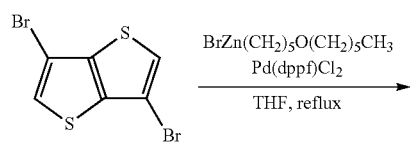

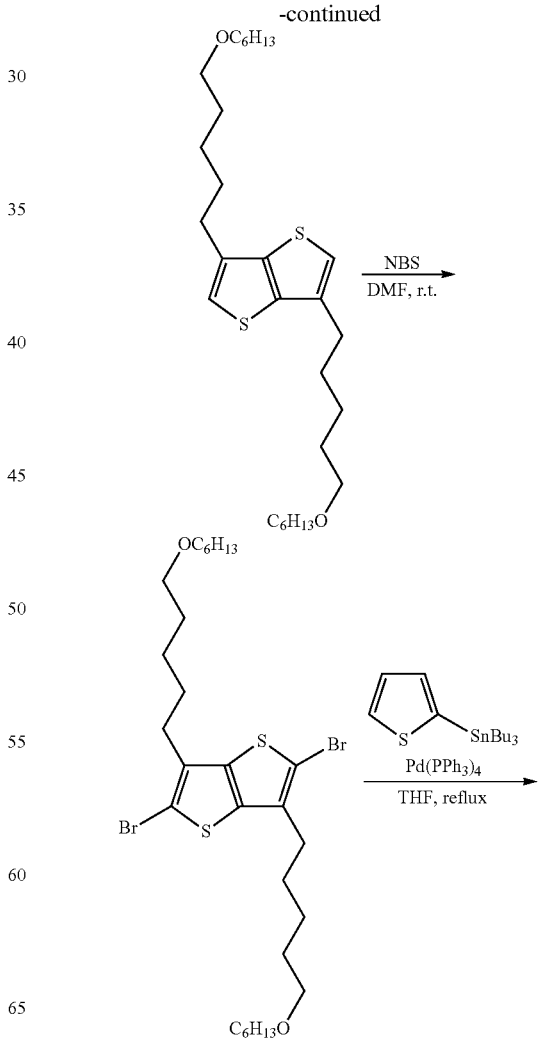

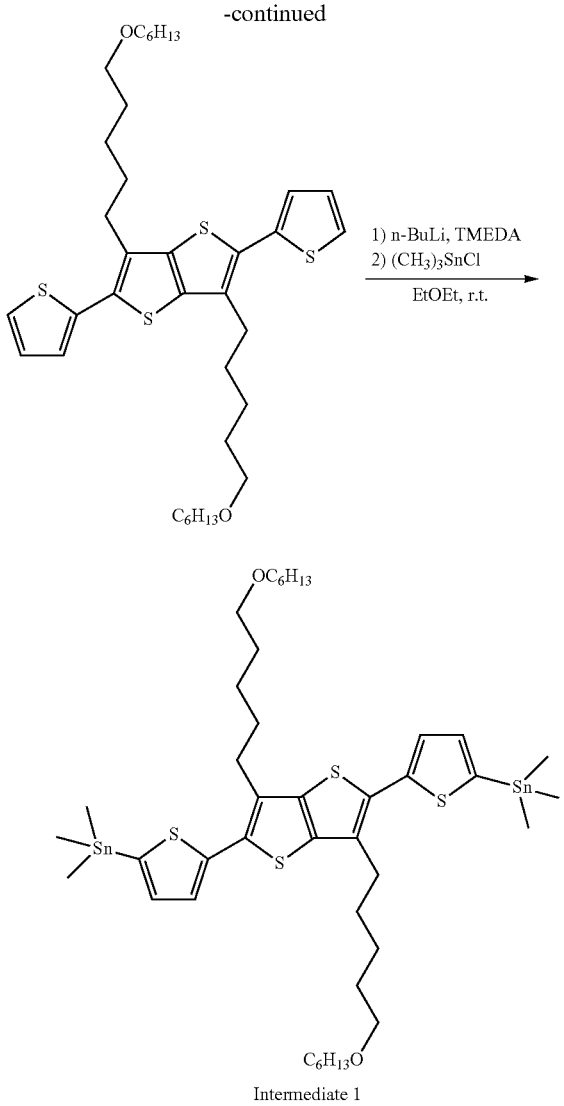

Intermediate 1

1,3-dibromo-5-(2-octyldodecyl)-4H-thieno[3,4-c]pyrrole-4,6(5H)-dione (296 mg, 500 μmol), Intermediate 1 (485 mg, 500 μmol), tri(o-tolyl) phosphine (30.4 mg, 100 μmol), tris(dibenzylideneacetone) dipalladium (22.9 mg, 25 μmol), and dehydrated toluene (25 mL) were mixed, and stirring was performed under nitrogen atmosphere at 100° C. for 60 hours. After the reaction liquid was cooled to room temperature, the reaction liquid was poured to a methanol (480 mL)/concentrated hydrochloric acid (20 mL) mixture liquid, and stirring was performed for two hours. After the precipitate was filtrated and washed with methanol, soxhlet extraction was performed sequentially with methanol, acetone, and dichloromethane, so as to remove soluble impurities. Subsequently, soxhlet extraction was performed with dichlorobenzene, the obtained solution was subjected to vacuum concentration, methanol was added, the precipitated solid content was filtrated and washed with methanol, and vacuum drying was performed at 80° C. for 12 hours, so as to obtain 344 mg of Compound 1 (yield: 64%).

The number-average molecular weight in terms of polystyrene was $2.5 \times 10^4$, and the weight-average molecular weight was $4.7 \times 10^4$.

Compound 1

[Synthesis of Compound 7]

Intermediate 2 which was a monomer was synthesized in a synthesis route provided in Scheme X2 with reference to Tetrahedron, 2010, 66, 3173. and Organic Electronics, 2011, 12, 993.

scheme X2

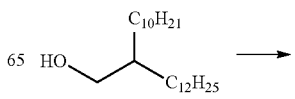

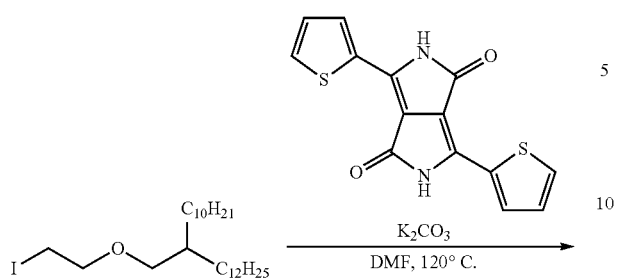

Synthesis Intermediate 2 (244 mg, 200 µmol), 5,5'-bis(trimethylstannyl)-2,2'-bithiophene (98.4 mg, 200 µmol), tri(o-tolyl) phosphine (4.9 mg, 16 µmol), tris(dibenzylideneacetone) dipalladium (3.7 mg, 4 µmol), and dehydrated chlorobenzene (17 mL) were mixed, and stirring was performed under nitrogen atmosphere at 130° C. for 24 hours. After the reaction liquid was cooled to room temperature, the reaction liquid was poured to a methanol (240 mL)/concentrated hydrochloric acid (10 mL) mixture liquid, and stirring was performed for two hours. After the precipitate was filtered and washed with methanol, soxhlet extraction was performed sequentially with methanol, acetone, and ethyl acetate, so as to remove soluble impurities. Subsequently, soxhlet extraction was performed with chloroform, and the obtained solution was subjected to vacuum concentration, methanol was added, the precipitated solid content was filtrated and washed with methanol, and vacuum drying was performed at 80° C. for 12 hours, so as to obtain 201 mg of Compound 7 (yield: 82%).

The number-average molecular weight in terms of polystyrene was $4.4 \times 10^4$, and the weight-average molecular weight was $1.1 \times 10^5$.

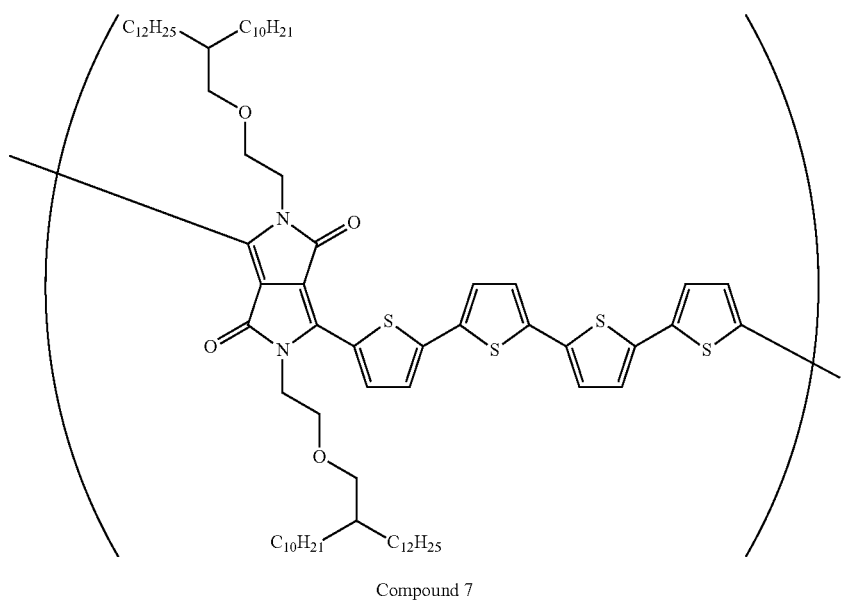

Compound 7

[Synthesis of Compound 19]

Intermediate 3 which was a monomer was synthesized by the synthesis route provided in Scheme X3.

—Synthesis of Intermediate 3—

6-hepten-1-ol (10 g, 88 mmol)/dichloromethane (50 mL) were added dropwise to a solution obtained by mixing 4 Å of heated activated molecular sieves (10 g), dichloromethane (150 mL), N-methylmorpholine-N-oxide (15 g, 131 mmol), and tetrapropylammonium perruthenate (1.85 g, 5.3 mmol) under nitrogen atmosphere with a caution of heating, and stirring was performed for 30 minutes, at room temperature. The reaction solution was filtrated through celite and silica gel, and vacuum concentration was performed, so as to obtain 7 g of Intermediate 3 (yield: 71%).

—Synthesis of Intermediate 4—

Intermediate 3 (5 g, 45 mmol) and tetrahydrofuran (55 mL) were mixed under nitrogen atmosphere, cooling was performed to 0° C., and ether solution (48 mL, 48 mmol) of dodecyl magnesium bromide was dropwise added. The reaction solution was heated to room temperature, and stirring was performed for three hours. Water was added, a grignard reagent was deactivated, and extraction was performed with hexane. The organic layer was dried on sodium sulfate, was filtrated, and was subjected to vacuum concentration. The obtained crude product was purified by silica gel column chromatography (eluent: hexane to hexane:ethyl acetate=9:1), so as to obtain 8.8 g of Intermediate 4 (yield: 70%).

—Synthesis of Intermediate 5—

Intermediate 4 (5 g, 18 mmol) and THF (40 mL) were mixed under nitrogen atmosphere. The reaction solution was cooled to 0° C., and hydrogenated sodium 60% (743 mg, 18 mmol) was added. The temperature was increased to room temperature, stirring was performed for one hour, 1-iodononane (4.95 g, 19 mmol) was added, the reaction solution was heated under reflux, and stirring was further performed for one hour. The reaction solution was cooled to room temperature, water was added, and extraction was performed with hexane.

The organic layer was washed with 25 mass % saline, drying was performed on sodium sulfate, filter paper, and vacuum concentration was performed. Purification was performed by providing the obtained crude product to silica gel column chromatography (Eluent: hexane to hexane:ethyl acetate=9:1), so as to obtain 2.5 g of Intermediate 5 (yield: 35%).

Synthesis from Intermediates 6 to 9 was performed in the same method as in Intermediate 2.

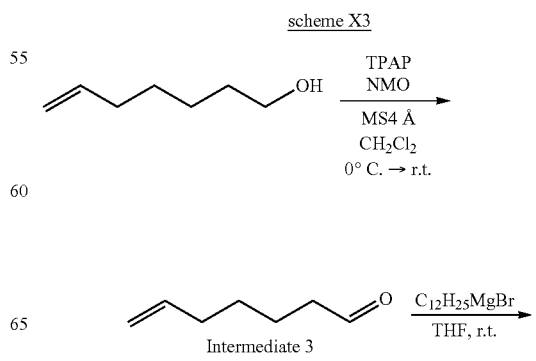

scheme X3

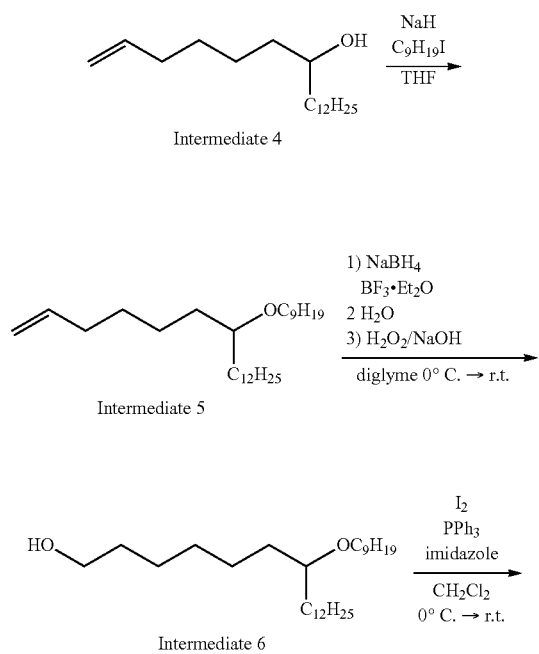

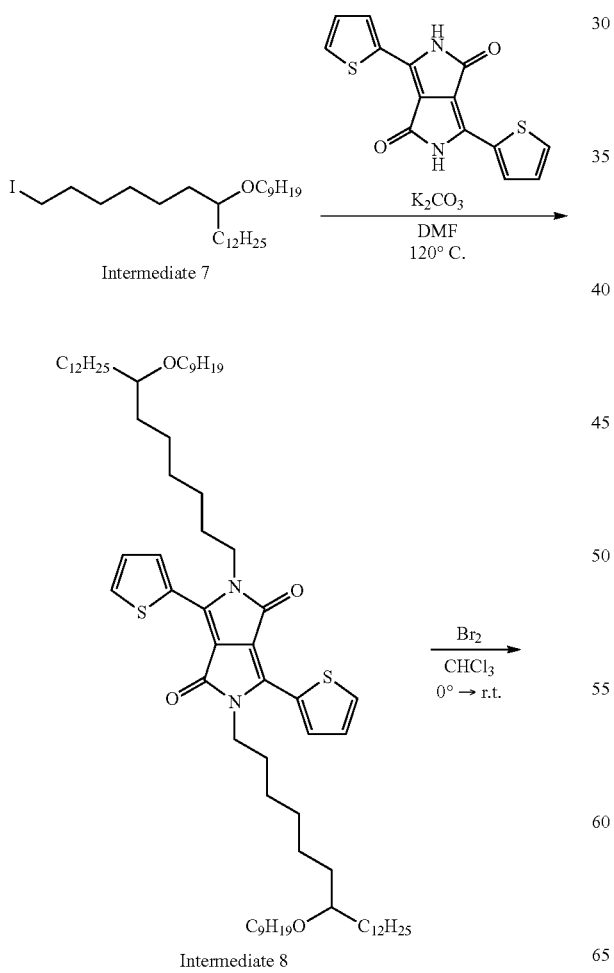

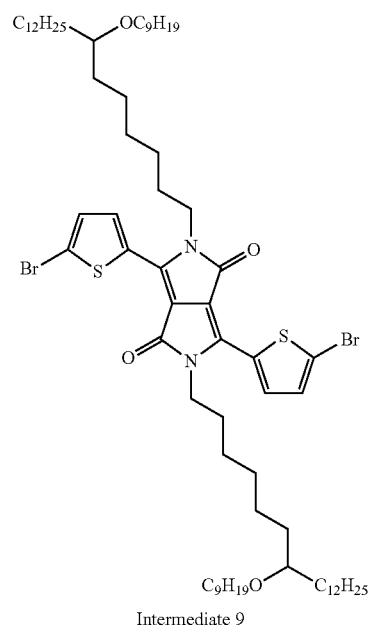

Synthesis Intermediate 9 (255 mg, 200 μmol), 5,5'-bis(trimethylstannyl)-2,2'-bithiophene (98.4 mg, 200 μmol), tri(o-tolyl) phosphine (4.9 mg, 16 μmol), tris(dibenzylideneacetone) dipalladium (3.7 mg, 4 μmol), and dehydrated chlorobenzene (17 mL) were mixed and stirred at 130° C. for 24 hours under nitrogen atmosphere. After the reaction liquid was cooled to room temperature, methanol (240 mL)/concentrated hydrochloric acid (10 mL) was poured to mixture liquid, and stirring was performed for two hours. The precipitate was filtrated and washed with methanol, soxhlet extraction was performed sequentially with methanol, acetone, and ethyl acetate, so as to remove soluble impurities. Subsequently, soxhlet extraction was performed with chloroform, vacuum concentration was performed on the obtained solution, methanol was added, the precipitated solid content was filtrated and washed with methanol, and vacuum drying was performed at 80° C. for 12 hours, so as to obtain 201 mg of Compound 19 (yield: 82%).

The number-average molecular weight in terms of polystyrene was $2.7 \times 10^4$, and the weight-average molecular weight was $7.5 \times 10^4$.

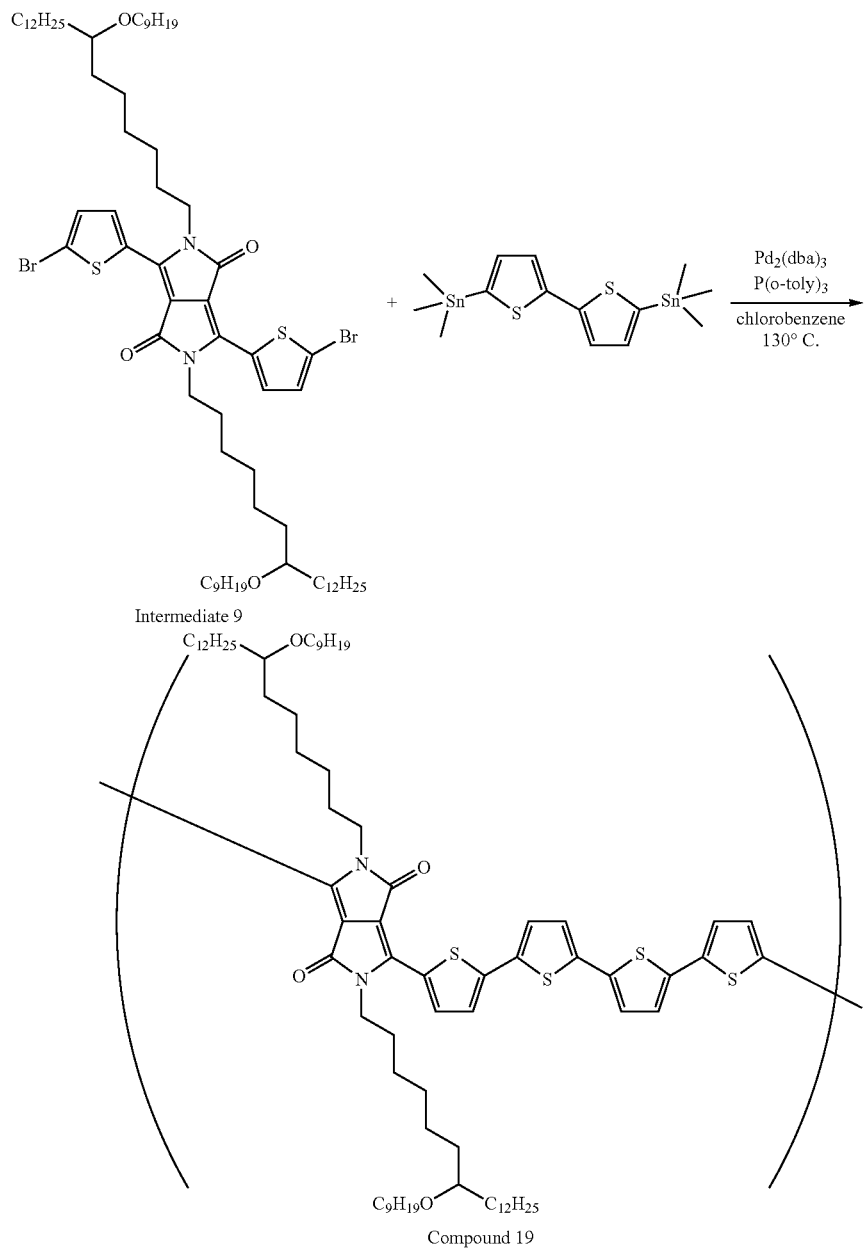

Comparative Compound 1 was a compound disclosed in JP2010-527327A, Comparative Compound 2 was a compound disclosed in JP2007-516315A, Comparative Compound 3 was a compound disclosed in WO2013/047858A, Comparative Compound 4 was a compound disclosed in JP2009-158921A, Comparative Compound 5 was a compound disclosed in Macromolecules, 2013, 46, 6408, Comparative Compound 6 was a compound disclosed in Journal of Physical Chemistry C, 2014, 118, 11536, Comparative Compound 7 was a compound disclosed in JP2008-153667A, Comparative Compound 8 was a compound disclosed in JP2012-251129A, Comparative Compound 9 was a compound disclosed in JP2012-506928A. Comparative Compound 10 was synthesized with reference to the synthesis method disclosed in Advanced Materials, 2014, 24, 3734-3744.

<Preparation of Organic Semiconductor Composition>

The organic semiconductor compound presented in Table 1 (0.20 mass %)/1,2-dichlorobenzene was weighed on a glass vial, mixing under stirring was performed at 80° C. for 24 hours with a mix rotor (manufactured by AS ONE Corporation), and filtration was performed with a 0.5 μm membrane filter, so as to obtain an organic semiconductor coating liquid.

<Manufacturing of TFT Element>

Al that became a gate electrode was vapor-deposited on the glass substrate (EAGLE XG: manufactured by Corning Incorporated) (Thickness: 50 nm). Spin coating was performed with a composition for forming a gate insulating film (a propylene glycol monomethyl ether acetate (PGMEA) solution (concentration of solid content: 2 mass %) in which polyvinylphenol/2,4,6,-tris[bis(methoxymethyl) amino]-1,3,5-triazine=1 part by mass/1 part by mass (w/w)), and the gate insulating film having a film thickness of 400 nm was formed by performing baking at 150° C. for 60 minutes. Shapes of source electrodes and drain electrodes (channel length: 40 µm, channel width: 200 µm) were drawn thereon, with silver ink (H-1, manufactured by Mitsubishi Materials Corporation) by using an ink jet device DMP-2831 (manufactured by Fujifilm Corporation). Thereafter, baking was performed in an oven at 180° C. for 30 minutes, sintering was performed, and source electrodes and drain electrodes were formed, so as to obtain an element substrate for TFT characteristic evaluation.

In a nitrogen glove box, spin coating was performed on the element substrate for TFT characteristic evaluation with each organic semiconductor coating liquid (for 10 seconds at 500 rpm and for 30 seconds at 1,000 rpm), and drying was performed on a hot plate at 180° C. for 10 minutes, so as to form an organic semiconductor layer such that a bottom gate bottom contact-type organic TFT element was obtained.

<Characteristics Evaluation>

The following performance evaluation was carried out under the atmosphere by using a semiconductor characteristic evaluation device B2900A (manufactured by Agilent Technologies).

(a) Carrier Mobility, (b) Mobility Variation

Carrier mobility µ was calculated by applying a voltage of −60V between source electrodes-drain electrodes of the respective organic TFT elements, changing gate voltages in the range of +10 V to −60 V, and using an equation below indicating a drain current $I_d$.

$$I_d = (w/2L)\mu C_i (V_g - V_{th})^2$$

In the equation, L represents a gate length, w represents a gate width, $C_i$ represents capacity per unit area of an insulating film, $V_g$ represents a gate voltage, and $V_{th}$ represents a threshold voltage.

The value of the carrier mobility presented in Table 1 is an average value of 10 elements. As the carrier mobility µ is higher, the carrier mobility µ is more preferable. In practice, the carrier mobility µ is preferably $1.0 \times 10^{-2}$ cm²/V·s or greater and more preferably $1.0 \times 10^{-1}$ cm²/V·s or greater. With respect to the organic TFT elements having mobility of less than $1.0 \times 10^{0.5}$ cm²/V·s, characteristics were extremely low, the following evaluation was not performed, and "$<1.0 \times 10^{0.5}$" is presented in the columns of the carrier mobility in the table.

With respect to the carrier mobility of 10 elements, the coefficient of variation calculated in the following equation was evaluated in the following four levels and was used as an index of mobility variation. As this value is smaller, mobility variation between elements becomes smaller. In practice, A or B is preferable, and A is more preferable.

Coefficient of variation=standard deviation/average value×100

<Evaluation Standard>

A: Less than 15%

B: 15% or greater and less than 30%

C: 30% or greater and less than 50%

D: 50% or greater (c) Temporal Stability Under High Temperature and High Humidity Each of the manufactured organic thin film transistor elements were stored at 60° C. in the humidity of 80% or less for 24 hours, carrier mobility maintenance ratio (in the following equation) in a case where carrier mobility was measured in the same method as "(a) Carrier mobility" was evaluated in the following five levels, so as to obtain an index of temporal stability under high temperature and high humidity. As this value is greater, temporal stability under high temperature and high humidity becomes higher, and A or B is preferable in practice.

Carrier mobility maintenance ratio (%) after storage under high temperature and high humidity=Carrier mobility (after storage under high temperature and high humidity)/carrier mobility (before storage under high temperature and high humidity)×100

A: 90% or greater

B: 75% or greater and less than 90%

C: 50% or greater and less than 75%

D: 25% or greater and less than 50%

E: Less than 25%

TABLE 1

| | Organic semiconductor compound | Average carrier mobility | Variation of mobility | Temporal stability under high temperature and high humidity |
|---|---|---|---|---|
| Example 1 | Compound 1 | 0.59 | B | A |
| Example 2 | Compound 2 | 0.45 | B | A |
| Example 3 | Compound 3 | 0.42 | B | A |
| Example 4 | Compound 4 | 0.35 | B | A |
| Example 5 | Compound 5 | 1.20 | B | B |
| Example 6 | Compound 6 | 0.85 | B | B |
| Example 7 | Compound 7 | 1.05 | A | B |
| Example 8 | Compound 8 | 0.83 | B | B |
| Example 9 | Compound 9 | 0.33 | B | B |
| Example 10 | Compound 10 | 0.30 | A | B |
| Example 11 | Compound 11 | 0.25 | B | B |
| Example 12 | Compound 12 | 0.18 | B | B |
| Example 13 | Compound 13 | 0.12 | B | B |
| Example 14 | Compound 14 | 0.07 | B | B |
| Example 15 | Compound 15 | 1.30 | A | B |
| Example 16 | Compound 16 | 1.00 | A | B |
| Example 17 | Compound 17 | 0.14 | B | B |
| Example 18 | Compound 18 | 0.95 | B | B |
| Example 19 | Compound 19 | 1.10 | A | B |
| Example 20 | Compound 20 | 1.00 | A | B |
| Example 21 | Compound 21 | 0.93 | A | B |
| Example 22 | Compound 22 | 0.04 | B | B |
| Example 23 | Compound 23 | 0.22 | B | B |
| Comparative Example 1 | Comparative Compound 1 | $3.7 \times 10^{-4}$ | C | D |
| Comparative Example 2 | Comparative Compound 2 | $<1.0 \times 10^{-5}$ | — | — |
| Comparative Example 3 | Comparative Compound 3 | $<1.0 \times 10^{-5}$ | — | — |
| Comparative Example 4 | Comparative Compound 4 | $2.3 \times 10^{-4}$ | D | D |
| Comparative Example 5 | Comparative Compound 5 | $<1.0 \times 10^{-5}$ | — | — |
| Comparative Example 6 | Comparative Compound 6 | $4.2 \times 10^{-5}$ | C | E |
| Comparative Example 7 | Comparative Compound 7 | $1.9 \times 10^{-4}$ | C | D |
| Comparative Example 8 | Comparative Compound 8 | $7.5 \times 10^{-4}$ | D | D |
| Comparative Example 9 | Comparative Compound 9 | 0.45 | C | C |
| Comparative Example 10 | Comparative Compound 10 | 0.80 | D | C |

From Table 1, it was understood that, with respect to the organic TFT elements according to the examples, mobility was high, variation of mobility was suppressed, and temporal stability under high temperature and high humidity was excellent.

Meanwhile, a polymer that did not have a group represented by Formula 1-1 was not able to satisfy all of the items of high mobility, suppression of variation of mobility, and temporal stability under high temperature and high humidity.

Examples 24 to 41

Organic Semiconductor Compound 7 (0.20 mass %) and an insulating polymer (0.10 mass %)/1,2-dichlorobenzene disclosed in Table 2 were weighed on glass vial, mixing under stirring was performed at 80° C. for 24 hours with a mix rotor (manufactured by AS ONE Corporation), and filtration was performed with a 0.5 μm membrane filter, so as to obtain an organic semiconductor coating liquid. The organic TFT element was obtained in the same manner as in Example 1.

Hereinafter, in the same manner as in Example 1, carrier mobility and temporal stability under high temperature and high humidity were evaluated.

Relative mobility provided in Table 2 is a relative value obtained by dividing the obtained carrier mobility of each of the organic TFT elements with carrier mobility of Example 7, and is a value calculated in the following equation.

Relative mobility of Examples 24 to 41=average mobility of each of the examples/average mobility of Example 7 (=1.05)

Temporal stability under high temperature and high humidity in each of the examples had the same result as in Example 7.

TABLE 2

| | Insulating polymer | Relative mobility |
|---|---|---|
| Example 7 | None | 1 |
| Example 24 | In-1-1 | 1.5 |
| Example 25 | In-1-2 | 2.2 |
| Example 26 | In-1-3 | 2.5 |
| Example 27 | In-1-4 | 2.8 |
| Example 28 | In-1-5 | 2.6 |
| Example 29 | In-1-6 | 2.1 |
| Example 30 | In-1-7 | 1.5 |
| Example 31 | In-1-8 | 1.1 |
| Example 32 | In-1-9 | 2.6 |
| Example 33 | In-1-10 | 2.6 |
| Example 34 | In-1-11 | 2.0 |
| Example 35 | In-2 | 1.2 |
| Example 36 | In-3 | 2.1 |
| Example 37 | In-4 | 2.0 |
| Example 38 | In-5 | 1.9 |
| Example 39 | In-6 | 1.8 |
| Example 40 | In-7 | 1.1 |
| Example 41 | In-8 | 1.7 |

Details of the abbreviation presented in Table 2 are as follows.

In-1-1: Polystyrene, manufactured by Tosoh Corporation (Catalog No. A-1000), Mw: 1,000, Mw/Mn: 1.13

In-1-2: Polystyrene, manufactured by Tosoh Corporation (Catalog No. A-2500), Mw: 2,500, Mw/Mn: 1.05

In-1-3: Polystyrene, manufactured by Tosoh Corporation (Catalog No. F-2), Mw: 18,100, Mw/Mn: 1.01

In-1-4: Polystyrene, manufactured by Tosoh Corporation (Catalog No. F-4), Mw: 37,200, Mw/Mn: 1.01

In-1-5: Polystyrene, manufactured by Tosoh Corporation (Catalog No. F-10), Mw: 98,900, Mw/Mn: 1.01

In-1-6: Polystyrene, manufactured by Tosoh Corporation (Catalog No. F-20), Mw: 189,000, Mw/Mn: 1.04

In-1-7: Polystyrene, manufactured by Tosoh Corporation (Catalog No. F-40), Mw: 397,000, Mw/Mn: 1.02

In-1-8: Polystyrene, manufactured by Tosoh Corporation (Catalog No. F-128), Mw: 1,110,000, Mw/Mn: 1.08

In-1-9: Polystyrene, manufactured by Polymer Source Inc. (Catalog No. P10453-S), Mw: 93,000, Mw/Mn: 1.05

In-1-10: polystyrene, manufactured by Polymer Source Inc. (Catalog No. P8713-S), Mw: 90,000, Mw/Mn: 1.45

In-1-11: polystyrene, manufactured by Polymer Source Inc. (Catalog No. P15004-S), Mw: 103,000, Mw/Mn: 2.5

In-2: poly-ca-methylstyrene, manufactured by Polymer Source Inc. (Catalog No. P74-MeS), Mn: 32,300, Mw/Mn: 1.02

In-3: Poly(4-t-butylstyrene), manufactured by Polymer Source Inc. (Catalog No. P1579-4tBuS), Mn: 40,600, Mw/Mn: 1.03

In-4: Poly(4-methylstyrene), manufactured by Polymer Source Inc. (Catalog No. P1346-4MeS), Mn: 40,500, Mw/Mn: 1.06

In-5: Poly(4-methoxystyrene), manufactured by Polymer Source Inc. (Catalog No. P18292-4MeOS), Mn: 39,000, Mw/Mn: 1.40

In-6: Poly(4-hydroxystyrene), manufactured by Polymer Source Inc. (Catalog No. P4404-4HOS), Mn: 6,500, Mw/Mn: 1.15

In-7: Poly(4-acetoxystyrene), manufactured by Polymer Source Inc. (Catalog No. P5509-4AcS), Mn: 30,500, Mw/Mn: 1.70

In-8: Poly(2-vinylnaphthalene), manufactured by Polymer Source Inc. (Catalog No. P10992A-2VN), Mn: 38,000, Mw/Mn: 1.38

From the above results, combination with polystyrene among polystyrene derivatives was satisfactory. With respect to the molecular weight, 1,000 to 200,000 was particularly satisfactory. With respect to the dispersity, less than 1.5 was particularly satisfactory.

Examples 42 to 45

<Manufacturing of TFT Element>

Al that became a gate electrode was vapor-deposited on the glass substrate (EAGLE XG: manufactured by Corning Incorporated) (Thickness: 50 nm). Spin coating was performed with a composition for forming a gate insulating film (a propylene glycol monomethyl ether acetate (PGMEA) solution (concentration of solid content: 2 mass %) in which polyvinylphenol/2,4,6,-tris[bis(methoxymethyl) amino]-1,3, 5-triazine=1 part by mass/1 part by mass (w/w)), and the gate insulating film having a film thickness of 400 nm was formed by performing baking at 150° C. for 60 minutes. Subsequently, ultraviolet (UV)/ozone treatment (manufactured by Jelight Co., Inc., UVO-CLEANER Model No. 42) was performed so as to obtain a surface energy of Table 3. The organic TFT element was manufactured in the subsequent steps which were the same as those in Example 27.

Hereinafter, in the same manner as in Example 1, carrier mobility, mobility variation, and temporal stability under high temperature and high humidity were evaluated.

The relative mobility presented in Table 3 is a relative value obtained by dividing the obtained carrier mobility of each of the organic TFT elements by carrier mobility of Example 27, and is a value calculated by the following equation.

Relative mobility of Example 42 to 45=average mobility of each of examples/average mobility of Example 27

In each of the examples, the mobility variation and temporal stability under high temperature and high humidity were the same as the results of Example 7.

TABLE 3

| | Surface energy (mNm$^{-1}$) | Relative mobility | Insulating polymer |
|---|---|---|---|
| Example 27 | 45 | 1 | In-1-4 |
| Example 42 | 50 | 1.2 | In-1-4 |
| Example 43 | 65 | 1.3 | In-1-4 |
| Example 44 | 70 | 1.5 | In-1-4 |
| Example 45 | 75 | 1.5 | In-1-4 |

Examples 46 to 49

Al that became a gate electrode was vapor-deposited on the glass substrate (EAGLE XG: manufactured by Corning Incorporated) (Thickness: 50 nm). Spin coating was performed with a composition for forming a gate insulating film (a propylene glycol monomethyl ether acetate (PGMEA) solution (concentration of solid content: 2 mass %) in which (styrene-co-methyl methacrylate)/pentaerythritol tetraacrylate/1,2-octanedione, and 1-[4-(phenylthio)-2-(O-benzoyloxime)=1 parts by mass/1 parts by mass/0.01 parts by mass (w/w)), baking was performed at 110° C. for five minutes, exposure (365 nm and 100 mJ/cm$^2$) was performed, and post baking was performed at 200° C. for 60 minutes, so as to form a gate insulating film having a film thickness of 400 nm. Subsequently, ultraviolet (UV)/ozone treatment (manufactured by Jelight Co., Inc., UVO-CLEANER Model No. 42) was performed so as to obtain a surface energy of Table 4. The organic TFT element was manufactured in the subsequent steps which were the same as those in Example 27.

Hereinafter, in the same manner as in Example 1, carrier mobility, mobility variation, and temporal stability under high temperature and high humidity were evaluated.

The relative mobility provided in Table 4 is a relative value obtained by dividing carrier mobility of each of the obtained organic TFT elements with carrier mobility of Example 27 and is a value calculated in the following equation.

Relative mobility of Examples 46 to 49=average mobility of each of the example/average mobility of Example 27

In each of the examples, mobility variation and temporal stability under high temperature and high humidity had the same result as Example 7.

TABLE 4

| | Surface energy (mNm$^{-1}$) | Relative mobility | Insulating polymer |
|---|---|---|---|
| Example 46 | 42 | 1 | In-1-4 |
| Example 47 | 50 | 1.5 | In-1-4 |
| Example 48 | 70 | 2.0 | In-1-4 |
| Example 49 | 75 | 2.0 | In-1-4 |

From the result of Tables 3 and 4, it was considered that, if a gate insulating film having surface energy of 50 to 75 mNm$^{-1}$ is used in a case where coating was performed with an organic semiconductor composition according to the present invention further containing an insulating polymer including a constitutional unit represented by Formula I-1, mobility was extremely improved.

EXPLANATION OF REFERENCES

10: substrate
20: gate electrode
30: gate insulating film
40: source electrode
42: drain electrode
50: organic semiconductor film
60: sealing layer
100, 200: organic thin film transistor

What is claimed is:

1. An organic semiconductor element comprising:
   an organic semiconductor layer containing a compound having a constitutional repeating unit represented by Formula 1 and having a molecular weight of 2,000 or greater,

  (1)

in Formula 1, A represents an electron acceptor unit including a partial structure having at least one of a sp2 nitrogen atom, a carbonyl group, or a thiocarbonyl group in a ring structure, D represents an electron donor unit including a divalent aromatic heterocyclic group having at least one of an N atom, an O atom, an S atom, or an Se atom in a ring structure, or a divalent aromatic hydrocarbon group consisting of a fused ring structure having two or more rings as a partial structure, and at least one of D or A has at least one monovalent group represented by Formula 1-1,

  (1-1)

in Formula 1-1, L represents a linear or branched alkylene group having m carbon atoms, R represents an alkyl group not having a substituent and having n carbon atoms, 6≤m+n≤50, and * represents a bonding site to another structure, wherein, in Formula 1, A has at least one structure selected from the group consisting of structures represented by Formulae A-1 to A-7 and A-9 to A-12, as a partial structure,

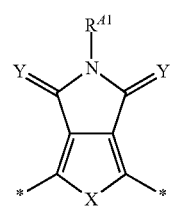  (A-1)

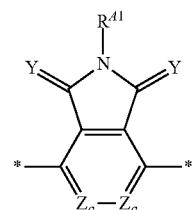  (A-2)

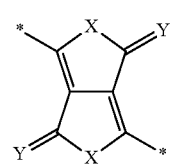  (A-3)

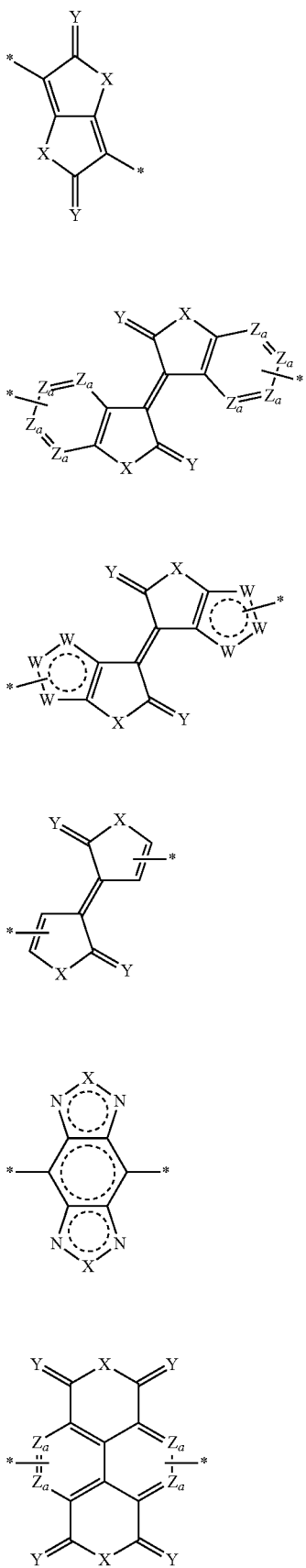

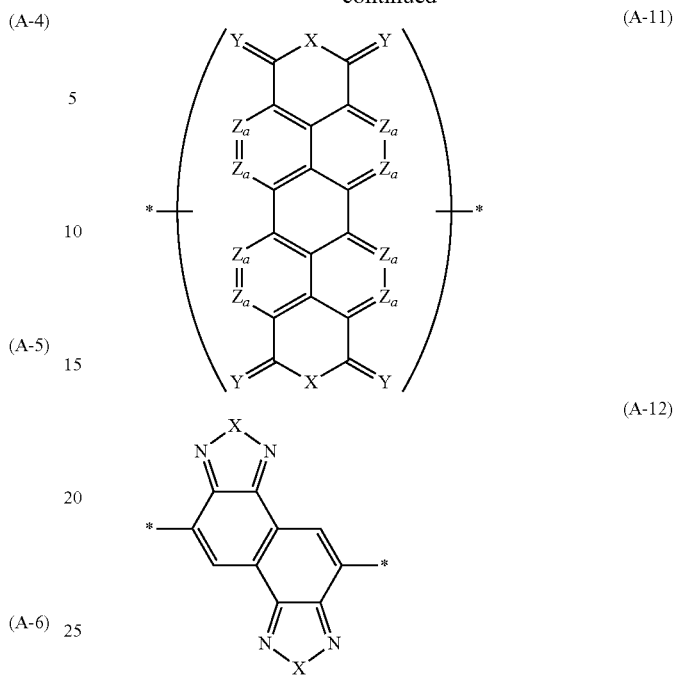

wherein in Formulae A-1 to A-7 and A-9 to A-12, each X independently represents an O atom, a S atom, a Se atom or $NR^{A1}$, each Y independently represents an O atom or a S atom, each $Z_a$ independently represents $CR^{A2}$ or a N atom, each W independently represents $C(R^{A2})_2$, $NR^{A1}$, a N atom, $CR^{A2}$, an O atom, a S atom, or a Se atom, each $R^{A1}$ independently represents an alkyl group, a monovalent group represented by Formula 1-1, or a bonding site to another structure, s each $R^{A2}$ independently represents a hydrogen atom, a halogen atom, an alkyl group, or a bonding site to another structure, and each * independently represents a bonding site to another structure.

2. The organic semiconductor element according to claim 1, wherein, in Formula 1, D represents a structure represented by Formula D-1,

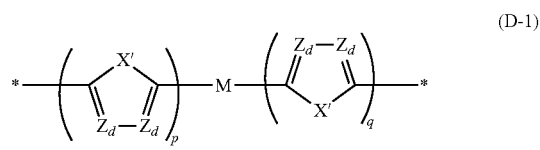

(D-1)

in Formula D-1, each X" independently represents an O atom, a S atom, a Se atom, or $NR^{D1}$, each $Z_d$ independently represents a N atom or $CR^{D2}$, each $R^{D1}$ independently represents a monovalent organic group, each $R^{D2}$ independently represents a hydrogen atom or a monovalent organic group, M represents a single bond, a divalent aromatic heterocyclic group, a divalent aromatic hydrocarbon group, an alkenylene group, an alkynylene group, or a divalent group obtained by combining these, p and q each independently represent an integer of 0 to 4, and each * independently represents a bonding site to another structure.

3. The organic semiconductor element according to claim 1,
wherein a constitutional repeating unit represented by Formula 1 is a constitutional repeating unit represented by any one of Formulae 2 to 4, (2)

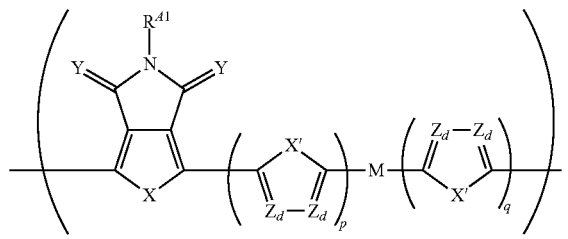

(3)

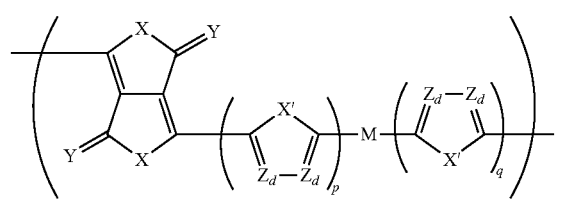

(4)

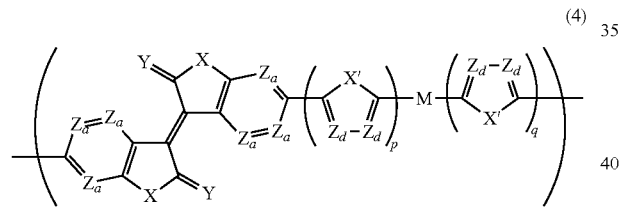

in Formulae 2 to 4, each X independently represents an O atom, a S atom, a Se atom or $NR^{A1}$, each Y independently represents an O atom or a S atom, each $Z_a$ independently represents $CR^{A2}$ or a N atom, each $R^{A1}$ independently represents an alkyl group, a monovalent group represented by Formula 1-1, or a bonding site to another structure, each $R^{A2}$ independently represents a hydrogen atom, a halogen atom, an alkyl group, or a bonding site to another structure, each X' independently represents an O atom, a S atom, a Se atom, or $NR^{D1}$, each $Z_d$ independently represents a N atom or $CR^{D2}$, each $R^{D1}$ independently represents a monovalent organic group, each $R^{D2}$ independently represents a hydrogen atom or a monovalent organic group, M represents a single bond, a divalent aromatic heterocyclic group, a divalent aromatic hydrocarbon group, an alkenylene group, an alkynylene group, or a divalent group obtained by combining these, and p and q each independently represent an integer of 0 to 4.

4. The organic semiconductor element according to claim 1,
wherein the organic semiconductor layer further contains an insulating polymer including a constitutional unit represented by Formula I-1,

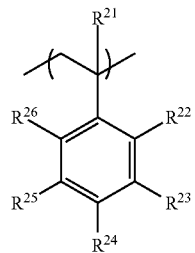

Formula I-1 in Formula I-1, $R^{22}$ to $R^{26}$ each independently represent a hydrogen atom, a hydroxy group, an alkyl group, an alkoxy group, an alkenyl group, an alkynyl group, an aryl group, an aralkyl group, or a halogen atom or may form a ring by linking two of $R^{22}$ to $R^{26}$ that are adjacent to each other, and $R^{21}$ represents a hydrogen atom or an alkyl group.

5. The organic semiconductor element according to claim 4, further comprising:
a gate insulating film having a surface energy of 50 to 75 $mNm^{-1}$.

6. The organic semiconductor element according to claim 1, which is an organic thin film transistor.

7. A compound comprising:
a constitutional repeating unit represented by Formula 1, wherein a molecular weight is 2,000 or greater,

  (1)

in Formula 1, A represents an electron acceptor unit having at least one structure selected from the group consisting of structures represented by Formulae A-1 to A-12, as a partial structure, D represents an electron donor unit including a divalent aromatic heterocyclic group having at least one of a N atom, an O atom, a S atom, or a Se atom in a ring structure or a divalent aromatic hydrocarbon group consisting of a fused ring structure having two or more rings, as a partial structure, and at least one of D or A has at least one monovalent group represented by Formula 1-1, (A-1)

(A-2)

(A-3)

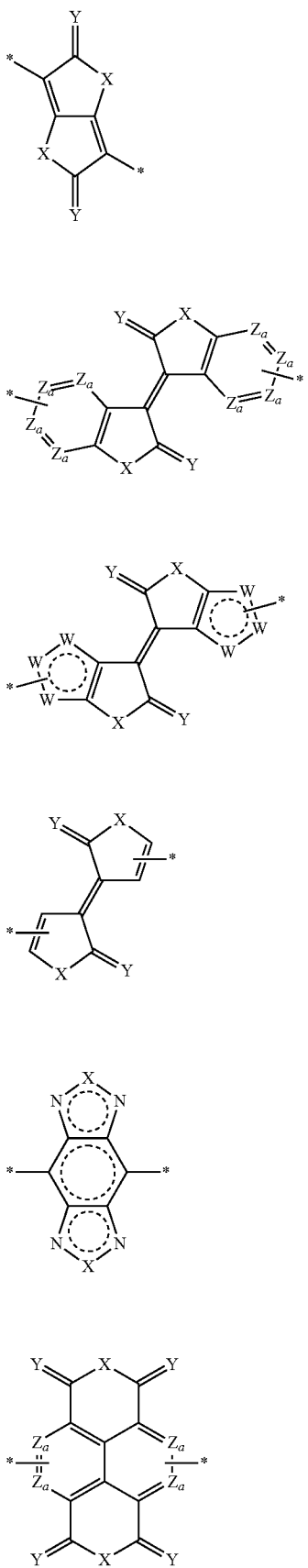

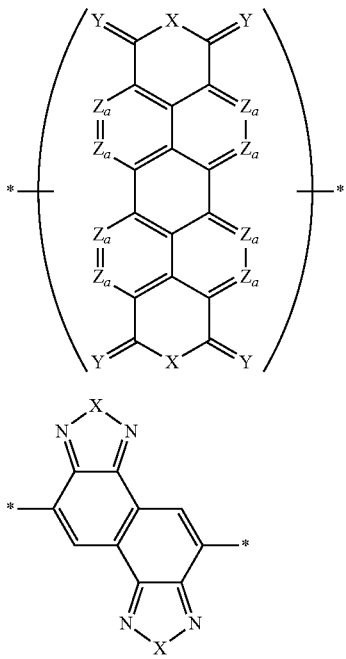

in Formulae A-1 to A-7 and A-9 to A-12, each X independently represents an O atom, a S atom, a Se atom, or NR$^{41}$, each Y independently represents an O atom or a S atom, each $Z_a$ independently represents CR$^{42}$ or a N atom, each W independently represents C(R$^{42}$)$_2$, NR$^{41}$, a N atom, CR$^{42}$, an O atom, a S atom, or a Se atom, each R$^{41}$ independently represents an alkyl group, a monovalent group represented by Formula 1-1, or a bonding site to another structure, R$^{42}$'s each independently represent a hydrogen atom, a halogen atom, an alkyl group, or a bonding site to another structure, and each * independently represents a bonding site to another structure, $$*\text{-L-O-R} \quad (1\text{-}1)$$

in Formula 1-1, L is a linear or branched alkylene group having m carbon atoms, R is an alkyl group not having a substituent and having n carbon atoms, 6≤m+n≤50, and * represents a bonding site to another structure.

8. The compound according to claim 7, wherein, in Formula 1, D is a structure represented by Formula D-1,

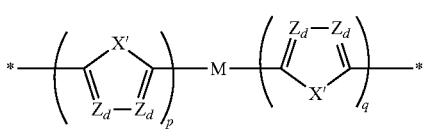

in Formula D-1, each X' independently represents an O atom, a S atom, a Se atom, or NR$^{D1}$, each $Z_d$ independently represents a N atom or CR$^{D2}$, each R$^{D1}$ independently represents a monovalent organic group, each R$^{D2}$ independently represents a hydrogen atom or a monovalent organic group, M represents a single bond, a divalent aromatic heterocyclic group, a divalent aromatic hydrocarbon group, an alkenylene group, an alkynylene group, or a divalent group obtained by combining these, p and q each independently represent an integer of 0 to 4, and each * independently represents a bonding site to another structure.

9. The compound according to claim 7,
wherein the constitutional repeating unit represented by Formula 1 is a constitutional repeating unit represented by any one of Formulae 2 to 5,

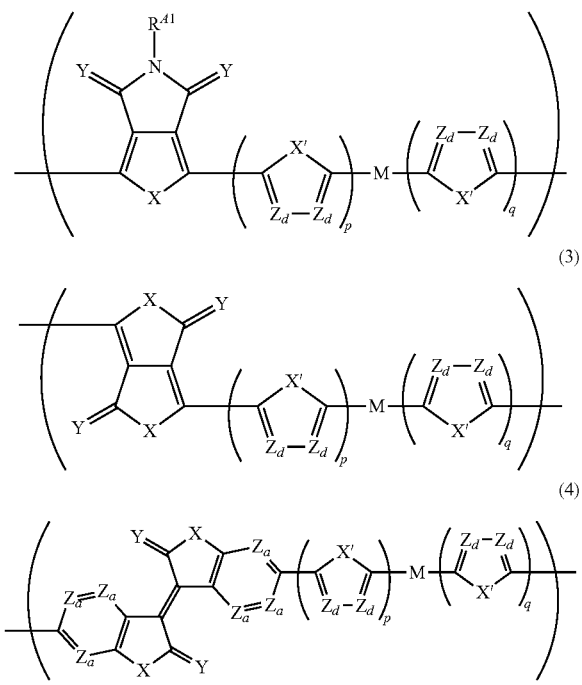

in Formulae 2 to 4, each X independently represents an O atom, a S atom, a Se atom, or $NR^{A1}$, each Y independently represents an O atom or a S atom, each $Z_a$ independently represents $CR^{A2}$ or a N atom, each $R^{A1}$ independently represents an alkyl group, a monovalent group represented by Formula 1-1, or a bonding site to another structure, each $R^{A2}$ independently represents a hydrogen atom, a halogen atom, an alkyl group, or a bonding site to another structure, each X' independently represents an O atom, a S atom, a Se atom, or $NR^{D1}$, each $Z_d$ independently represents an N atom or $CR^{D2}$, each $R^{D1}$ independently represents a monovalent organic group, each $R^{D2}$ independently represents a hydrogen atom or a monovalent organic group, M represents a single bond, a divalent aromatic heterocyclic group, a divalent aromatic hydrocarbon group, an alkenylene group, an alkynylene group, or a divalent group obtained by combining these, and p and q each independently represent an integer of 0 to 4.

10. The compound according to claim 7, that is an organic semiconductor compound.

11. An organic semiconductor composition comprising:
the compound according to claim 7, and
a solvent.

12. The organic semiconductor composition according to claim 11, further comprising:
an insulating polymer including a constitutional unit represented by Formula I-1,

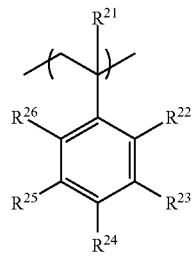

Formula I-1 in Formula I-1, $R^{22}$ to $R^{26}$ each independently represent a hydrogen atom, a hydroxy group, an alkyl group, an alkoxy group, an alkenyl group, an alkynyl group, an aryl group, an aralkyl group, or a halogen atom and may form a ring by linking two of $R^{22}$ to $R^{26}$ that are adjacent to each other, and $R^{21}$ represents a hydrogen atom or an alkyl group.

13. An organic semiconductor film comprising the compound according to claim 7.

14. The organic semiconductor film according to claim 13, further comprising an insulating polymer including a constitutional unit represented by Formula I-1,

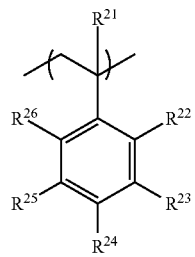

Formula I-1 in Formula I-1, $R^{22}$ to $R^{26}$ each independently represent a hydrogen atom, a hydroxy group, an alkyl group, an alkoxy group, an alkenyl group, an alkynyl group, an aryl group, an aralkyl group, or a halogen atom, and may form a ring by linking two of $R^{22}$ to $R^{26}$ that are adjacent to each other, and $R^{21}$ represents a hydrogen atom or an alkyl group.

15. A method of manufacturing an organic semiconductor film, comprising:
a coating step of coating a substrate with the organic semiconductor composition according to claim 11.

16. A method of manufacturing an organic semiconductor film, comprising:
a coating step of coating a gate insulating film having a surface energy of 50 to 75 $mNm^{-1}$ with the organic semiconductor composition according to claim 12.

17. A method of manufacturing an organic semiconductor element, comprising:
a coating step of coating a substrate with the organic semiconductor composition according to claim 11.

18. A method of manufacturing an organic semiconductor element, comprising:
a coating step of coating a gate insulating film having a surface energy of 50 to 75 $mNm^{-1}$ with the organic semiconductor composition according to claim 12.

* * * * *